United States Patent
Washeleski et al.

(10) Patent No.: US 7,908,927 B2
(45) Date of Patent: Mar. 22, 2011

(54) ANTI-ENTRAPMENT SYSTEM

(75) Inventors: John Washeleski, Cadillac, MI (US);
Randall L. Perrin, Cadillac, MI (US);
David W. Shank, Hersey, MI (US)

(73) Assignee: UUSI, LLC, Reed City, MI (US)

( * ) Notice: Subject to any disclaimer, the term of this patent is extended or adjusted under 35 U.S.C. 154(b) by 213 days.

(21) Appl. No.: 12/394,207

(22) Filed: Feb. 27, 2009

(65) Prior Publication Data

US 2009/0158857 A1 Jun. 25, 2009

Related U.S. Application Data

(63) Continuation of application No. 11/901,831, filed on Sep. 19, 2007, now Pat. No. 7,513,166, and a continuation of application No. 11/584,043, filed on Oct. 20, 2006, now Pat. No. 7,293,467, and a continuation-in-part of application No. 10/927,916, filed on Aug. 27, 2004, now Pat. No. 7,132,642, and a continuation-in-part of application No. 10/262,446, filed on Sep. 30, 2002, now Pat. No. 6,782,759, and a continuation-in-part of application No. 09/901,883, filed on Jul. 9, 2001, now Pat. No. 6,499,359.

(51) Int. Cl.
*G01L 1/00* (2006.01)
(52) U.S. Cl. .................... 73/780; 73/862.626
(58) Field of Classification Search .............. 73/780, 73/862.337, 862.626
See application file for complete search history.

(56) References Cited

U.S. PATENT DOCUMENTS

| | | | |
|---|---|---|---|
| 4,437,138 A * | 3/1984 | Nicol | .............. 361/283.2 |
| 4,933,807 A | 6/1990 | Duncan | |
| 5,621,290 A | 4/1997 | Heller et al. | |
| 5,730,165 A | 3/1998 | Philipp | |
| 5,801,340 A | 9/1998 | Peter | |
| 5,844,287 A * | 12/1998 | Hassan et al. | .............. 257/419 |
| 5,952,801 A | 9/1999 | Boisvert et al. | |
| 6,233,872 B1 | 5/2001 | Glagow et al. | |
| 6,337,549 B1 | 1/2002 | Bledin | |
| 6,377,009 B1 | 4/2002 | Philipp | |
| 6,389,752 B1 | 5/2002 | Rosenau | |
| 6,404,158 B1 | 6/2002 | Boisvert et al. | |
| 6,499,359 B1 | 12/2002 | Washeleski et al. | |
| 6,555,982 B2 | 4/2003 | Tyckowski | |

(Continued)

FOREIGN PATENT DOCUMENTS

WO 0212669 2/2002

(Continued)

*Primary Examiner* — Max Noori
(74) *Attorney, Agent, or Firm* — Brooks Kushman P.C.

(57) ABSTRACT

An anti-entrapment system for preventing an object from being entrapped by a translating device includes a sensor positionable adjacent to or on the translating device. The sensor has a non-conductive compressible jacket with a cavity, and first and second conductors positioned within the cavity opposite from one another. In response to an object pressing against the jacket, the jacket compresses from a non-compressed state in which the conductors are not in electrical contact to a compressed state in which the conductors are in electrical contact. The sensor has a compressible support either inside or outside of the cavity. In response to the object pressing against the jacket while the jacket is compressed, the support compresses to allow the jacket to compress further in order reduce pinching of the object by the translating device when the object is between the jacket and the translating device.

30 Claims, 27 Drawing Sheets

U.S. PATENT DOCUMENTS

| | | | |
|---|---|---|---|
| 6,782,759 B2 * | 8/2004 | Shank et al. | 73/780 |
| 6,936,986 B2 | 8/2005 | Nuber | |
| 6,946,853 B2 | 9/2005 | Gifford et al. | |
| 6,968,746 B2 | 11/2005 | Shank et al. | |
| 7,015,666 B2 | 3/2006 | Staus | |
| 7,132,642 B2 * | 11/2006 | Shank et al. | 250/221 |
| 7,162,928 B2 | 1/2007 | Shank et al. | |
| 7,293,467 B2 | 11/2007 | Shank et al. | |
| 7,312,591 B2 | 12/2007 | Washeleski et al. | |
| 7,342,373 B2 | 3/2008 | Newman et al. | |
| 7,449,852 B2 | 11/2008 | Washeleski et al. | |

FOREIGN PATENT DOCUMENTS

| | | |
|---|---|---|
| WO | 03038220 | 5/2003 |

\* cited by examiner

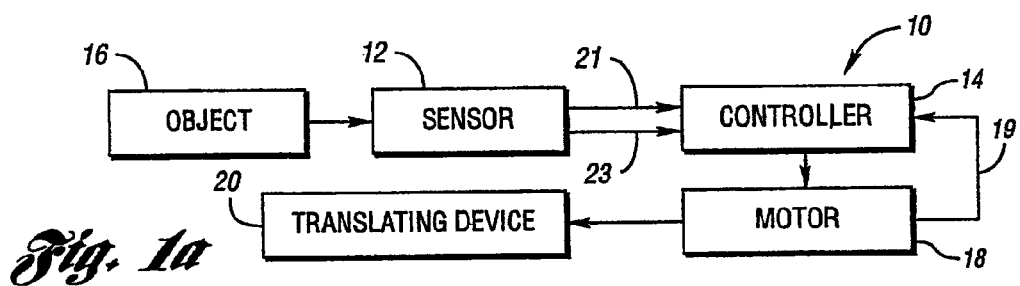
*Fig. 1a*
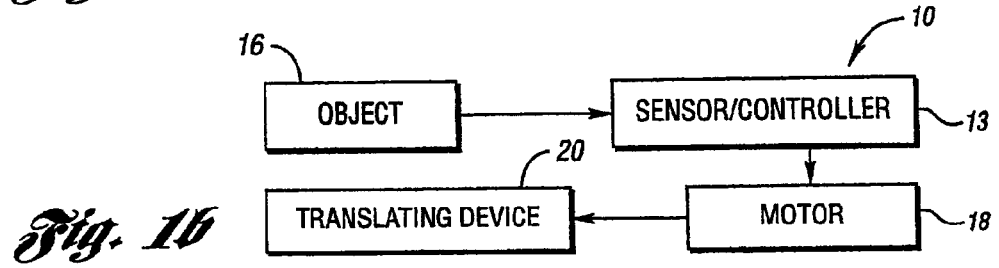
*Fig. 1b*
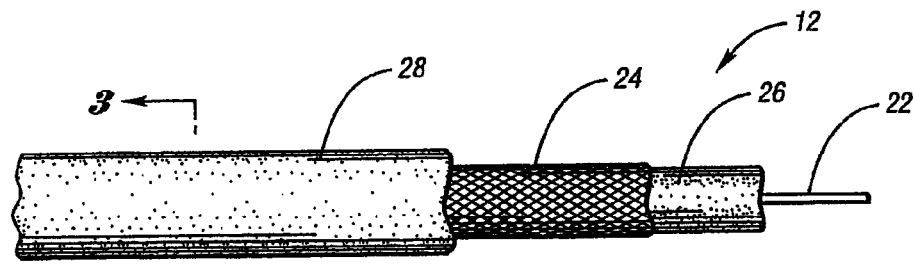
*Fig. 2*
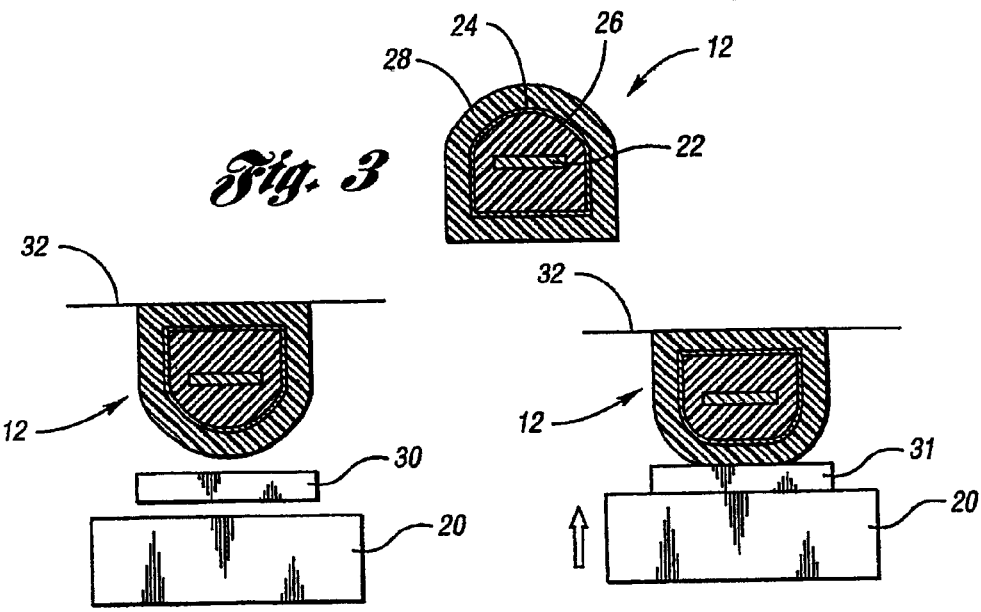
*Fig. 3*
*Fig. 4a*
*Fig. 4b*

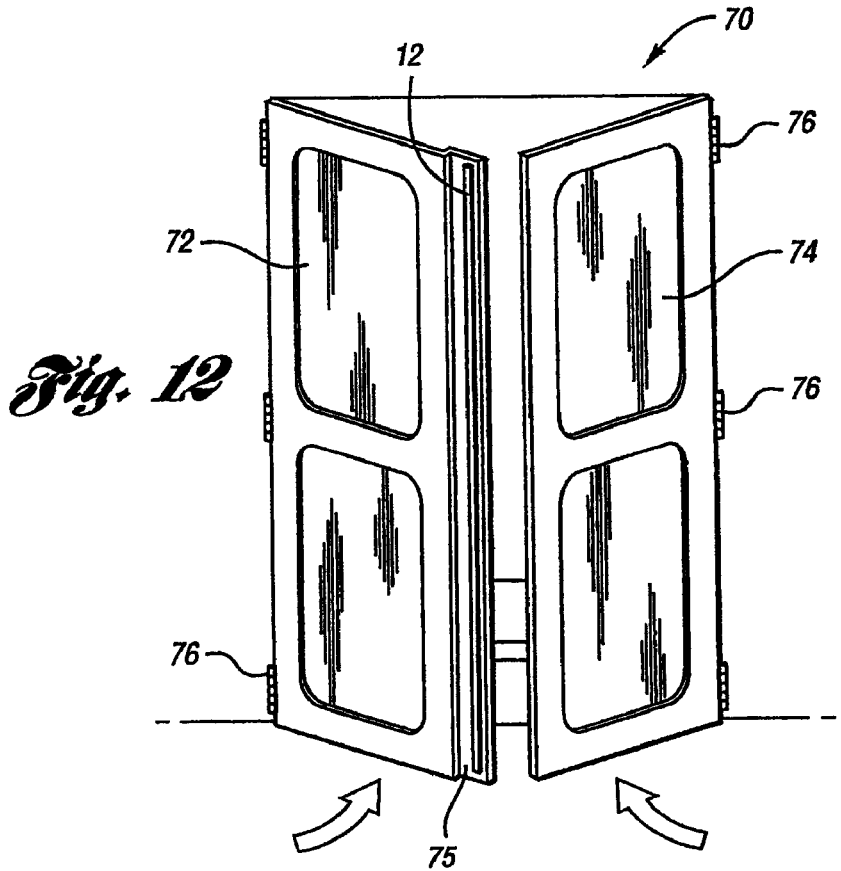
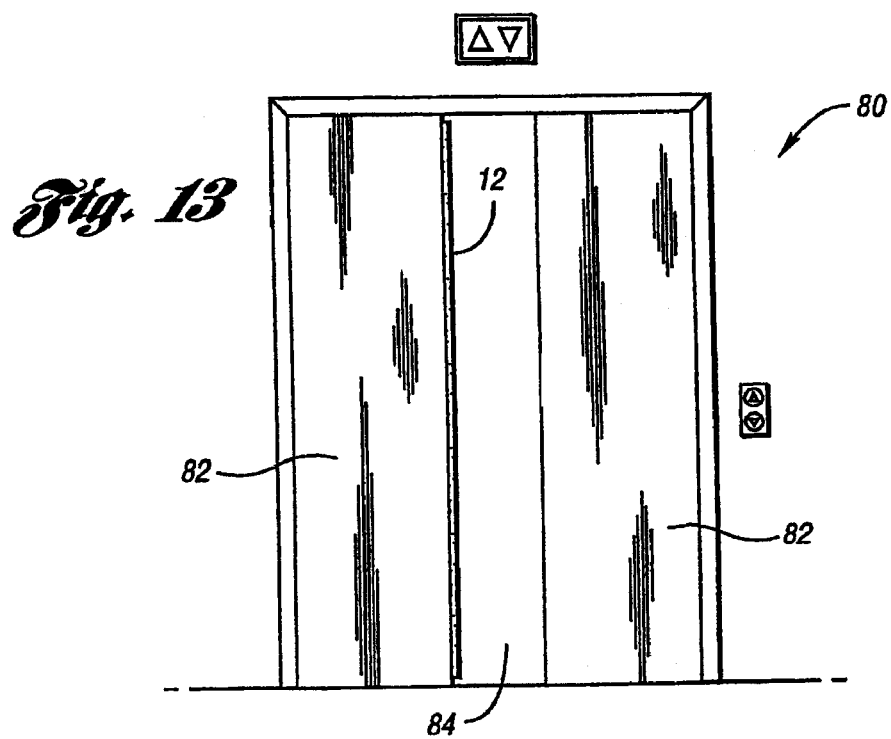

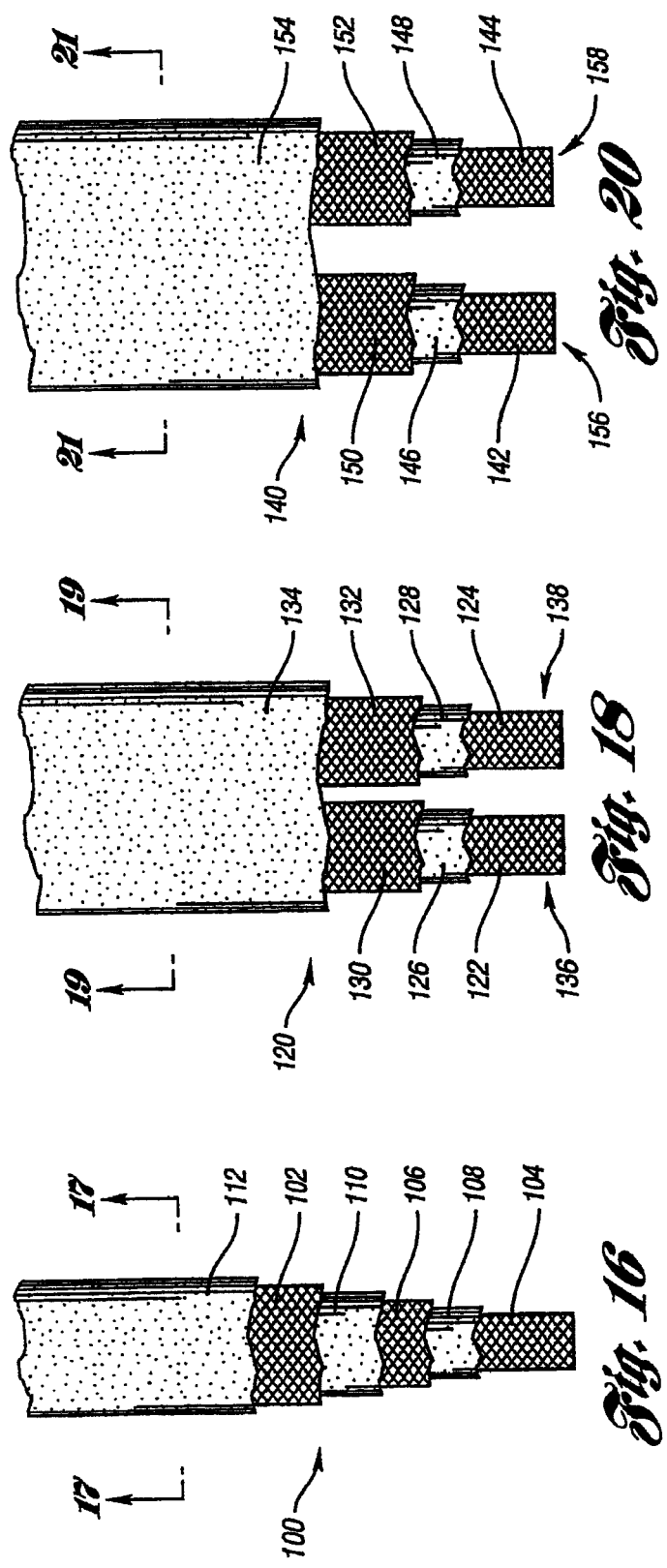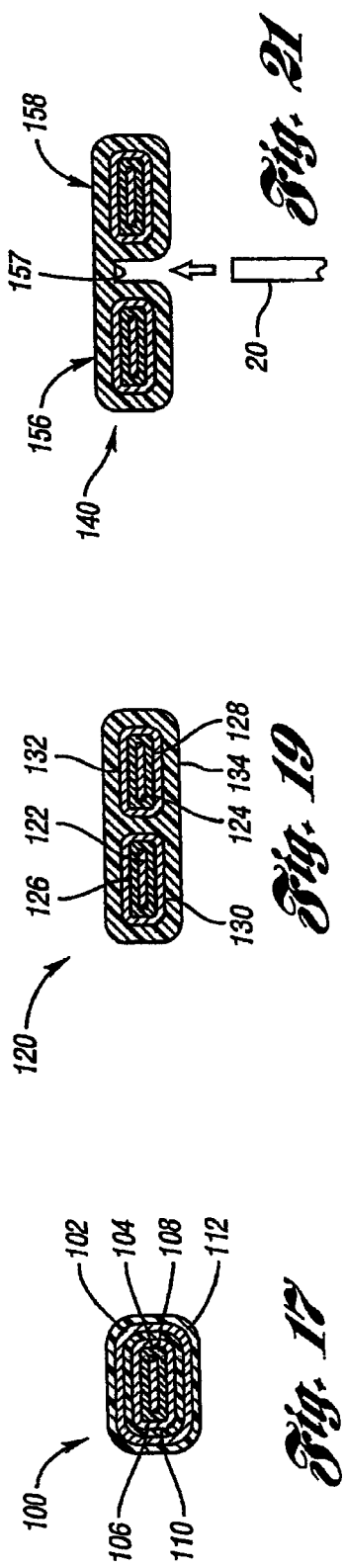

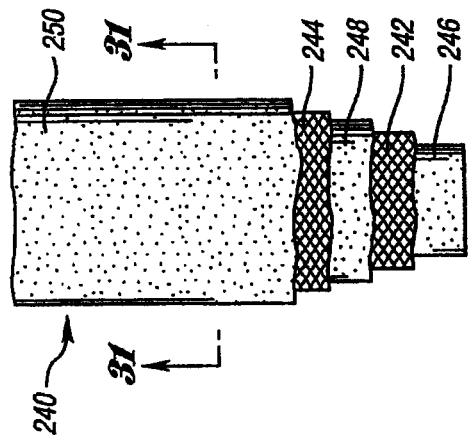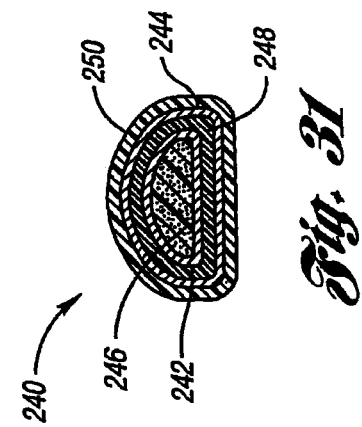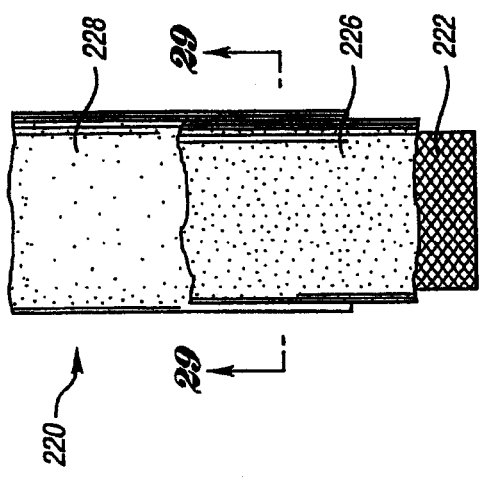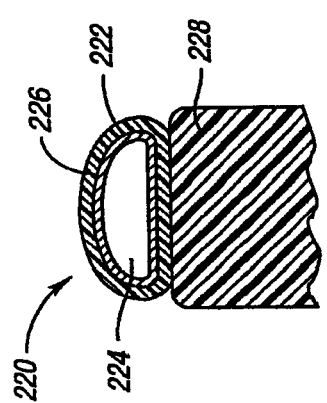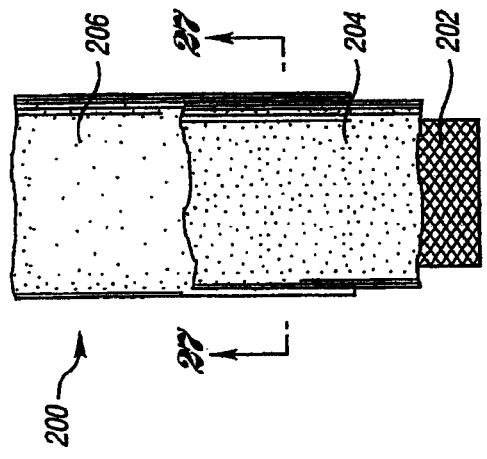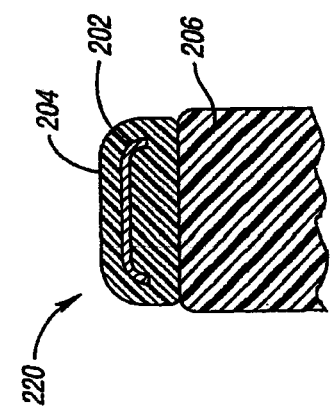

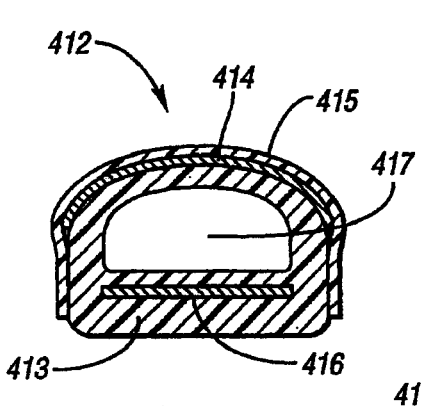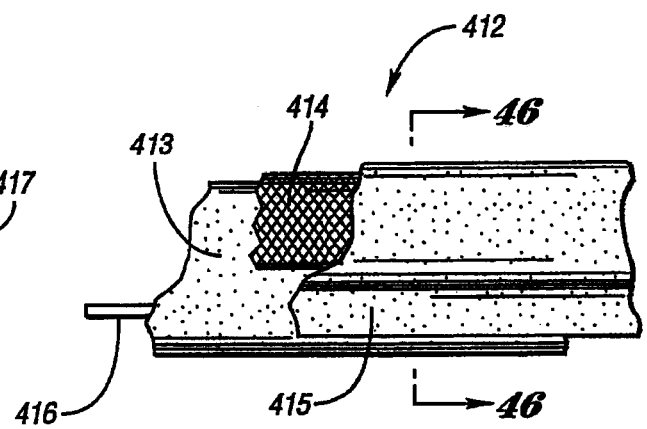
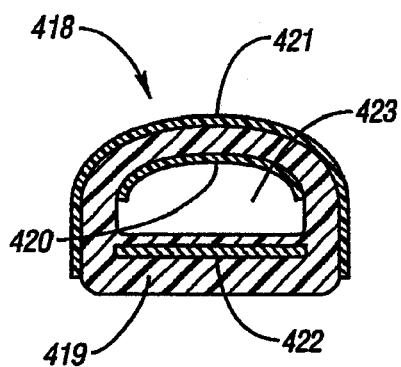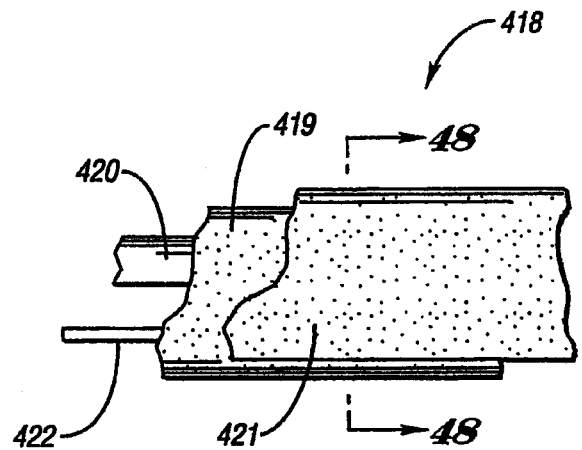
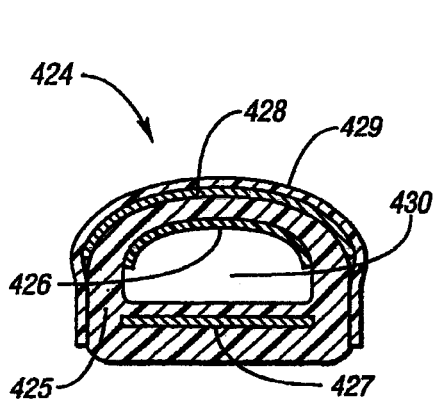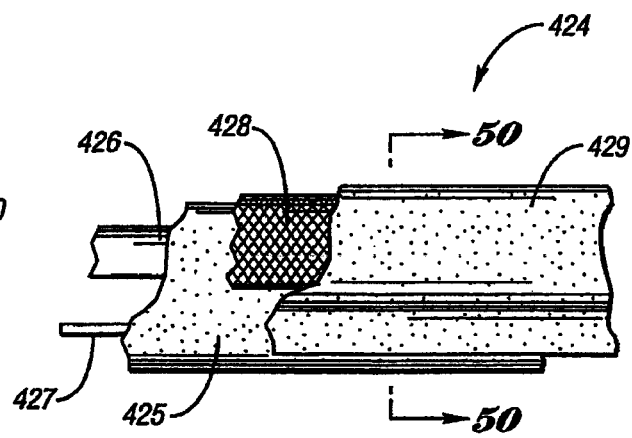

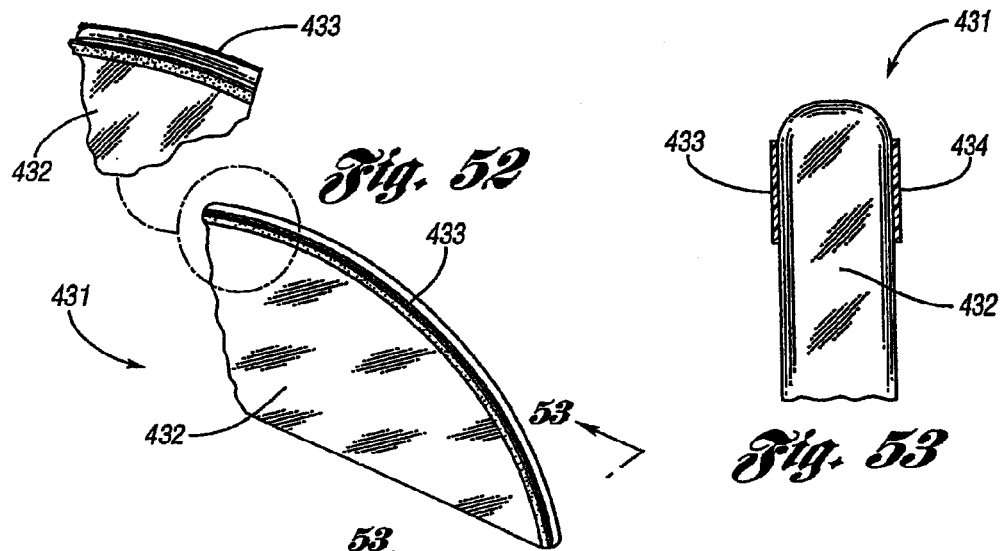
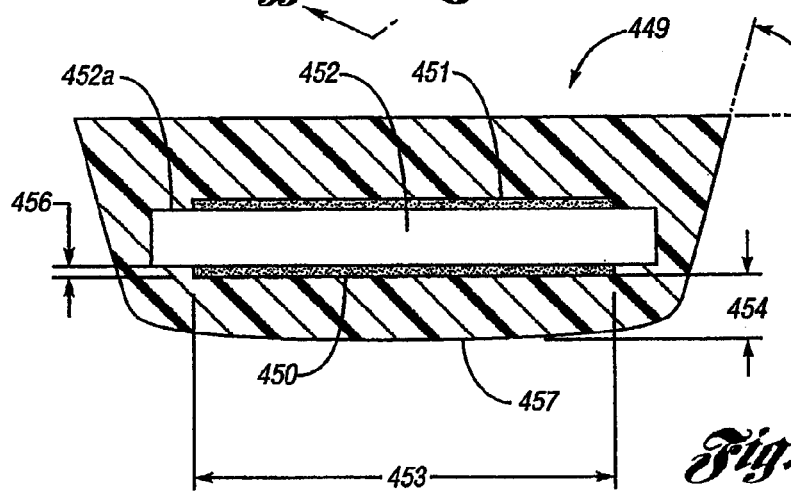
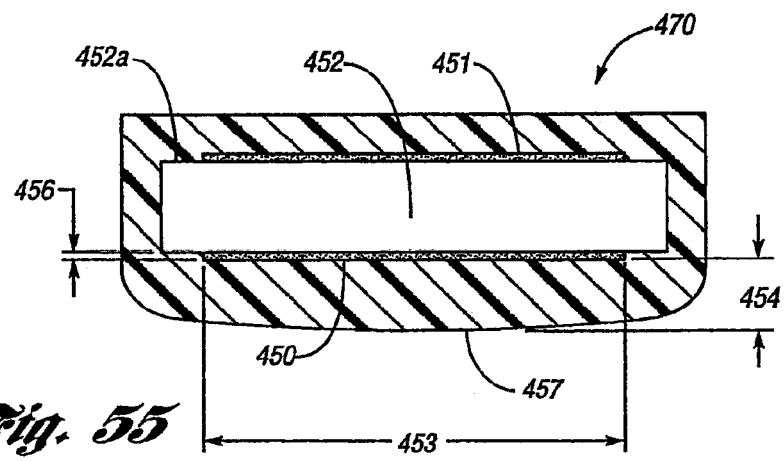

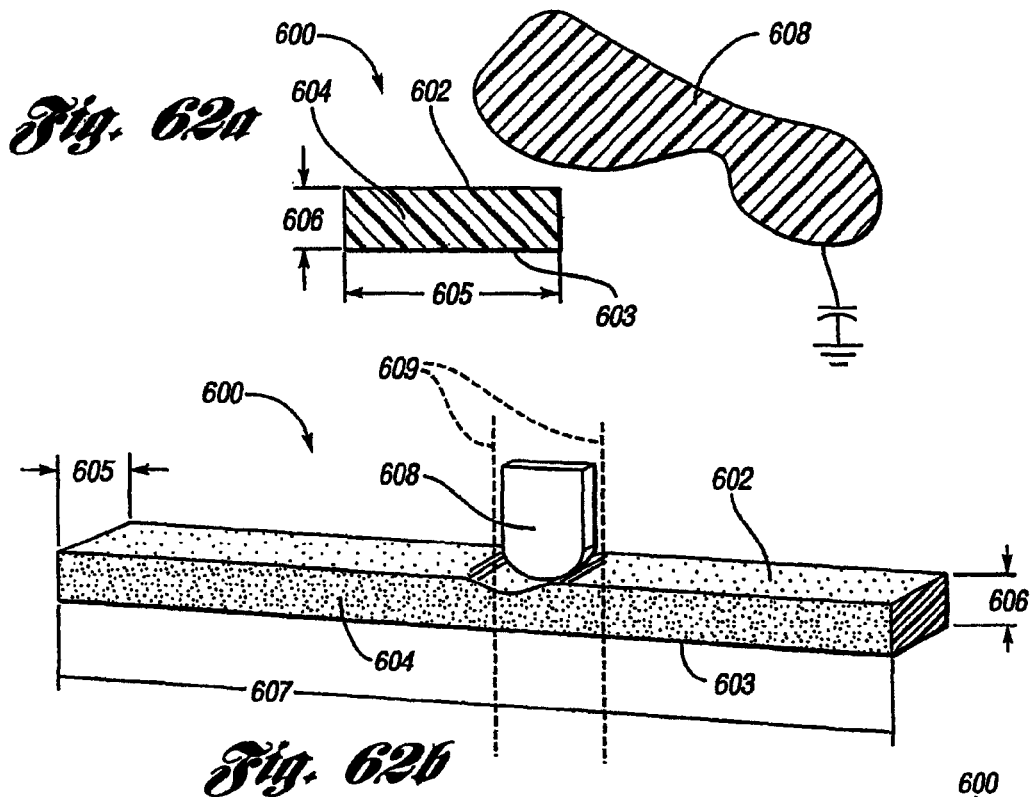
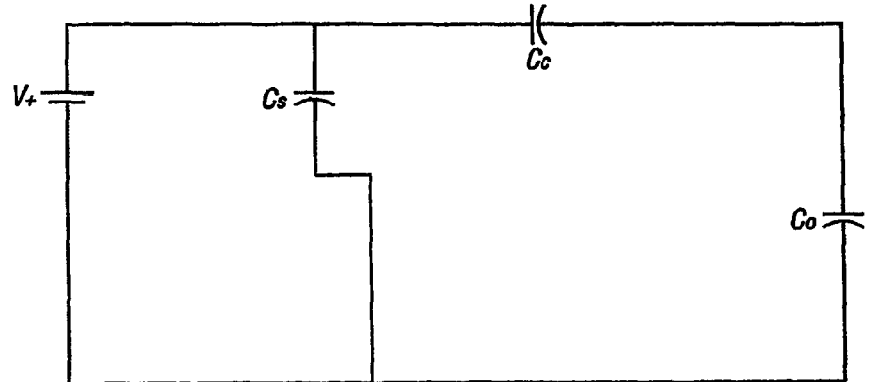
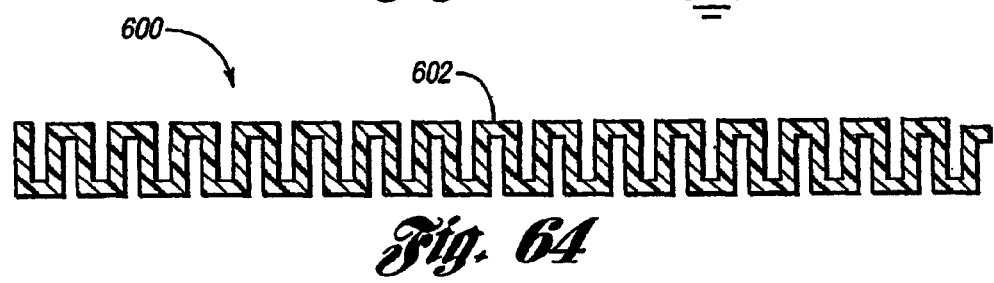

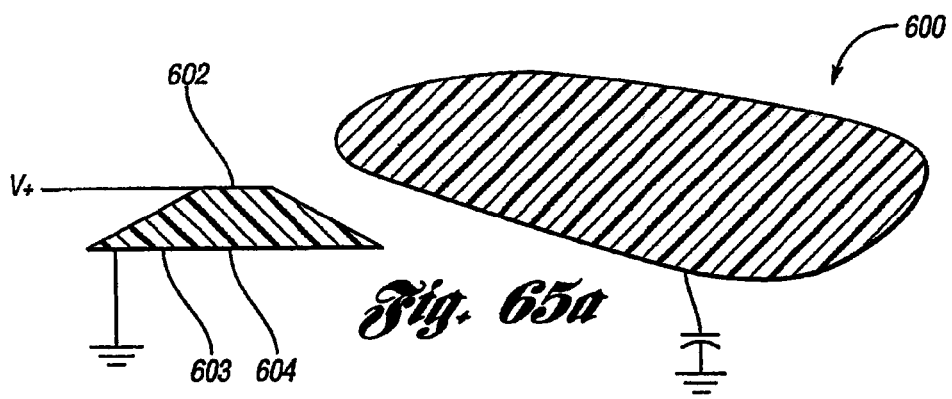
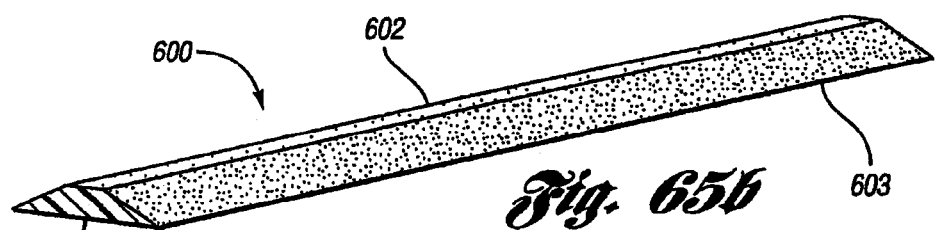
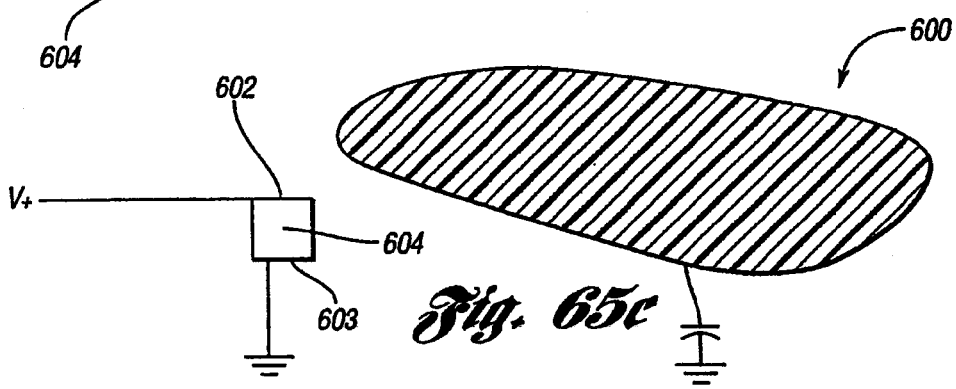
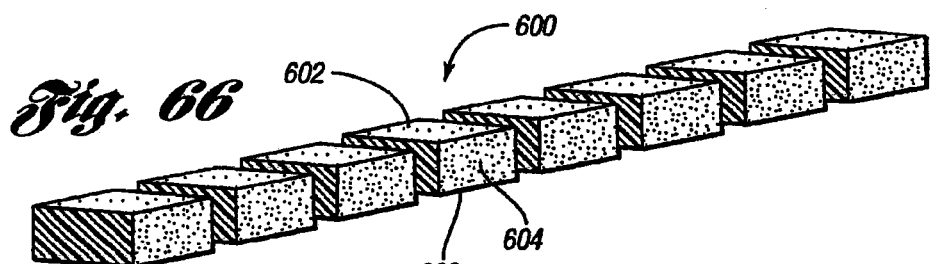
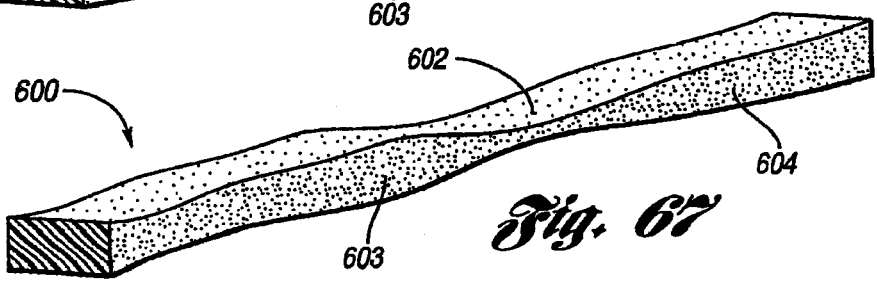

ANTI-ENTRAPMENT SYSTEM

CROSS-REFERENCE TO RELATED APPLICATIONS

This application is a continuation of U.S. application Ser. No. 11/901,831, filed Sep. 19, 2007, now U.S. Pat. No. 7,513,166; which is a continuation of U.S. application Ser. No. 11/584,043, filed Oct. 20, 2006, now U.S. Pat. No. 7,293,467; which is a continuation-in-part of U.S. application Ser. No. 10/927,916, filed Aug. 27, 2004, now U.S. Pat. No. 7,132,642; which is a continuation-in-part of U.S. application Ser. No. 10/262,446, filed Sep. 30, 2002, now U.S. Pat. No. 6,782,759; which is a continuation-in-part of U.S. application Ser. No. 09/901,883, filed Jul. 9, 2001, now U.S. Pat. No. 6,499,359.

This application is related to U.S. application Ser. No. 11/005,616, filed Dec. 6, 2004, now U.S. Pat. No. 7,162,928; and U.S. application Ser. No. 10/927,299, filed Aug. 26, 2004, now U.S. Pat. No. 6,968,746.

BACKGROUND OF THE INVENTION

1. Field of the Invention

The present invention relates to an anti-entrapment system provided with a capacitance sensor for preventing entrapment of an object.

2. Background Art

Anti-entrapment systems use various types of sensors to detect pinching of an object such as a human body part. For example, in automobiles, sensors are used for pinch sensing at electrically operated doors, windows, hatches, decks, hoods, lids, and the like.

A pinch sensor detects pinching an object by a translating device such as a window, door, sunroof, etc. In operation, the pinch sensor generates a pinch sensor signal in response to the object such as a person's finger being pinched by a translating device such as a window as the window is closing. In response to the pinch sensor signal, a controller controls the window to reverse direction and open in order to prevent further pinching of the person's finger. As the window is opening, the person may remove his finger from the window opening between the top edge of the window and the window liner.

Motor current sensors, infrared beam sensors, and continuous switch sensors have been used as pinch sensors in anti-entrapment systems. A problem with these types of pinch sensors is that they require a relatively large amount of pinching of the object to take place before they detect pinching of the object.

SUMMARY OF THE INVENTION

Accordingly, it is an object of the present invention to provide an anti-entrapment system having a sensor that detects a translating device pinching an object as soon as the translating device has applied a relatively small amount of pinching to the object and/or detects the presence of an object within an opening which may be closed by the translating device in order to prevent any pinching of either object by the translating device.

In carrying out the above object and other objects, the present invention provides an anti-entrapment system for preventing an object from being entrapped by a translating device. The anti-entrapment system includes a sensor positionable adjacent to or on a translating device. The sensor has a non-conductive compressible jacket with a cavity, a first conductor positioned within the cavity adjacent to a first portion of the jacket and connected to the jacket, and a second conductor positioned within the cavity adjacent to a second portion of the jacket opposite the first jacket portion and connected to the second jacket portion such that the conductors are opposite from one another. In response to an object pressing against the first jacket portion towards the second jacket portion, the jacket compresses from a non-compressed state in which the conductors are separated from one another to a compressed state in which the first conductor is moved towards the second conductor and contacts the second conductor. The sensor further has a compressible support outside of the cavity and positioned on the second jacket portion. In response to the object pressing against the first jacket portion towards the second jacket portion while the jacket is in the compressed state, the support compresses away from the second jacket portion to reduce pinching of the object by a translating device when the object is between the first jacket portion and the translating device.

Further, in carrying out the above object and other objects, the present invention provides an anti-entrapment system for preventing an object from being entrapped by a translating device. This anti-entrapment system includes a sensor positionable adjacent to or on a translating device. The sensor has a non-conductive compressible jacket with a cavity, a first conductor positioned within the cavity adjacent to a first portion of the jacket and connected to the jacket, and a second conductor positioned within the cavity adjacent to a second portion of the jacket opposite the first jacket portion and connected to the jacket such that the conductors are opposite from one another. The sensor further has a conductive compressible support within the cavity between the first and second conductors. In response to an object pressing against the jacket, the jacket compresses from a non-compressed state in which the conductors are separated from the support to a compressed state in which the conductors move toward the support and contact the support. In response to the object pressing against the jacket while the jacket is in the compressed state, the support compresses to allow the jacket to compress further in order reduce pinching of the object by a translating device external to the jacket when the object is between the jacket and the translating device.

Also, in carrying out the above object and other objects, the present invention provides another anti-entrapment system for preventing an object from being entrapped by a translating device. This anti-entrapment system includes a sensor having a non-conductive compressible jacket with a cavity, a compressible dielectric element within the cavity, and first and second conductors within the jacket on opposite sides of the dielectric element such that the conductors are separated from one another by a separation distance. The conductors have a capacitance dependent upon the separation distance. The capacitance of the conductors changes in response to a geometry of the sensor changing as a result of at least one of the conductors and the dielectric element deforming in response to an object touching the jacket. The jacket further has a detail for attaching the sensor either to a seal of a translating device or directly to the translating device.

The above object and other objects, features, and advantages of the present invention are readily apparent from the following detailed description of the preferred embodiment(s) when taken in connection with the accompanying drawings.

BRIEF DESCRIPTION OF DRAWINGS

FIG. 1a illustrates a block diagram of an anti-entrapment system having a capacitance sensor in accordance with the present invention;

FIG. 1b illustrates a block diagram of the anti-entrapment system in which the sensor and a controller are integrated;

FIG. 2 illustrates a first embodiment of the sensor of the anti-entrapment system;

FIG. 3 illustrates a cross-sectional view of the sensor taken along the line 3-3 of FIG. 2;

FIG. 4a illustrates the operation of the sensor for detecting an object in proximity to the sensor;

FIG. 4b illustrates the operation of the sensor for detecting an object touching the sensor;

FIG. 12 illustrates the placement of the sensor of the anti-entrapment system for use in an automated bus door environment;

FIG. 13 illustrates the placement of the sensor of the anti-entrapment system for use in an elevator door environment;

FIG. 16 illustrates a second embodiment of the sensor of the anti-entrapment system;

FIG. 17 illustrates a cross-sectional view of the sensor shown in FIG. 16 taken along the line 17-17 of FIG. 16;

FIG. 18 illustrates a third embodiment of the sensor of the anti-entrapment system;

FIG. 19 illustrates a cross-sectional view of the sensor shown in FIG. 18 taken along the line 19-19 of FIG. 18;

FIG. 20 illustrates a fourth embodiment of the sensor of the anti-entrapment system;

FIG. 21 illustrates a cross-sectional view of the sensor shown in FIG. 20 taken along the line 21-21 of FIG. 20;

FIG. 26 illustrates a seventh embodiment of the sensor of the anti-entrapment system;

FIG. 27 illustrates a cross-sectional view of the sensor shown in FIG. 26 taken along the line 27-27 of FIG. 26;

FIG. 28 illustrates an eighth embodiment of the sensor of the anti-entrapment system;

FIG. 29 illustrates a cross-sectional view of the sensor shown in FIG. 28 taken along the line 29-29 of FIG. 28;

FIG. 30 illustrates a ninth embodiment of the sensor of the anti-entrapment system;

FIG. 31 illustrates a cross-sectional view of the sensor shown in FIG. 30 taken along the line 31-31 of FIG. 30;

FIG. 46 illustrates a cross-sectional view of a $14^{th}$ embodiment of the sensor of the anti-entrapment system taken along the line 46-46 of FIG. 47;

FIG. 47 illustrates a profile view of the sensor shown in FIG. 46;

FIG. 48 illustrates a cross-sectional view of a $15^{th}$ embodiment of the sensor of the anti-entrapment system taken along the line 48-48 of FIG. 49;

FIG. 49 illustrates a profile view of the sensor shown in FIG. 48;

FIG. 50 illustrates a cross-sectional view of a $16^{th}$ embodiment of the sensor of the anti-entrapment system taken along the line 50-50 of FIG. 51;

FIG. 51 illustrates a profile view of the sensor shown in FIG. 50;

FIG. 52 illustrates a profile view of a $17^{th}$ embodiment of the sensor of the anti-entrapment system;

FIG. 53 illustrates a cross-sectional view of the sensor shown in FIG. 52 taken along the line 53-53 of FIG. 52;

FIG. 54 illustrates a cross-sectional view of an $18^{th}$ embodiment of the sensor of the anti-entrapment system;

FIG. 55 illustrates a cross-sectional view of a 19th embodiment of the sensor of the anti-entrapment system;

FIG. 62a illustrates the capacitance sensor shown in FIG. 60 operating in a proximity sensing mode;

FIG. 62b illustrates the capacitance sensor shown in FIG. 60 operating in a touch sensing mode;

FIG. 63 illustrates an equivalent circuit for the sensor arrangement shown in FIG. 62a;

FIG. 64 illustrates a variation of the preferred embodiment of the sensor shown in FIG. 60;

FIGS. 65a, 65b, and 65c illustrate a variation of the preferred embodiment of the sensor shown in FIG. 60;

FIG. 66 illustrates a variation of the preferred embodiment of the sensor shown in FIG. 60;

FIG. 67 illustrates a variation of the preferred embodiment of the sensor shown in FIG. 60;

DETAILED DESCRIPTION OF THE PREFERRED EMBODIMENT(S)

Figure 5:
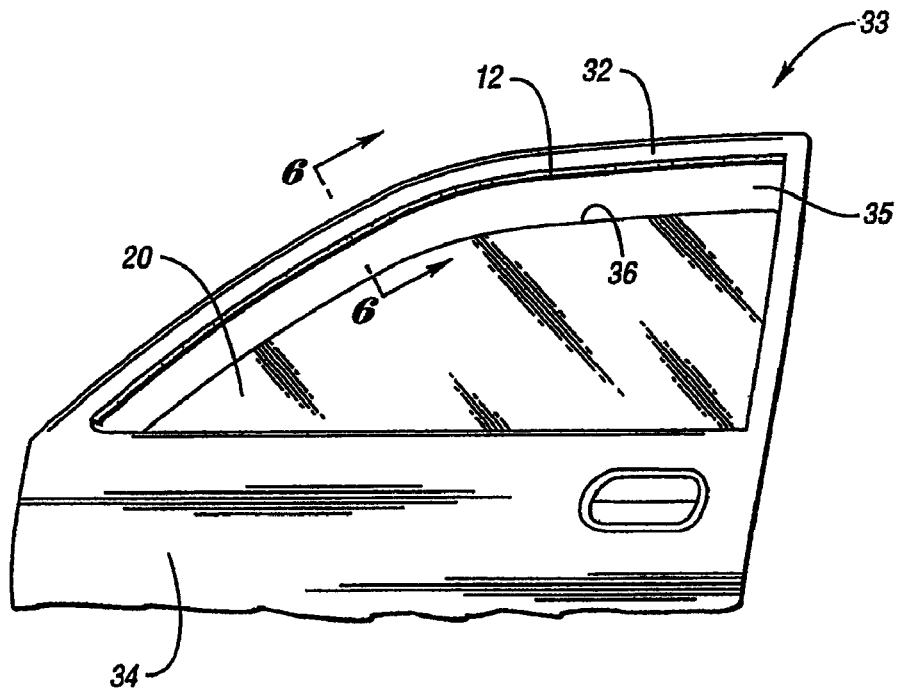
FIG. 5 illustrates the placement of the sensor of the anti-entrapment system for use in an automobile door-window environment.

Referring now to FIG. 1a, an anti-entrapment system 10 in accordance with the present invention is shown. Anti-entrapment system 10 includes a sensor 12 and a controller 14. Sensor 12 is generally a capacitance sensor that is operable to detect touching by an object 16 to sensor 12 and/or the presence (i.e., proximity) of an object 16 near sensor 12. In response to an object 16, including human body parts, touching sensor 12, the capacitance of sensor 12 changes. Likewise, in response to an electrically conductive object 16, including human body parts, coming within the proximity of sensor 12, the capacitance of sensor 12 changes even without the object actually touching, or applying any force, to sensor 12. This provides for zero force detection of a human body part before contact to sensor 12 is made by the body part. As such, sensor 12 is a contact (i.e., touch) and a non-contact (i.e., proximity) sensor.

Controller 14 controls a motor 18 associated with a translating device 20 such as a window, sliding door, sunroof, etc. in order to move translating device 20 between opened and closed positions. Controller 14 controls motor 18 to move window 20 in an opening direction when an opening provided by window 20 is desired. Similarly, controller 14 controls motor 18 to move window 20 in a closing direction in order to close off the opening of window 20.

Generally, an operator actuates a switch to have controller 14 control the opening and closing of window 20. Such a switch may be configured to provide express-up (i.e., express close) and express-down (i.e., express open) functionality such that a single switch actuation (as opposed to a continuous actuation) causes controller 14 to control window 20 until window 20 has fully moved into its opened or closed position.

Sensor 12 is placed adjacent to a window opening provided by window 20. Alternatively, sensor 12 is placed on window 20 itself. Sensor 12 monitors the window opening to determine whether an object 16 such as a person's hand or finger is near or extends through the window opening. As can be appreciated, a problem with object 16 extending through the window opening is that when window 20 moves in the closing direction and closes off the window opening, window 20 will pinch the object unless the object is removed from the window opening.

Sensor 12 is placed adjacent to the window opening (or on window 20) such that object 16 touches sensor 12 and/or becomes in close proximity to sensor 12 if the object is caught between the window opening and window 20 and is about to be pinched by window 20. Sensor 12 generates a pinch sensor signal 21 in response to object 16 touching sensor 12 and generates a proximity sensor signal 23 in response to the object being in close proximity to sensor 12. Sensor 12 provides pinch and proximity sensor signals 21, 23 to controller 14. In response to receiving either of pinch and proximity sensor signals 21, 23, controller 14 controls window 20 via motor 18 accordingly.

For instance, if the operator has actuated the switch to have controller 14 close window 20 and window 20 is now closing (for example, when window 20 is in express-up operation), controller 14 controls window 20 to stop closing and then open in response to a detection by sensor 12 of object 16 within the window opening. Reversing the direction of window 20 and opening the window causes the window opening to increase in size in order to prevent any pinching of the object and to give time for the object to be removed from the window opening. Similarly, if sensor 12 detects the presence of object 16 within window opening, then controller 14 prevents window 20 from subsequently moving in the closing direction until the object has been removed from the window opening.

Referring now to FIG. 1b, sensor 12 and controller 14 may be integrated with one another to form a sensor/controller 13.

Sensor/controller 13 effectively provides the same function as non-integrated sensor 12 and controller 14. As such, in this document, the description regarding sensor 12 and controller 14 also refers to the sensor and controller functionality provided by sensor/controller 13.

Controller 14 can have switch inputs, communications capability with other sensors and controllers, and various outputs for controlling and monitoring various aspect of window 20. For instance, controller 14 can have sensor inputs for motor 18 as designated by line 19 in FIG. 1a or other moving members to determine the position, direction of movement, speed of movement, etc. of window 20. Such sensor inputs could be for receiving signals from Hall Effect sensors and the like such as optic and resistive sensors.

In the case of controller 14 receiving sensor signals 19 responsive to motor 18 or other moving members, the controller would have additional anti-entrapment capabilities by making use of motor current and/or commutator pulses and/or sensor signals from Hall (or other type) sensors. This would have the added benefit of being able to detect obstructions while the moving member and the obstruction are too far away from sensor 12 to be sensed by the sensor.

Referring now to FIGS. 2 and 3, a first embodiment of sensor 12 is shown. Sensor 12 includes a flexible center conductive element or core 22 coaxially surrounded by a non-conductive compressible element or layer 26 that is in turn coaxially surrounded by a flexible outer conductive element or layer 24. Non-conductive compressible layer 26 separates conductive core 22 and conductive layer 24. Conductive layer 24 is electrically grounded for sensor 12. An elastomeric overcoat 28 covers conductive layer 24.

Conductive core 22 and conductive layer 24 are made from conductive materials such as aluminum, copper, and the like. Conductive core 22 and conductive layer 24 may also be made from materials such as nylon, polyester, and the like that have been plated or metalized with a conductive material such as aluminum, copper, nicked, and the like. Conductive core 22 and conductive layer 24 each may be a braided mesh or a metalized woven fabric which gives the conductive core and the conductive layer their flexibility. Conductive core 22 and conductive layer 24 may also be a plated woven fabric that has as a metalization coating of copper, for proper conductivity, with a nickel coating over the copper, for corrosion resistance. Non-conductive compressible layer 26 may be an EPDM closed cell foam having a high dielectric constant and a low compressible force. The dielectric constant and/or compressibility of non-conductive layer 26 may be changed by using different types of materials. For instance, non-conductive layer 26 may simply be air. Elastomeric overcoat 28 may be made from elastomeric rubbers, like vinyl, thermo-plastic elastomers such as Santoprene, Neoprene, Buna N, and the like. Elastomeric overcoat 28 could also be felt fabric and the like. Elastomeric overcoat 28 may be semi-rigid, flexible, and/or compressible and may incorporate sealing elements, adhesives, and other attachments.

Referring now to FIG. 4a with continual reference to FIG. 1, the operation of sensor 12 for determining the presence of an object within the proximity of the sensor will now be described in more detail. Sensor 12 is typically mounted to a fixed assembly such as an automobile window body panel 32. Sensor 12 can also be embodied in the automobile window weather-strip and the like. In FIG. 4a, an electrically conductive object 30 such as a human body part is placed in the window opening between window 20 and sensor 12. As shown, the window opening is sufficiently large enough such that object 30 can move freely in the window opening without being pinched by window 20. If the window opening becomes smaller as the result of window 20 closing such that object 30 becomes proximal to sensor 12 and enters the capacitive field surrounding conductive layer 24, then the capacitance of the sensor changes.

Sensor 12 then generates proximity sensor signal 23 indicative of this change in capacitance to controller 14. Controller 14 processes proximity sensor signal 23 to determine that the capacitance of sensor 12 has changed as a result of object 30 being proximal to sensor 12 and is about to be pinched by window 20. Controller 14 then controls motor 18 to open window 20 and reverse its movement away from window body panel 32 thereby increasing the window opening and allowing object 30 to be removed from the window opening without any pinching of the object by the window.

Referring now to FIG. 4b with continual reference to FIG. 1, the operation of sensor 12 for detecting an object touching the sensor will now be described in more detail. In FIG. 4b, window 20 starts to close in the direction of the arrow towards window body panel 32 and the window opening becomes smaller such that a non-electrically conductive object 31 is between sensor 12 and window 20 and touches the sensor. In response to object 31 touching sensor 12, the sensor compresses such that the distance between conductive core 20 and conductive layer 24 becomes smaller. As a result of this distance becoming smaller, the capacitance of sensor 12 changes.

Sensor 12 then generates pinch sensor signal 21 indicative of this change in capacitance to controller 14. Controller 14 processes pinch sensor signal 21 to determine that the capacitance of sensor 12 has changed as a result of object 31 touching the sensor and is about to be pinched by window 20. Controller 14 then controls motor 18 to open window 20 and reverse its movement away from window body panel 32 thereby increasing the window opening and allowing object 31 to be removed from the window opening without any pinching of the object by the window. It is to be appreciated that an electrically conductive object such as object 30 may also touch sensor 12 and, in this case, the sensor likewise compresses and generates a pinch sensor signal 21 indicative of the resulting change in capacitance.

As will be explained in greater detail with respect to FIG. 71, controller 14 may include an electronic micro-processor (micro-controller) having a digital to analog (DAC) converter. The DAC converter allows for the subtraction (or an addition) of an offset voltage to allow for greater amplification of pinch and proximity sensor signals 21, 23. Alternative embodiments could include analog waveform generation, such as a triangle wave, to accomplish the determination of the magnitude of the offset voltage for subsequent subtraction (or addition) thereof. The microprocessor may execute software for filtering and may use algorithms for adaptive threshold detection enabling determination of object proximity to sensor 12 or compression of the sensor as a result of an object touching the sensor. The microprocessor may be substituted with discrete electronic, hybrid electronics, or a custom application specific integrated circuit that may include microprocessor core analog and digital circuitry.

Controller 14 may also incorporate system functions such as functions of a vehicle door system. Such door system functions include functions associated with power mirrors, such as movement, electro-chromatic control, turn signal indication, and heating control; power door locks; keyless entry systems; personalization settings, such as driver 1 and driver 2; and the like. In this instance, controller 14 uses a micro-controller with serial communications, via wires, optic fibers, or wireless such as RF wireless, to communicate with other control modules located within a vehicle. The use of such a controller eliminates the redundancy of multiple modules in a door system. In this instance, controller 14 can be integrated with the window lift motor, or be a separate module that is wired to items controlled by the module.

Controller 14 may also incorporate other system functions based on mounting locations other than a vehicle door. Functions associated with mounting locations such as the dashboard, center console, or seat may be integrated into the module. Functions such as steering wheel and steering column adjustments, seat position settings, seat heating and cooling, global positioning and Internet communications, and pedal adjustment.

Referring now to FIG. 5, the placement of sensor 12 of anti-entrapment system 10 for use in an automobile door-window environment 33 is shown. Automobile door-window environment 33 includes a door 34 and a window body panel 32. Window 20 automatically moves down and up to open and close with respect to window body panel 32. In an opened position, window 20 forms a window opening 35 between a top edge 36 of the window and window body panel 32. Sensor 12 is placed along window body panel 32. As described above, sensor 12 is operable to detect the presence of an object extending through window opening 35 that is adjacent to the sensor and/or is touching the sensor. Such capability enables sensor 12 to function in conjunction with controller 14 to prevent window 20 from pinching the object as the window closes off window opening 35.

Figure 6A:
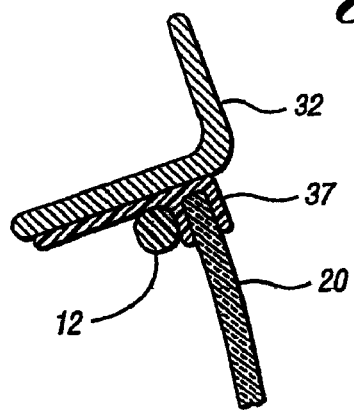
FIG. 6a illustrates a cross-sectional view of a first placement of the sensor in the automobile door-window environment taken along the line 6-6 of FIG. 5.

FIG. 6a illustrates a cross-sectional view of a first placement of sensor 12 relative to window 20 and window body panel 32. Sensor 12 is placed within the interior of the automobile adjacent to window body panel 32 and a window weather strip 37. (Alternatively, sensor 12 is placed on either side of window 20 or on the top side of window 20.) Window weather strip 37 is attached to window body panel 32 and seals off window 20 when the window moves to its fully closed position as shown in FIG. 6A.

Figure 6B:
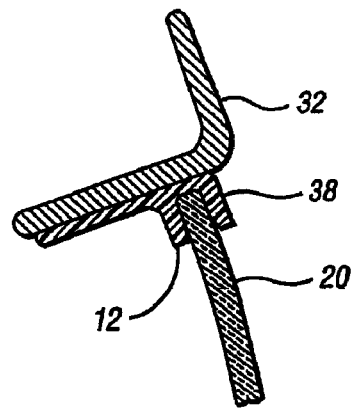
FIG. 6b illustrates a cross-sectional view of a second placement of the sensor in the automobile door-window environment taken along the line 6-6 of FIG. 5.
Figure 7:
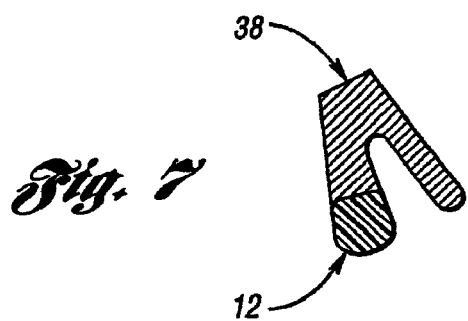
FIG. 7 illustrates in greater detail the sensor placement shown in FIG. 6B.

FIG. 6b illustrates a cross-sectional view of a second placement of sensor 12 relative to window 20 and window body panel 32. Sensor 12 is formed integral with a window weather strip 38 which is attached to window body panel 32. FIG. 7 illustrates in greater detail the integration of sensor 12 within window weather strip 38.

Figure 8:
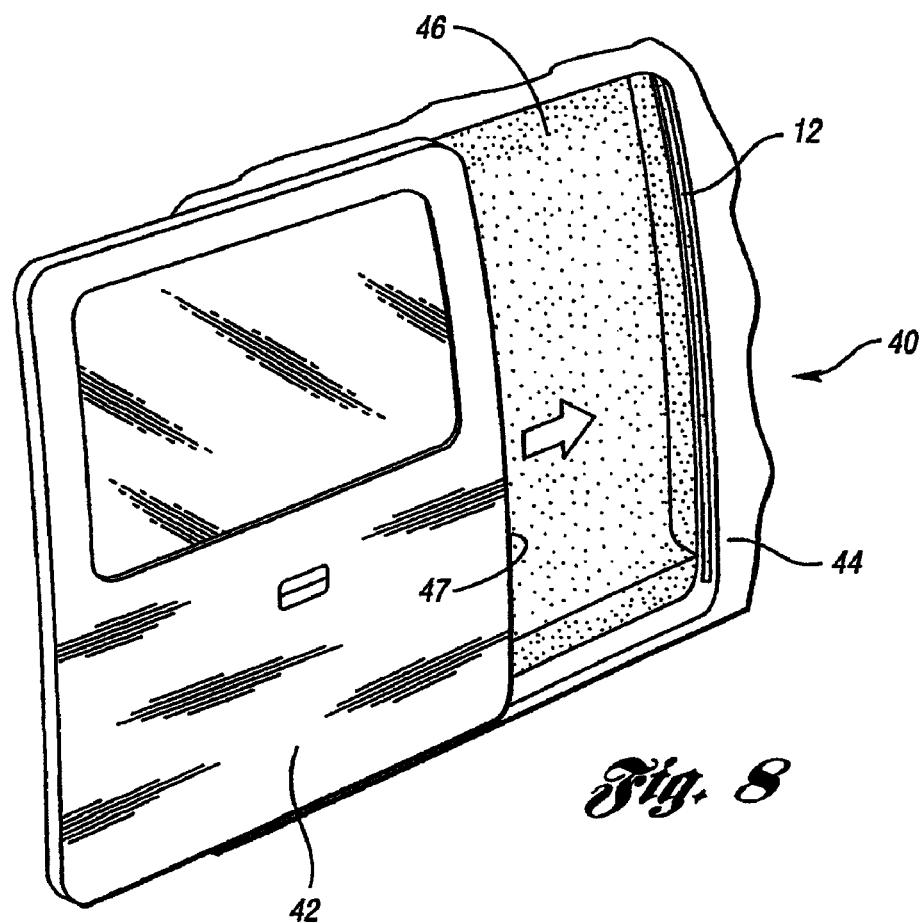
FIG. 8 illustrates the placement of the sensor of the anti-entrapment system for use in an automobile sliding-door environment.

Referring now to FIG. 8, the placement of sensor 12 of anti-entrapment system 10 for use in an automobile sliding-door environment 40 is shown. Automobile sliding-door environment 40 includes an electrically operated sliding door 42 and an automobile door body panel 44. Sliding door 42 moves horizontally to open and close with respect to door body panel 44. In an opened position, sliding door 42 forms a door opening 46 between a leading edge 47 of the sliding door and door body panel 44. Sensor 12 is placed along door body panel 44 in a manner analogous to the placement of the sensor as shown in either FIG. 6a or FIG. 6b. Sensor 12 may also be mounted on sliding door 42 instead of door body panel 44. Sensor 12 detects the presence of an object extending through sliding door opening 46 upon the object being adjacent to the sensor and/or touching the sensor. In response to sensor 12 detecting an object extending through door opening 46, controller 14 prevents sliding door 42 from pinching the object as the sliding door moves in the direction of the illustrated arrow and closes off door opening 46.

Figure 9:
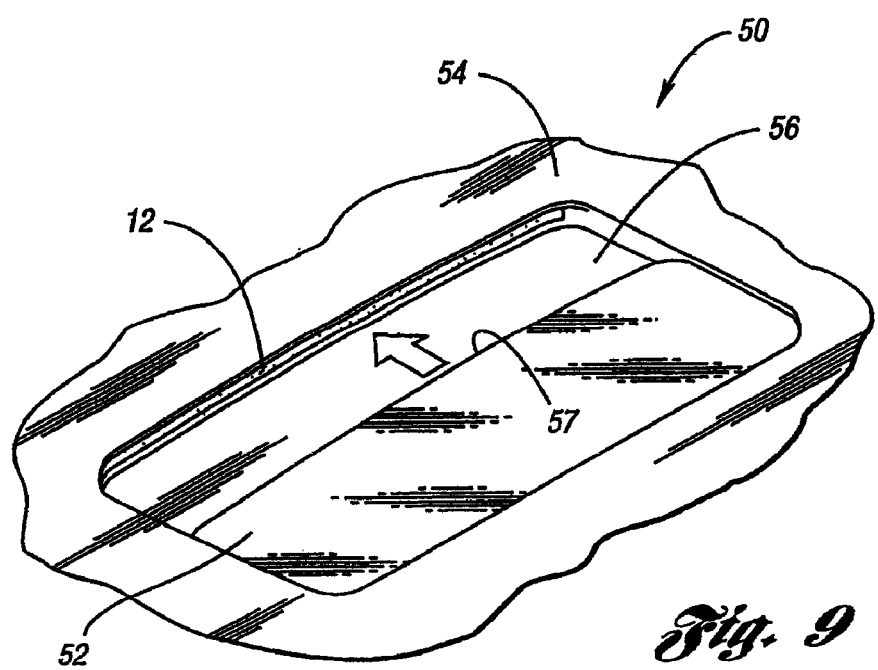
FIG. 9 illustrates the placement of the sensor of the anti-entrapment system for use in an automobile sunroof environment.

Referring now to FIG. 9, the placement of sensor 12 of anti-entrapment system 10 for use in an automobile sunroof environment 50 is shown. Automobile sunroof environment 50 includes an electrically operated sliding sunroof 52 and an automobile roof 54. Sunroof 52 moves horizontally with respect to roof 54 to form and close an opening 56 in the roof. In an opened position, sunroof 52 forms roof opening 56 between a leading edge 57 of the sunroof and roof 54. Sensor 12 is placed along roof 54 in a manner analogous to the placement of the sensor as shown in either FIG. 6a or FIG. 6b. As described above, sensor 12 is operable to detect the presence of an object extending through roof opening 56 upon the object being adjacent to the sensor and/or touching the sensor. Such capability enables sensor 12 to function in conjunction with controller 14 to prevent sunroof 52 from pinching the object as the sunroof closes off roof opening 56.

Figure 10:
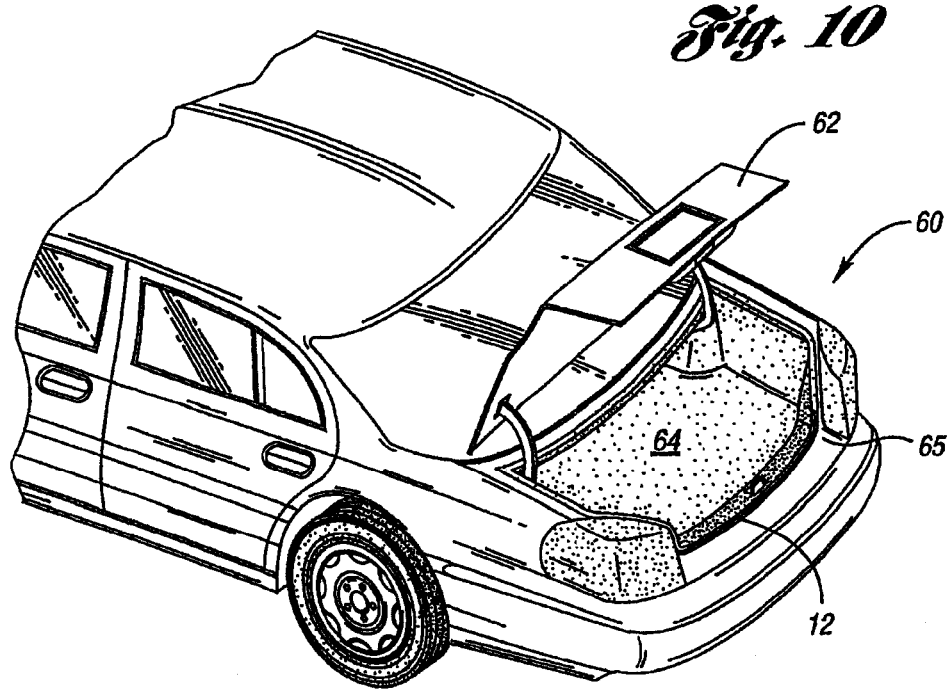
FIG. 10 illustrates the placement of the sensor of the anti-entrapment system for use in an automobile deck lid environment.

Referring now to FIG. 10, the placement of sensor 12 of anti-entrapment system 10 for use in an automobile deck lid environment 60 is shown. Automobile deck lid environment 60 includes an electrically operated deck lid 62. Deck lid 62 opens and closes with respect to an automobile trunk 64. Sensor 12 is placed along an edge 65 of trunk 64 in a manner analogous to the placement of the sensor as shown in either FIG. 6a or FIG. 6b. As described above, sensor 12 detects the presence of an object extending from the exterior of trunk 64 into the interior of the trunk as a result of such object being adjacent to the sensor and/or touching the sensor. Sensor 12 provides appropriate sensor signals 21, 23 to controller 14 in order to prevent deck lid 62 from pinching the object as the deck lid closes off trunk 64.

Figures 11A, 11B:
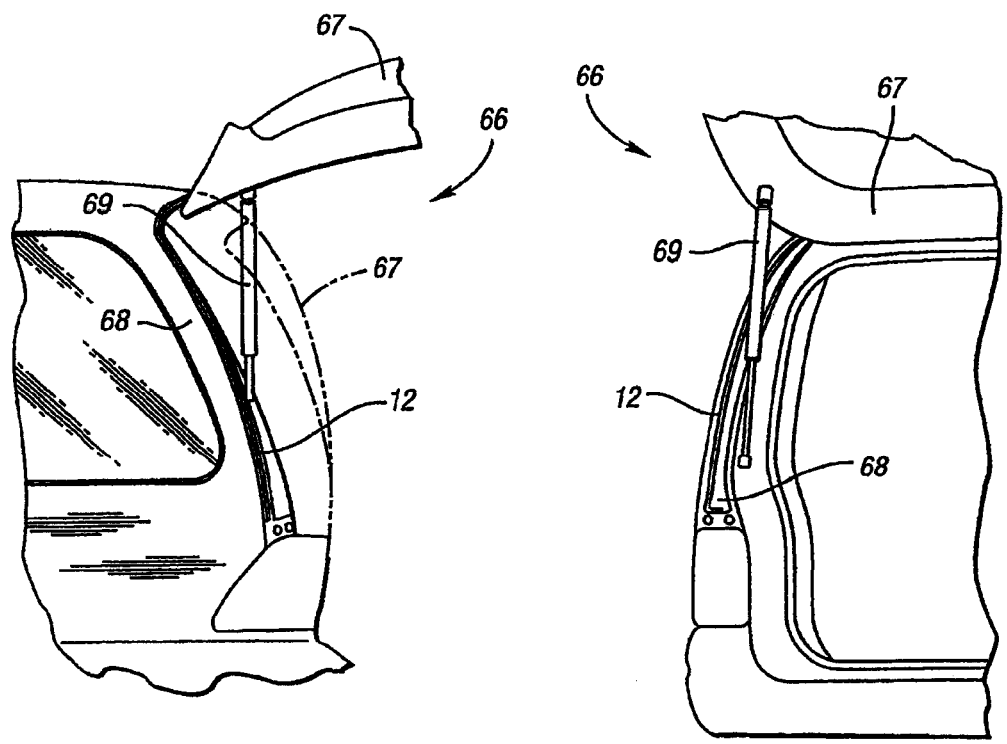
FIGS. 11a and 11b illustrate the placement of the sensor of the anti-entrapment system for use in a hatchback environment.

In addition to the automobile applications described above, anti-entrapment system 10 may also be used in other automobile applications including those involving tonneau covers and hatchback doors. For instance, as shown in FIGS. 11a and 11b, the placement of sensor 12 for use in an automobile hatchback environment 66 is shown. Automobile hatchback environment 66 includes a hatch 67 and an automobile body panel 68. A cylinder 69 connects hatch 67 and automobile body panel 68. Cylinder 69 includes a piston rod which extends to move hatch 67 to an opened position with respect to body panel 68 and contracts to move the hatch to a closed position with respect to the body panel (the hatch in the closed position is shown as a dotted line in FIG. 11a). Sensor 12 is placed along body panel 68. Sensor 12 detects the presence of an object extending in the opening between hatch 67 and body panel 68 that is adjacent to the sensor and/or is touching the sensor. Controller 14 is then able to control cylinder 69 to prevent hatch 67 from pinching the object as the hatch is being closed.

Referring now to 12, the placement of sensor 12 for use in an automated bus door environment 70 is shown. Automated bus door environment 70 includes a pair of electrically operated doors 72 and 74. Hinges 76 power doors 72 and 74 to automatically open and close. When closing, door 72 closes prior to door 74 such that door 74 overlaps door 72 when both doors are closed. Sensor 12 is placed along an edge 75 of door 72 and may be incorporated into a door weather strip. Sensor 12 detects the presence of an object extending into the door opening as a result of such object being adjacent to the sensor and/or touching the sensor. Sensor 12 functions in conjunction with controller 14 to prevent door 74 from pinching the object as door 74 closes following the closing of door 72.

Figure 14:
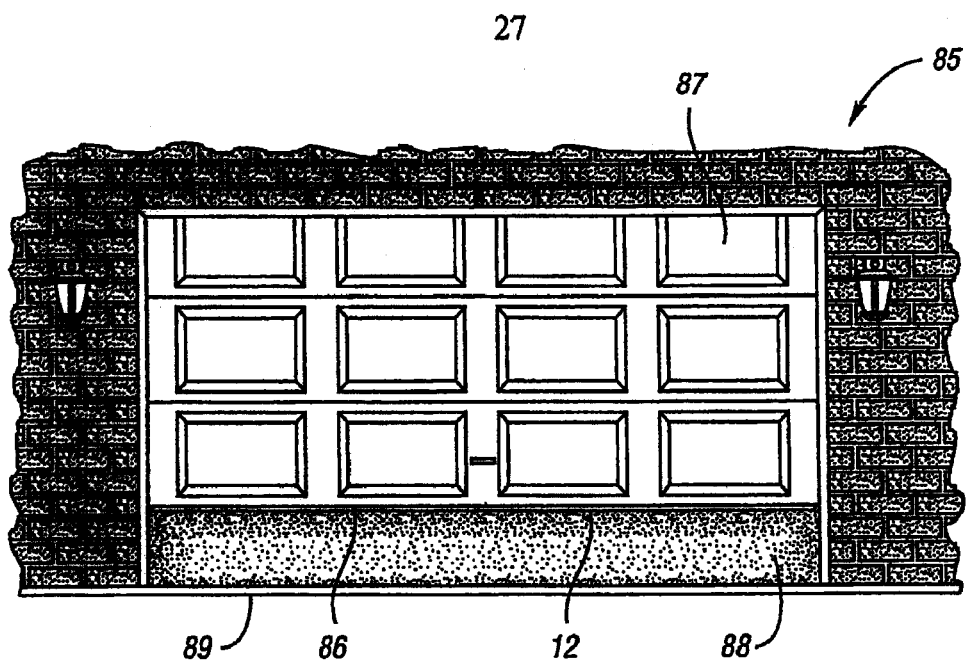
FIG. 14 illustrates the placement of the sensor of the anti-entrapment system for use in a garage door environment.

In addition to automobile applications, anti-entrapment system 10 may also be used in industrial applications. For instance, FIGS. 13 and 14 illustrate the placement of sensor 12 of anti-entrapment system 10 for use in an elevator door environment 80 and a garage door environment 85, respectively. Elevator door environment 80 is a specific application of a general sliding door environment. In elevator door environment 80, sensor 12 is placed on a leading edge of either elevator door 82. Elevator doors 82 are shown partially opened with an elevator door opening 84 therebetween. Sensor 12 detects the presence of an object extending between elevator doors 82 as a result of such object being adjacent to the sensor and/or touching the sensor. Sensor 12 generates an appropriate sensor signal 21, 23 for controller 14 in order to prevent elevator doors 82 from pinching the object as the doors slide close.

In garage door environment 85, sensor 12 is placed along a bottom edge 86 of a garage door 87. Garage door 87 is shown partially opened with a garage door opening 88 between bottom edge 86 of the garage door and the driveway 89 leading into the garage. Sensor 12 detects the presence of an object extending within garage door opening 88 as a result of such object being adjacent to the sensor and/or touching the sensor. Sensor 12 generates an appropriate sensor signal 21, 23 for controller 14 in order to prevent garage door 87 from pinching the object as the garage door closes.

Figure 15:
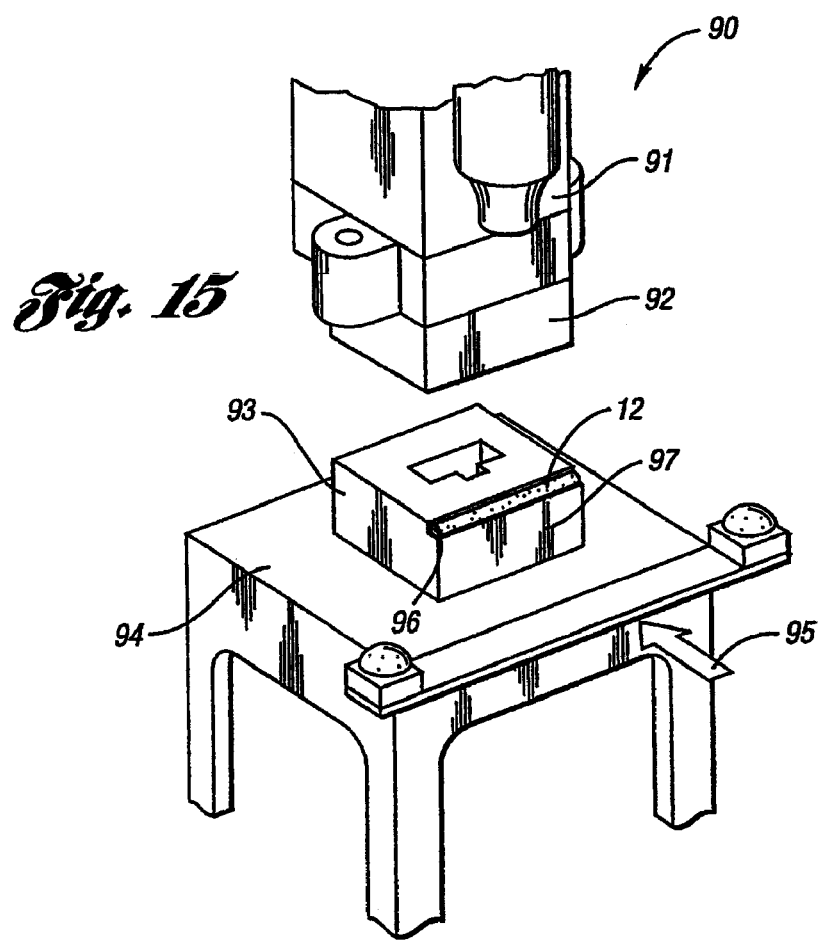
FIG. 15 illustrates the placement of the sensor of the anti-entrapment system for use with an industrial machine.

FIG. 15 illustrates the placement of sensor 12 of anti-entrapment system 10 for use with an industrial machine 90. Industrial machine 90 includes a press machine ram mechanism 91 having an upper press tooling die 92. A lower press tooling die 93 is fixed on a press machine platen 94. Ram mechanism 91 is movable to force upper press tooling die 92 against lower press tooling die 93. During operation, a press operator faces industrial machine 90 in the direction of arrow 95. Sensor 12 is placed within a cavity 96 formed on a front edge 97 of lower press tooling die 93. As such, sensor 12 is positioned to face the press operator. Within cavity 96, sensor does not come into contact with upper press tooling die 92 as this tooling die closes on lower press tooling die 93. During operation of industrial machine 90, sensor 12 detects the presence of an object touching the sensor and/or the presence of a conductive object such as a finger within the proximity of the sensor. Sensor 12 then generates an appropriate sensor signal 21, 23 for controller 14 in order to prevent upper press tooling die 92 from slamming on a foreign object within the vicinity of lower press tooling die 93.

Referring now to FIG. 16, a sensor 100 in accordance with a second sensor embodiment is shown. Sensor 100 is similar to sensor 12 but includes a third flexible conductive element 102 that coaxially surrounds first and second flexible conductive elements 104, 106. Sensor 100 includes a non-conductive compressible coaxial element 108 surrounding first conductor 104 and a non-conductive compressible coaxial element 110 surrounding second conductor 106. An outer elastomeric coating 112 coaxially surrounds third conductor 102. Non-conductive compressible elements 108 and 110 may be made from the same closed cell foam or other compressible material. Like first and second conductors 104, 106, third conductor 102 may also be a braided wire mesh made from a conductive material. Second conductor 106 is electrically grounded.

Referring now to FIG. 17, a cross-sectional view of sensor 100 is shown. A semi-rigid elastomer 110 is used in place of coaxial non-conductive compressible layer 110. Semi-rigid elastomer 110 allows for faster change in capacitance of first and second conductors 104, 106 in the event of an object being in contact with outer coating 112. The distance between third and second conductors 102, 106 and the proximity of an electrically conductive object to third conductor 102 determine the capacitance of the third and second conductors. The distance between first and second conductors 104, 106 determine the capacitance of the first and second conductors. Thus, sensor 100 is a dual-purpose sensor in that it can detect an object in proximity to the sensor and it can detect an object touching the sensor as a function of the corresponding change in capacitance.

Referring now to FIGS. 18 and 19, a sensor 120 in accordance with a third sensor embodiment is shown. Sensor 120 includes two longitudinally parallel flexible conductor core elements 122 and 124 separated by a distance. Two non-conductive compressible coaxial elements 126 and 128 (or semi-rigid elastomers) individually surround respective conductor core elements 122 and 124. Two flexible conductor elements 130 and 132 which are separated by a distance coaxially surround respective non-conductive compressible elements 126 and 128. A semi-rigid elastomeric outer coating 134 encases conductive elements 130 and 132.

Sensor 120 is essentially two sensors 136 and 138. Sensor 136 includes elements 122, 126, 130, and 134. Sensor 138 includes elements 124, 128, 132, and 134. Sensor 136 is configured as a contact sensor (i.e., pinch sensor) such that an object must be in contact with the sensor to cause the distance between conductor elements 122 and 130 to be reduced thereby causing a change in capacitance between conductor elements 122 and 130 that can be used by controller 14. As such, outer conductor element 130 is electrically grounded.

Sensor 138 is configured as a non-contact sensor (i.e., proximity sensor) such that an electrically conductive object that is proximal to outer conductor element 132 causes a change in capacitance between conductor elements 124 and 132 that can be used by controller 14. As such, inner conductor element 124 is electrically grounded. Thus, sensor 120 detects objects in contact with sensor 120 as well as detects electrically conductive objects in proximity to sensor 120.

Referring now to FIGS. 20 and 21, a sensor 140 in accordance with a fourth sensor embodiment is shown. Sensor 140 includes two longitudinally parallel flexible conductor elements 142 and 144 separated by a distance. Two compressible coaxial elements 146 and 148 (or semi-rigid elastomers) individually surround respective conductor core elements 122 and 124. Two metal braided flexible conductor elements 150 and 152 which are separated by a distance coaxially surround respective non-conductive compressible elements 146 and 148. A semi-rigid elastomeric outer coating 154 encases conductor elements 150 and 152.

Sensor 140 is essentially two sensors 156 and 158. Sensor 156 includes elements 142, 146, 150, and 154. Sensor 158 includes elements 144, 148, 152, and 154. As shown in FIG. 21, outer coating 154 is configured to provide for an entry port 157 for receiving a top edge of a translating device 20 such as a window when the window moves in a closing direction to the closed position. In the closed position, sensors 156 and 158 are located on respective sides of window 20. As such, sensor 140 provides detection of objects that are proximal and/or in contact from multiple directions.

Figure 22:
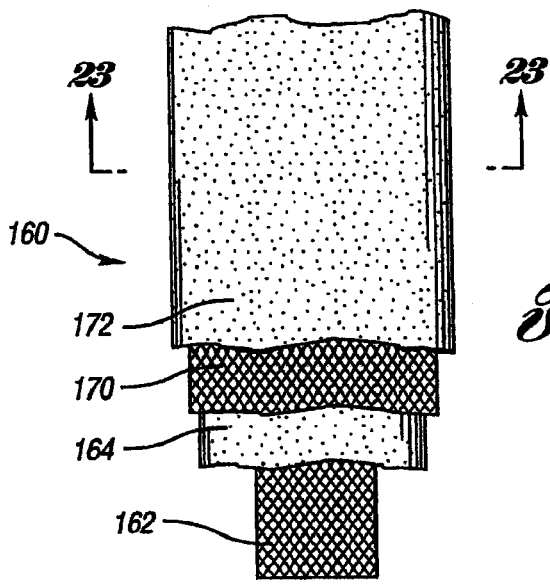
FIG. 22 illustrates a fifth embodiment of the sensor of the anti-entrapment system.
Figure 23:
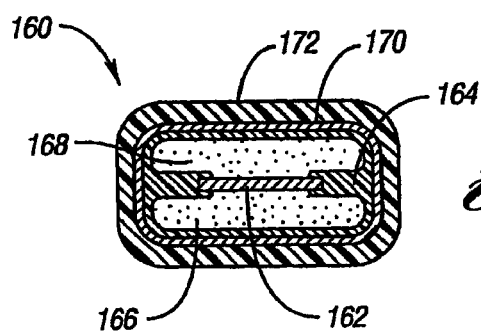
FIG. 23 illustrates a cross-sectional view of the sensor shown in FIG. 22 taken along the line 23-23 of FIG. 22.

Referring now to FIGS. 22 and 23, a sensor 160 in accordance with a fifth sensor embodiment is shown. Sensor 160 includes an inner flexible conductor 162. A hollow non-conductive flexible spanner 164 holds inner flexible conductor 162 to form lower and upper spanner spaces 166 and 168. Spanner spaces 166 and 168 are filled with air or other dielectric medium. A metal braided outer conductor element 170 coaxially surrounds spanner 164. A semi-rigid elastomer outer jacket 172 encases conductor element 170. Sensor 160 registers a change in capacitance whenever the distance between outer conductor element 170 and inner conductor element 162 changes as a result of an object touching outer jacket 172 and/or as a result of an electrically conductive object coming into proximity with the outer conductor.

Figure 24:
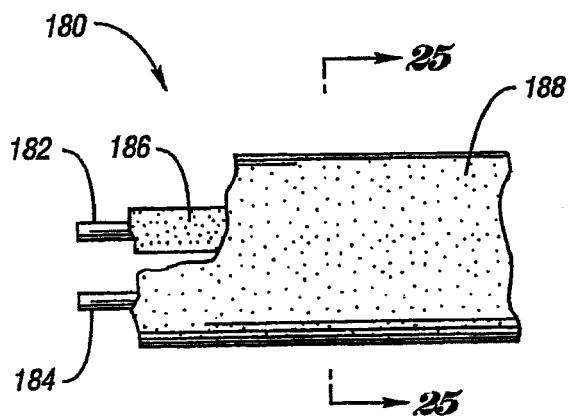
FIG. 24 illustrates a sixth embodiment of the sensor of the anti-entrapment system.
Figure 25:
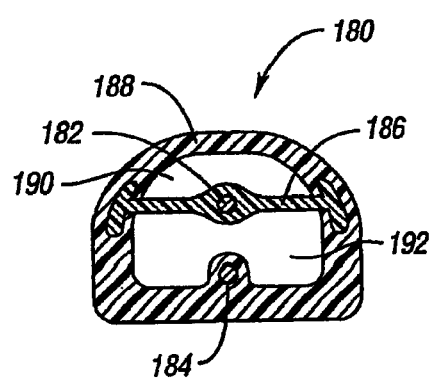
FIG. 25 illustrates a cross-sectional view of the sensor shown in FIG. 24 taken along the line 25-25 of FIG. 24.

Referring now to FIGS. 24 and 25, a sensor 180 in accordance with a sixth sensor embodiment is shown. Sensor 180 includes first and second flexible conductive metal wires 182 and 184. A non-conductive flexible spanner 186 holds first conductor 182. A conductive elastomeric outer jacket 188 having a hollow interior holds and encases second conductor 184 and holds each end of spanner 186. Spanner 186 divides the interior of outer jacket 188 into two spaces 190 and 192. Spaces 190 and 192 are filled with air or other dielectric medium. Sensor 180 registers a change in capacitance whenever the distance between first and second wires 182 and 184 changes as a result of an object touching outer jacket 188 and/or as a result of an electrically conductive object coming into proximity with either of wires 182 or 184.

Figure 34:
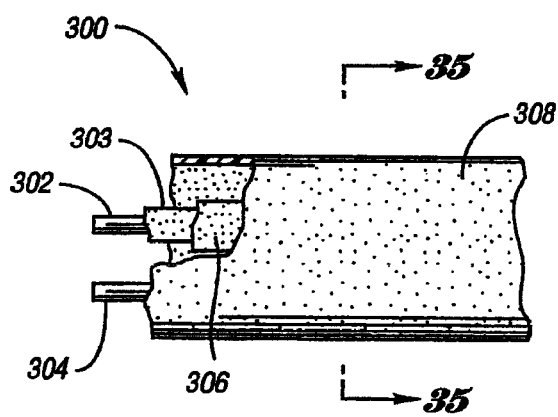
FIG. 34 illustrates a tenth embodiment of the sensor of the anti-entrapment system.
Figure 35:
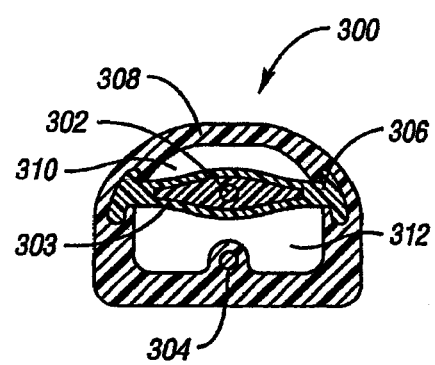
FIG. 35 illustrates a cross-sectional view of the sensor shown in FIG. 34 taken along the line 35-35 of FIG. 34.

Skipping to FIGS. 34 and 35, a sensor 300 in accordance with a tenth sensor embodiment is shown. Sensor 300 includes first and second flexible conductive metal wires 302 and 304. A conductive flexible elastomer 303 holds first conductor 302. A non-conductive flexible spanner 306 holds and encases conductive elastomer 303. A conductive elastomeric outer jacket 308 having a hollow interior holds and encases second conductor 304 and holds each end of spanner 306. Spanner 306 divides the interior of outer jacket 308 into two spaces 310 and 312. Spaces 310 and 312 are filled with air or other dielectric medium. Sensor 300 registers a change in capacitance whenever the distance between first and second conductors 302 and 304 changes as a result of an object touching outer jacket 308 and/or as a result of an electrically conductive object coming into proximity with either of conductors 302 or 304.

Referring now back to FIGS. 26 and 27, a sensor 200 in accordance with a seventh sensor embodiment is shown. Sensor 200 includes a flexible conductor element 202 encased by a compressible non-conductive elastomer 204. Elastomer 204 rests on a metal frame 206 such as a vehicle frame. Metal frame 206 essentially acts as a second conductor element. As such, sensor 200 registers a change in capacitance whenever the distance between conductor element 202 and metal frame 206 changes as a result of an object touching elastomer 204 and/or as a result of an electrically conductive object coming into proximity with conductor element 202.

Referring now to FIGS. 28 and 29, a sensor 220 in accordance with an eighth sensor embodiment is shown. Sensor 220 includes a continuous non-ending flexible metal braid conductor element 222. Conductor element 222 defines an interior 224 which is filled with air or other dielectric medium. A compressible non-conductive elastomer 226 encases conductor element 222 and its interior 224. Elastomer 226 rests on a metal frame 228 which acts as a second conductor element. Sensor 220 registers a change in capacitance whenever the distance between at least a portion of conductor element 222 and metal frame 228 changes as a result of an object touching elastomer 226 and/or as a result of an electrically conductive object coming into proximity with conductor element 222.

Referring now to FIGS. 30 and 31, a sensor 240 in accordance with a ninth sensor embodiment is shown. Sensor 240 includes inner and outer flexible metal braided conductor elements 242 and 244. Inner conductor element 242 surrounds a first non-conductive compressible foam element 246. Outer conductor element 244 surrounds a second non-conductive compressible foam element 248. A semi-rigid elastomeric outer jacket 250 surrounds second conductor element 244. As best shown in FIG. 31, inner and outer conductor elements 242 and 244 are continuous non-ending elements. Inner conductor element 242 is shaped in a given endless configuration to enable omni-directional proximity sensing capability. As inner conductor element 242 is flexible, its shape may be conformed to provide the desired omni-directional proximity sensing.

Figure 32:
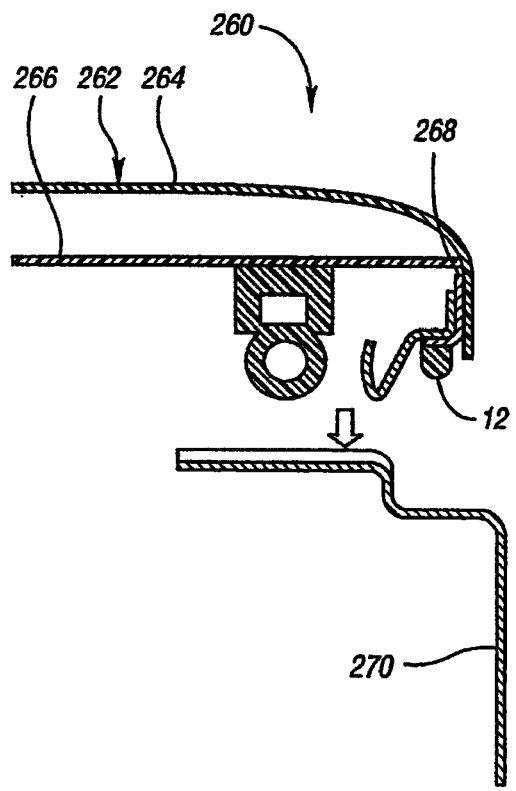
FIG. 32 illustrates a cross-sectional view of the placement of the sensor of the anti-entrapment system for use with a tonneau cover environment.
Figure 33:
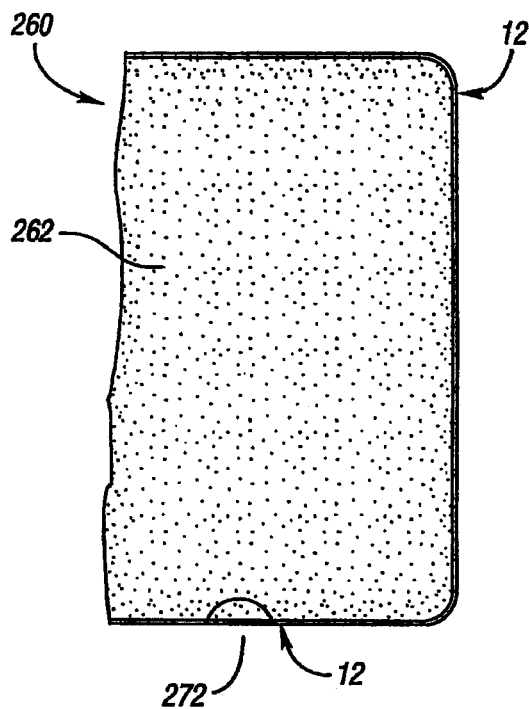
FIG. 33 illustrates a top view of the placement of the sensor of the anti-entrapment system for use with the tonneau cover environment.

Referring now to FIGS. 32 and 33, the placement of a sensor (such as sensor 12) of anti-entrapment system 10 for use in a tonneau cover environment 260 is shown. Tonneau cover environment 260 includes an electrically operated tonneau cover 262. Tonneau cover 262 includes an outer tonneau cover 264 and an inner tonneau cover 266. Tonneau cover 262 includes a sensor carrier 268 for holding sensor 12. As shown in FIG. 33, sensor carrier 268 holds sensor 12 along a majority of the periphery of tonneau cover 262 up to the location of a duckbill 272. Tonneau cover 262 opens and closes with respect to a bed wall 270. In a manner as described above, sensor 12 detects the presence of an object adjacent to tonneau cover 262 as a result of such object being adjacent to the sensor and/or touching the sensor. Sensor 12 provides appropriate sensor signals to controller 14 in order to tonneau cover 262 from pinching the object as the tonneau cover closes.

Figure 36:
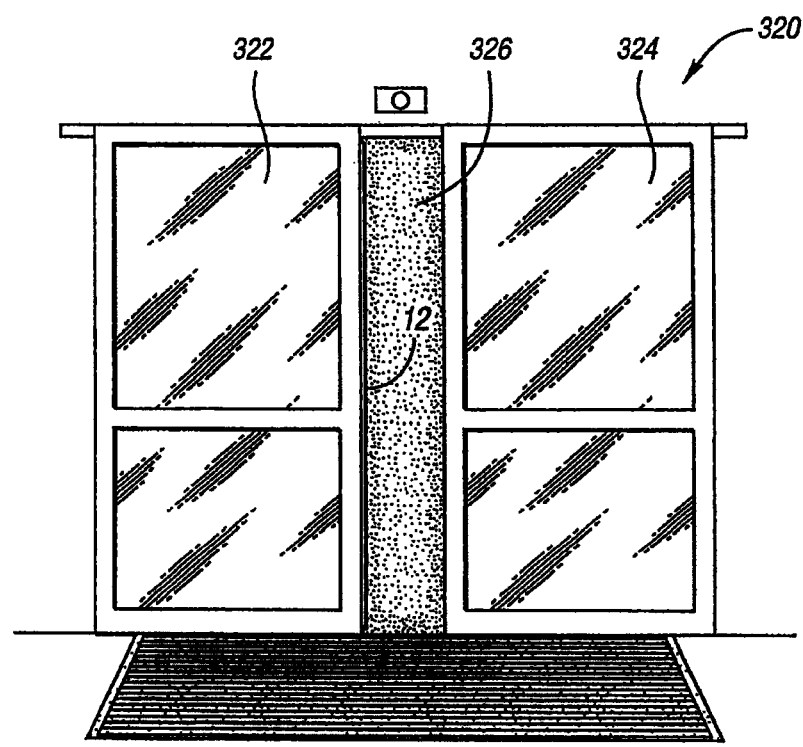
FIG. 36 illustrates the placement of the sensor of the anti-entrapment system for use with a double sliding door environment.
Figure 37:
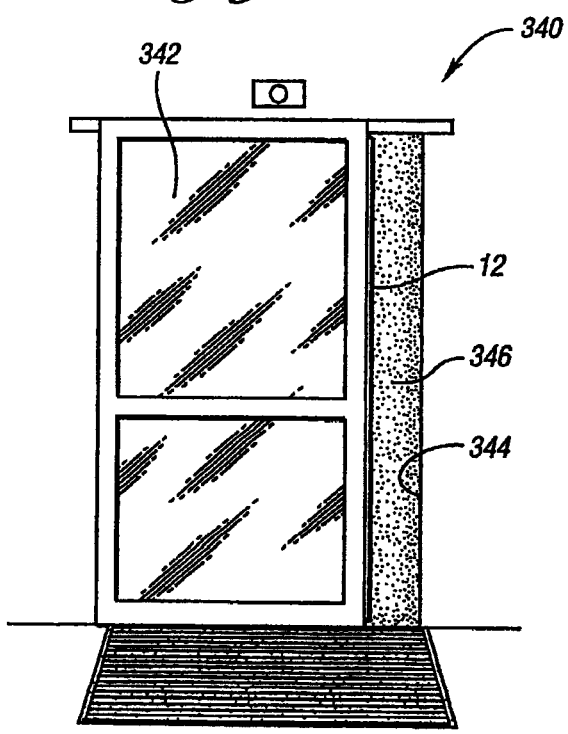
FIG. 37 illustrates the placement of the sensor of the anti-entrapment system for use with a single sliding door environment.

Referring now to FIGS. 36 and 37, the placements of a sensor (such as sensor 12) of anti-entrapment system 10 for use in double and single sliding door environments 320 and 340 are respectively shown. Double and single sliding door environments 320 and 340 are typically located in grocery stores and the like. In double sliding door environment 320, sensor 12 is placed on a leading edge of either sliding door 322 or 324. Sliding doors 322 and 324 are shown partially opened with a sliding door opening 326 therebetween. Sensor 12 detects the presence of an object extending between sliding doors 322 and 324 as a result of such object being adjacent to the sensor and/or touching the sensor. Sensor 12 generates an appropriate sensor signal 21, 23 for controller 14 in order to prevent sliding doors 322 and 324 from pinching the object as the doors slide close.

Single sliding door environment 340 includes a sliding door 342 and a door body panel 344. Sliding door 342 moves horizontally to open and close with respect to door body panel 344. In an opened position, sliding door 342 forms a door opening 346 between a leading edge 347 of the sliding door and door body panel 344. Sensor 12 is placed along door body panel 344 in a manner analogous to the placement of the sensor as shown in either FIG. 6A or FIG. 6B. Sensor 12 may also be mounted on sliding door 342 (as shown in FIG. 37) instead of door body panel 344. Sensor 12 detects the presence of an object extending through sliding door opening 346 that is adjacent to the sensor and/or is touching the sensor. In response to sensor 12 detecting an object extending through door opening 346, controller 14 prevents sliding door 342 from pinching the object as the sliding door moves in the direction of the illustrated arrow and closes off door opening 346.

Figure 38:
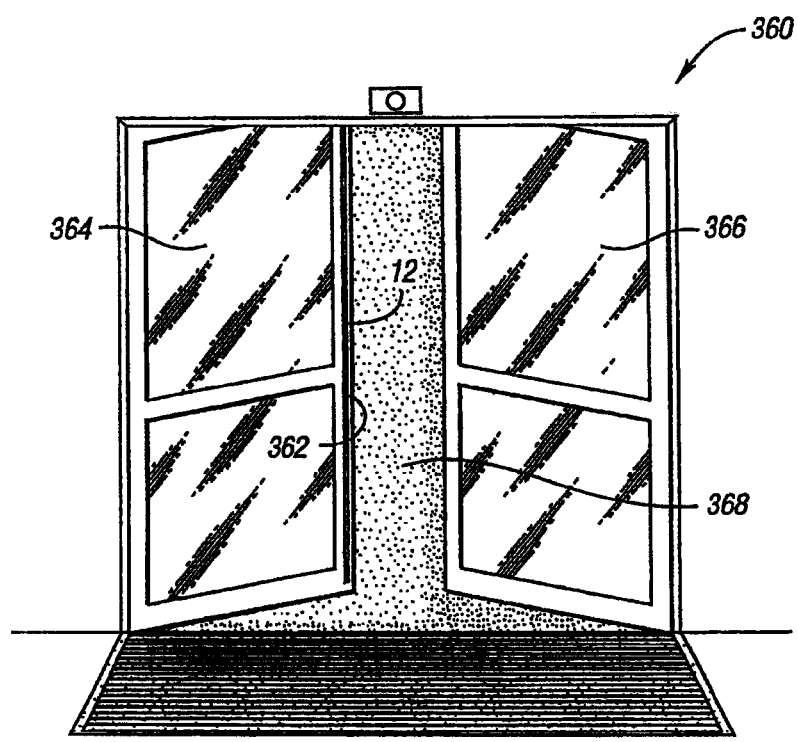
FIG. 38 illustrates the placement of the sensor of the anti-entrapment system for use in a double hinged automatic door environment.
Figure 39:
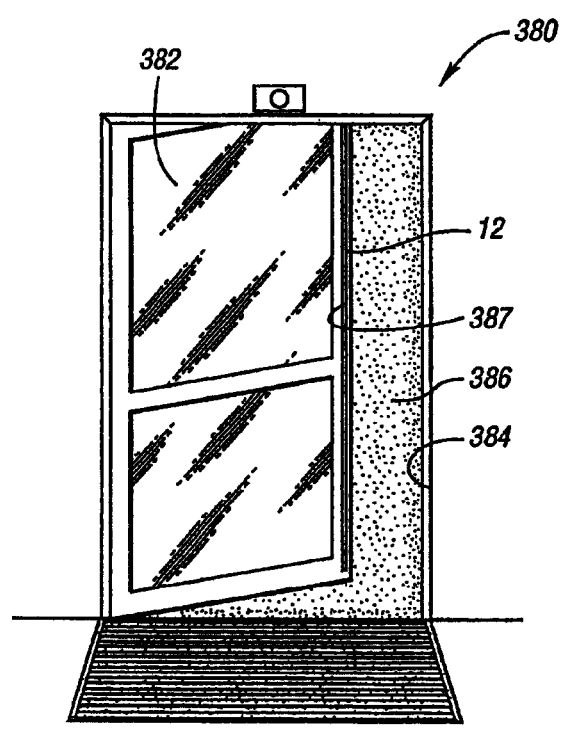
FIG. 39 illustrates the placement of the sensor of the anti-entrapment system for use in a single hinged automatic door environment.

Referring now to FIGS. 38 and 39, the placements of a sensor (such as sensor 12) of anti-entrapment system 10 for use in double and single hinged automatic door environments 360 and 380 are respectively shown. Double and single hinged automatic door environments 360 and 380 are typically located in grocery stores and the like. In double hinged automatic door environment 360, sensor 12 is affixed to a sealing surface 362 of either hinged automatic door 364 or 366. Hinged doors 364 and 366 are shown partially opened with a sliding door opening 368 therebetween. Sensor 12 detects the presence of an object extending between hinged doors 364 and 366 as a result of such object being adjacent to the sensor and/or touching the sensor. Sensor 12 generates an appropriate sensor signal 21, 23 for controller 14 in order to prevent hinged automatic doors 364 and 366 from pinching the object as the doors swing to a closed position.

In single hinged automatic door environment 380, sensor 12 is affixed to a sealing surface of a hinged automatic door 382 which closes with respect to a surface of a wall 384. In an opened position, door 382 forms a door opening 386 between a leading edge 387 of the door and wall surface 384. Sensor 12 is placed along wall surface 384 or on leading edge 387 of door 382. Sensor 12 detects the presence of an object extending through door opening 386 that is adjacent to the sensor and/or is touching the sensor in order to enable controller 14 to prevent door 382 from pinching the object as the door swings shut.

Figure 40:
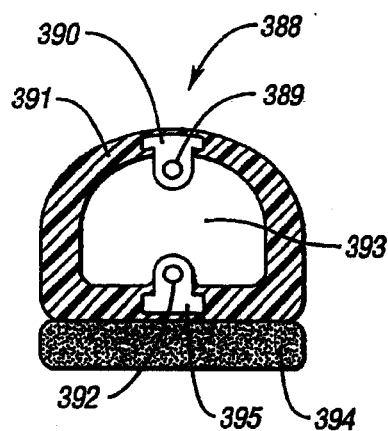
FIG. 40 illustrates a cross-sectional view of an eleventh embodiment of the sensor of the anti-entrapment system taken along the line 40-40 of FIG. 41.
Figure 41:
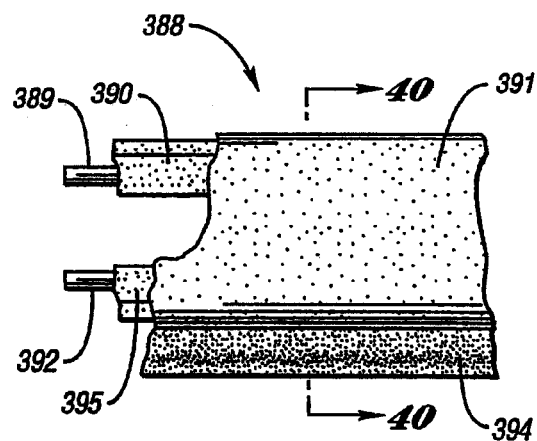
FIG. 41 illustrates a profile view of the sensor shown in FIG. 40.

Referring now to FIGS. 40 and 41, a sensor 388 in accordance with an eleventh sensor embodiment is shown. In general, sensor 388 is a contact type sensor with external over travel capability to prevent high forces. When pressure is applied to a non-conductive elastomer outer jacket 391, a first conductive wire 389, sheathed inside a first conductive elastomer carrier 390, moves toward a second conductive wire 392, sheathed inside a second conductive elastomer carrier 395. A portion of elastomer outer jacket 391 is positioned on an elastomer material 394.

To achieve low force requirements and allow switch movement with electrical contact, an air space 393 is positioned between sheathed first and second conductive wires 389 and 392. After sheathed conductive wires 389 and 392 make contact signaling an obstruction to controller 14, elastomer material 394 is allowed to compress, thus providing an over-travel feature to prevent system inertia from the closure apparatus causing high forces against an obstruction. To this end, elastomer material 394 is a foam or any elastomer material formulated with a slightly higher compression force compared to the compression force to change air space 393 between sheathed conductive wires 389 and 392.

Figure 42:
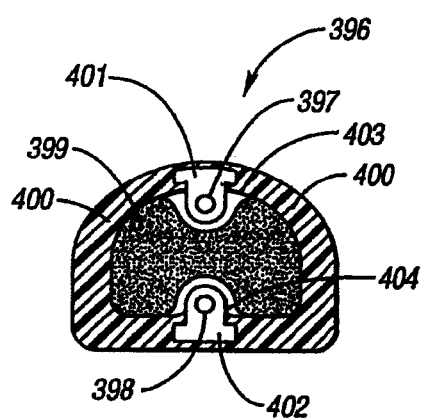
FIG. 42 illustrates a cross-sectional view of a $12^{th}$ embodiment of the sensor of the anti-entrapment system taken along the line 42-42 of FIG. 43.
Figure 43:
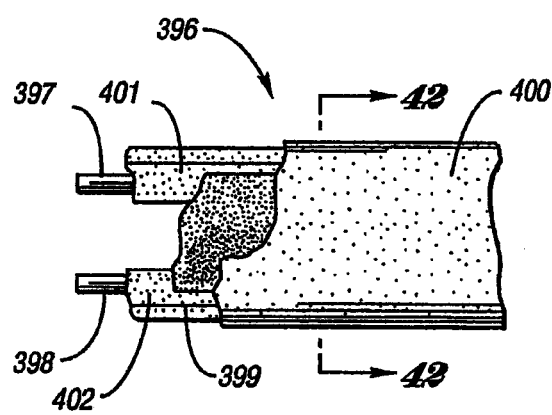
FIG. 43 illustrates a profile view of the sensor shown in FIG. 42.

Referring now to FIGS. 42 and 43, a sensor 396 in accordance with a $12^{th}$ sensor embodiment is shown. In general, sensor 396 is a contact type sensor with internal over travel capability to prevent high forces. When pressure is applied to a non-conductive elastomer outer jacket 400, a first conductive wire 397, sheathed inside a first conductive elastomer carrier 401, begins to move toward a second conductive wire 398, which is sheathed inside a second conductive elastomer carrier 402. A conductive elastomer material 399 is positioned between sheathed conductive wires 397 and 398. Conductive elastomer material 399 can be foam or any elastomer material formulated to allow for low force. Air spaces 403 and 404 are positioned between sheathed conductive wires 397 and 398 and conductive elastomer material 399.

Air spaces 403 and 404 change as pressure is applied to or removed from non-conductive elastomer outer jacket 400. When pressure applied to non-conductive elastomer outer jacket 400 moves sheathed conductive wires 397 and 398 to completely close air spaces 403 and 404, electrical contact is made with conductive elastomer material 399, thereby completing an electrical circuit and signaling an obstruction to controller 14. After switch contact has been made, conductive elastomer material 399 can continue to compress, thus providing an over-travel feature to prevent system inertia from the closure apparatus causing high forces against an obstruction.

Figure 44:
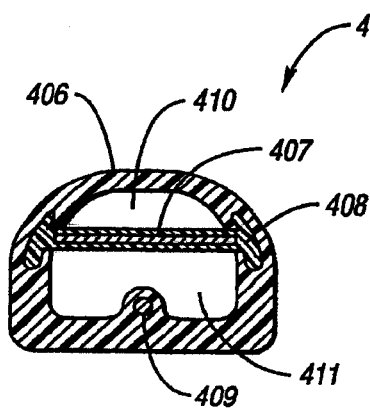
FIG. 44 illustrates a cross-sectional view of a $13^{th}$ embodiment of the sensor of the anti-entrapment system taken along the line 44-44 of FIG. 45.
Figure 45:
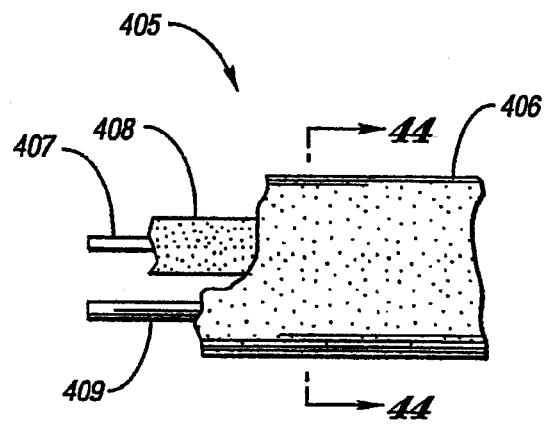
FIG. 45 illustrates a profile view of the sensor shown in FIG. 44.

Referring now to FIGS. 44 and 45, a sensor 405 in accordance with a $13^{th}$ sensor embodiment is shown. In general, sensor 405 is a combination proximity/displacement sensor with an internal fabric conductive element that can also be used as a heating element and temperature sensor. When pressure is applied to a conductive elastomer outer jacket 406, spaces 410 and 411 compress to move the conductive elastomer outer jacket toward a conductive fabric 407 which is sheathed inside a non-conductive elastomer carrier 408. To this end, spaces 410 and 411 can be air, foam, or any dielectric material formulated to allow for low force.

A conductive wire 409 is used to make an electrical connection for conductive elastomer outer jacket 406. Sensor 405 registers a change in capacitance whenever the distance between conductive fabric 407 and conductive elastomer outer jacket 406 changes as a result of an object touching the outer jacket and/or as a result of an electrically conductive object coming into proximity with the outer jacket. The change in capacitance is signaled to controller 14.

Conductive fabric 407 may be used as a heating element when the anti-pinch strip system is inactive. The heating element function can be used to heat sensor 405, which may be being used as a weather seal, keeping conductive elastomer carrier 408 and dielectric spaces 410 and 411 pliable in cold weather conditions. It is a goal to have the weather seal properties maintained to application compliance standards while heated. Additionally, the heated weather seal could be used to prevent the window or sliding panel from freezing and/or to aid in thawing a frozen window or sliding panel while in the closed position. Conductive fabric 407 would be engaged as a heating element when powered by relays turned on by controller 14 with inputs from a temperature sensor, which could be from the vehicle outside temperature sensor. The temperature input could also originate from a separate temperature sensor located on a device inside the vehicle door, or anywhere else outside the vehicle.

The temperature setting to turn on conductive fabric 407 heating element is optional, but would likely be set for temperatures at or below 40° F. where cold weather pliability is required. When the set temperature is reached, controller 14 will turn conductive fabric 407 heater element on to make the weather seal pliable. The circuit in controller 14 can also be configured to automatically cycle conductive fabric 407 heater element on and off after the desired pliability is achieved to thereafter maintain pliability.

By using relays or transistors the heater element 407 can be powered such that an appropriate amount of current flows through the element. The current flow through the resistive element will produce the required amount of heat following the well known equation Power (Watts)=$I^2 \times R$. The power can be applied for a given amount of time and then removed. During the time power is removed, the heating element 407 can be connected to a circuit that provides a small amount of current flow through the element and through a series connected resistor.

Heating element 407 and the series connected resistor form a voltage divider. The voltage that is developed can then be interpreted by a microprocessor, or other device such as an op-amp, to determine the temperature of heating element 407. If the temperature is below a determined set-point, heating element 407 can again be connected such that power is applied to it increasing the amount of heat generated. After the temperature sensor determines that the temperature is above the set point, controller 14 will turn off the relays or transistors providing power to conductive fabric 407 heater element.

Alternatively, controller 14 can be configured to inhibit a user input command to open a window or sliding panel when, anytime during the time of heating conductive fabric 407, no window or panel movement is sensed, indicating a stalled motor condition such as may be caused by ice build up in the weather seal. During such an event, controller 14 continues to inhibit user commands to open the window or sliding panel until conductive fabric 407 heater element inside the weather seal has achieved a temperature sufficient to free the window or sliding panel. Controller 14 could be configured to recognize the above condition from temperature sensor inputs at all times, including when vehicle ignition and/or other vehicle power is off. Implementation of this function could reduce warranty costs related to the window or sliding panel drive mechanism, seals, and motor.

Alternatively, conductive fabric 407 could be used as a heating element inside a weather seal not using an anti-pinch strip system. In this case, controller 14 is configured to only control the heating element function as described above. The controlling function could also be integrated as part of other electronics being employed within the application system.

Alternatively, conductive fabric 407 could be used as a temperature sensor, either as a stand-alone sensor, or in combination with the anti-pinch system. The function to switch between temperature sensing and anti-pinch sensing would be configured through controller 14. The temperature sensing function of conductive fabric 407 could be used to provide the same temperature inputs required to operate the anti-pinch system as described above.

Referring now to FIGS. 46 and 47, a sensor 412 in accordance with a 14$^{th}$ sensor embodiment is shown. In general, sensor 412 is a combination proximity/displacement sensor with conductive fabric attached to an outside profile. The conductive fabric can be used as a heating element and temperature sensor. When pressure is applied to a non-conductive elastomer outer jacket 413, a space 417, compresses to move a first conductive fabric 414, attached externally to non-conductive outer jacket 413 and covered with flexible non-conductive flocking material 415, towards a second conductive fabric 416. To this end, space 417 is air, foam, or any dielectric material formulated to allow for low force.

Sensor 412 registers a change in capacitance whenever the distance between first conductive fabric 414 and second conductive fabric 416 changes as a result of an object touching non-conductive flocking material covering 415 and/or as a result of an electrically conductive object coming into proximity with first conductive fabric 414. The change in capacitance is signaled to controller 14.

Conductive fabric 414 may be used as a heating element when the anti-pinch strip system is inactive. The heating element function can be used to heat sensor 412, which may be being used as a weather seal, keeping elastomer outer jacket 413, non-conductive flocking material 415, and dielectric space 417 pliable in cold weather conditions. It is a goal to have the weather seal properties maintained to application compliance standards while heated. Additionally, the heated weather seal could be used to prevent the window or sliding panel from freezing and/or to aid in thawing a frozen window or sliding panel while in the closed position. Conductive fabric 414 would be engaged as a heating element when powered by relays turned on by controller 14 with inputs from a temperature sensor, which could be from the vehicle outside temperature sensor. The temperature input could also originate from a separate temperature sensor located on a device inside the vehicle door, or anywhere else outside the vehicle.

The temperature setting to turn on conductive fabric 414 heating element is optional, but would likely be set for temperatures at or below 40° F. where cold weather pliability is required. When the set temperature is reached, controller 14 turns conductive fabric 414 heater element on to make the weather seal pliable. The circuit in controller 14 can also be configured to automatically cycle the conductive fabric 414 heater element on and off after the desired pliability is achieved to thereafter maintain pliability. By using relays or transistors the heater element can be powered such that an appropriate amount of current flows through the element. The current flow through the resistive element will produce the required amount of heat following the well known equation Power (Watts)=$I^2 \times R$. The power can be applied for a given amount of time and then removed. During the time power is removed, the heating element can be connected to a circuit that provides a small amount of current flow through the element and through a series connected resistor.

Heating element 414 and the series connected resistor form a voltage divider. The voltage that is developed can then be interpreted by a microprocessor, or other device such as an op-amp, to determine the temperature of the heating element. If the temperature is below a determined set-point, heating element 414 can again be connected such that power is applied to it increasing the amount of heat generated. After the temperature sensor determines that the temperature is above the set point, controller 14 turns off the relays providing power to conductive fabric 414 heater element.

Alternatively, controller 14 can be configured to inhibit a user input command to open a window or sliding panel when, anytime during the time of heating conductive fabric 414, no window or panel movement is sensed, indicating a stalled motor condition such as may be caused by ice build up in the weather seal. During such an event, controller 14 continues to inhibit user commands to open the window or sliding panel until conductive fabric 414 heater element inside the weather seal has achieved a temperature sufficient to free the window or sliding panel. Controller 14 could be configured to recognize the above condition from temperature sensor inputs at all times, including when vehicle ignition and/or other vehicle power is off. Implementation of this function could reduce warranty costs related to the window or sliding panel drive mechanism, seals, and motor.

Alternatively, conductive fabric 414 could be used as a heating element inside a weather seal not using an anti-pinch strip system. In this case, controller 14 is configured to only control the heating element function as described above. The controlling function could also be integrated as part of other electronics being employed within the application system.

Alternatively, conductive fabric 414 could be used as a temperature sensor, either as a stand alone sensor, or in combination with the anti-pinch system. The function to switch between temperature sensing and anti-pinch sensing would be configured through controller 14. The temperature sensing function of conductive fabric 414 could be used to provide the same temperature inputs required to operate the anti-pinch system as described above.

Referring now to FIGS. 48 and 49, a sensor 418 in accordance with a 15$^{th}$ sensor embodiment is shown. In general, sensor 418 is a combination proximity/displacement sensor with conductive fabric attached to an inside profile. The conductive fabric can be used as a heating element and temperature sensor. When pressure is applied to a non-conductive elastomer outer jacket 419, which can be covered with flexible non-conductive flocking material 421, space 423, compresses to move a first conductive fabric 420, attached internally to a non-conductive outer jacket 413, towards a second conductive fabric 422. To this end, space 423 can be air, foam, or any dielectric material formulated to allow for low force.

Sensor 418 registers a change in capacitance whenever the distance between first conductive fabric 420 and second conductive fabric 422 changes as a result of an object touching non-conductive flocking material covering 421 and/or as a result of an electrically conductive object coming into proximity with first conductive fabric 420. The change in capacitance is signaled to controller 14.

Conductive fabric 420 may be used as a heating element when the anti-pinch strip system is inactive. The heating element function can be used to heat sensor 418, which may be being used as a weather seal, keeping elastomer outer jacket 419, non-conductive flocking material 421, and dielectric space 423 pliable in cold weather conditions. It is a goal to have the weather seal properties maintained to application compliance standards while heated. Additionally, the heated weather seal could be used to prevent the window or sliding panel from freezing and/or to aid in thawing a frozen window or sliding panel while in the closed position. Conductive fabric 420 would be engaged as a heating element when powered by relays turned on by controller 14 with inputs from a temperature sensor, which could be from the vehicle outside temperature sensor. The temperature input could also originate from a separate temperature sensor located on a device inside the vehicle door, or anywhere else outside the vehicle.

The temperature setting to turn on the conductive fabric 420 heating element is optional, but would likely be set for temperatures at or below 40° F. where cold weather pliability is required. When the set temperature is reached, controller 14 turns conductive fabric 420 heater element on to make the weather seal pliable. The circuit in controller 14 can also be configured to automatically cycle the conductive fabric 420 heater element on and off after the desired pliability is achieved to thereafter maintain pliability. By using relays or transistors the heater element can be powered such that an appropriate amount of current flows through the element. The current flow through the resistive element will produce the required amount of heat following the well known equation Power (Watts)=$I^2 \times R$. The power can be applied for a given amount of time and then removed. During the time power is removed, the heating element can be connected to a circuit that provides a small amount of current flow through the element and through a series connected resistor.

The heating element 420 and the series connected resistor form a voltage divider. The voltage that is developed can then be interpreted by a microprocessor, or other device such as an op-amp, to determine the temperature of the heating element. If the temperature is below a determined set-point, heating element 420 can again be connected such that power is applied to it increasing the amount of heat generated. After the temperature sensor determines that the temperature is above the set point, controller 14 turns off the relays providing power to conductive fabric 420 heater element.

Alternatively, controller 14 can be configured to inhibit a user input command to open a window or sliding panel when, anytime during the time of heating conductive fabric 420, no window or panel movement is sensed, indicating a stalled motor condition such as may be caused by ice build up in the weather seal. During such an event, controller 14 continues to inhibit user commands to open the window or sliding panel until conductive fabric 420 heater element inside the weather seal has achieved a temperature sufficient to free the window or sliding panel. Controller 14 could be configured to recognize the above condition from temperature sensor inputs at all times, including when vehicle ignition and/or other vehicle power is off. Implementation of this function could reduce warranty costs related to the window or sliding panel drive mechanism, seals, and motor.

Alternatively, conductive fabric 420 could be used as a heating element inside a weather seal not using an anti-pinch strip system. In this case, controller 14 is configured to only control the heating element function as described above. The controlling function could also be integrated as part of other electronics being employed within the application system.

Alternatively, conductive fabric 420 could be used as a temperature sensor, either as a stand alone sensor, or in combination with the anti-pinch system. The function to switch between temperature sensing and anti-pinch sensing would be configured through controller 14. The temperature sensing function of conductive fabric 420 could be used to provide the same temperature inputs required to operate the anti-pinch system as described above.

Referring now to FIGS. 50 and 51, a sensor 424 in accordance with a 16th sensor embodiment is shown. In general, sensor 424 includes a conductive fabric attached to an outside profile for use as heating element and temperature sensor. Sensor 424 further uses a conductive fabric inside the profile for use as a proximity/displacement sensor. When pressure is applied to a non-conductive elastomer outer jacket 425, space 430, compresses to move a first conductive fabric 426, attached internally to a non-conductive outer jacket 425, towards a second conductive fabric 427. To this end, space 430 is an air, foam, or any dielectric material formulated to allow for low force.

Sensor 424 registers a change in capacitance whenever the distance between first conductive fabric 426 and second conductive fabric 427 changes as a result of an object touching non-conductive flocking material covering 429 and/or as a result of an electrically conductive object coming into proximity with first conductive fabric 426. The change in capacitance is signaled to controller 14. A conductive fabric 428, attached externally to a non-conductive elastomer outer jacket 425 and covered with a flexible non-conductive flocking material 429, is used a heating element.

The heating element function can be used to heat sensor 424, which may be being used as a weather seal, keeping elastomer outer jacket 425, non-conductive flocking material 429, and dielectric space 430 pliable in cold weather conditions. It is a goal to have the weather seal properties maintained to application compliance standards while heated. Additionally, the heated weather seal could be used to prevent the window or sliding panel from freezing and/or to aid in thawing a frozen window or sliding panel while in the closed position. Conductive fabric 428 heating element would be powered by relays turned on by controller 14, either manually or with inputs from a temperature sensor, which could be from the vehicle outside temperature sensor. The temperature input could also originate from a separate temperature sensor located on a device inside the vehicle door, or anywhere else outside the vehicle. The temperature setting to turn on conductive fabric 428 heating element is optional, but would likely be set for temperatures at or below 40° F. where cold weather pliability is required.

When the set temperature is reached, controller 14 turns conductive fabric 428 heater element on to make the weather seal pliable. The circuit in controller 14 can also be configured to automatically cycle conductive fabric 428 heater element on and off after the desired pliability is achieved to thereafter maintain pliability. By using relays or transistors the heater element can be powered such that an appropriate amount of current flows through the element. The current flow through the resistive element 428 produces the required amount of heat following the well known equation Power (Watts)=$I^2 \times R$. The power can be applied for a given amount of time and then removed. During the time power is removed, the heating element can be connected to a circuit that provides a small amount of current flow through the element and through a series connected resistor.

Heating element 428 and the series connected resistor form a voltage divider. The voltage that is developed can then be interpreted by a microprocessor, or other device such as an op-amp, to determine the temperature of heating element 428. If the temperature is below a determined set-point, heating element 428 can again be connected such that power is applied to it increasing the amount of heat generated. After the temperature sensor determines that the temperature is above the set point, controller 14 turns off the relays providing power to conductive fabric 428 heater element.

Alternatively, controller 14 can be used to inhibit a user input command to open a window or sliding panel when, anytime during the time of heating conductive fabric 428, no window or panel movement is sensed, indicating a stalled motor condition such as may be caused by ice build up in the weather seal. During such an event, controller 14 continues to inhibit user commands to open the window or sliding panel until conductive fabric 428 heater element inside the weather seal has achieved a temperature sufficient to free the window or sliding panel. Controller 14 could be configured to recognize the above condition from temperature sensor inputs at all times, including when vehicle ignition and/or other vehicle power is off. Implementation of this function could reduce warranty costs related to the window or sliding panel drive mechanism, seals, and motor.

Alternatively, conductive fabric 428 can be used as a heating element on a weather seal not using an anti-pinch strip system. In this case, controller 14 is configured to only control the heating element function as described above. The controlling function could also be integrated as part of other electronics being employed within the application system.

Alternatively, conductive fabric 428 could be used as a temperature sensor, either as a stand alone sensor, or in combination with the heating element function. The function to switch between temperature sensing and heating would be configured through controller 14. The temperature sensing function of conductive fabric 428 could be used to provide the same temperature inputs required to operate the anti-pinch system as described above.

Referring now to FIGS. 52 and 53, a sensor 431 in accordance with a 17$^{th}$ sensor embodiment is shown. In a preferred embodiment, an anti-pinch sensor strip, which could be in the form of a weather seal, is affixed to a non-moving member. In this preferred embodiment, a window or sliding panel moves toward or away from the fixed anti-pinch sensor strip. In FIGS. 52 and 53, sensor 431 is configured to be part of the window or sliding panel. In general, sensor 431 is a proximity sensor with conductive elements located on a rigid moving member. The conductive elements can also be used as heating elements.

Sensor 431 registers a change in capacitance as a result of an electrically conductive object coming into proximity with leading edge of window or sliding panel 432. The change in capacitance is signaled to controller 14. As shown in FIG. 53, a first conductive strip 433 and a second conductive strip 434, which could be composed of indium tin oxide, copper or other conductive materials, are deposited to either side of window or sliding panel 432 in close proximity to the leading edge. Conductive strips 433 and 434 continuously follow the leading edge of window or sliding panel 432 wherever pinching may occur during closure. Electrical connection between conductive strips 433 and 434 and controller 14 could be made by wire cable interface, or RF signal. In an RF configuration, battery powered electronics attached to the window or sliding panel could provide the necessary sensor information for obstruction detection and motor control.

In the case of controller 14 receiving sensor signals responsive to motor 18 or other moving members, the controller would have additional anti-entrapment capabilities by making use of motor current and/or commutator pulses and/or sensor signals from Hall (or other type) sensors. This would have the added benefit of being able to detect obstructions while the moving member and the obstruction are too far away from sensor 431 to be sensed by sensor 431, or the obstruction is a non electrically conducting member.

Alternatively, conductive strips 433 and 434 can be used as a heating element when the anti-pinch strip system is inactive. It is a to use the heated portion of the window or sliding panel to aid in keeping the weather seal properties maintained to application compliance standards while heated. Additionally, the heated leading edge of window or sliding panel 432 could be used to prevent freezing and/or to aid in thawing a frozen window or sliding panel while in the closed position. Conductive strips 433 and 434 would be engaged as a heating element when powered by relays turned on by electronic controller 14 with inputs from a temperature sensor, which could be from the vehicle outside temperature sensor. The temperature input could also originate from a separate temperature sensor located on a device inside the vehicle door, or anywhere else outside the vehicle. The temperature setting to turn on conductive strips 433 and 434 as a heating element is optional, but would likely be set for temperatures at or below 40° F. where cold weather pliability is required.

When the set temperature is reached, controller 14 turns conductive strips 433 and 434 as a heater element on to make the weather seal pliable. The circuit in controller 14 can also be configured to automatically cycle conductive strips 433 and 434 as a heater element on and off after the desired pliability of the mating weather seal is achieved to thereafter maintain pliability. By using relays or transistors the heater element can be powered such that an appropriate amount of current flows through the element. The current flow through the resistive element will produce the required amount of heat following the well known equation Power (Watts)=$I^2 \times R$. The power can be applied for a given amount of time and then removed. During the time power is removed, heating element 433 and 434 can be connected to a circuit that provides a small amount of current flow through the element and through a series connected resistor.

Heating element 433 and 434 and the series connected resistor form a voltage divider. The voltage that is developed can then be interpreted by a microprocessor, or other device such as an op-amp, to determine the temperature of the heating element. If the temperature is below a determined setpoint, the heating element can again be connected such that power is applied to it increasing the amount of heat generated. After the temperature sensor determines that the temperature is above the set point, controller 14 turns off the relays providing power to conductive strips 433 and 434 heater element. For efficiency, controller 14 could also be configured to inhibit the heater element function when the window or sliding panel is not in the closed position.

Alternatively, controller 14 can be used to inhibit a user input command to open a window or sliding panel when, anytime during the time of heating conductive strips 433 and 434, no window or panel movement is sensed, indicating a stalled motor condition such as may be caused by ice build up in the weather seal. During such an event, controller 14 continues to inhibit user commands to open the window or sliding panel until conductive strips 433 and 434 heater element has achieved a temperature sufficient to free the window or sliding panel. Controller 14 could be configured to recognize the above condition from temperature sensor inputs at all times, including when vehicle ignition and/or other vehicle power is off. Implementation of this function could reduce warranty costs related to the window or sliding panel drive mechanism, seals, and motor.

Alternatively, conductive strips 433 and 434 can be used as a heating element on a window or sliding panel not using an anti-pinch strip system. In this case, controller 14 is configured to only control the heating element function as described above. The controlling function could also be integrated as part of other electronics being employed within the application system.

Referring now to FIGS. 54 and 55, cross-sectional views of a sensor 449 and a sensor 470 in accordance with 18th and 19th sensor embodiments are respectively shown. Sensor 449 is configured with a dielectric space 452 which preferably has a thickness of 0.75 mm. First and second conductor plates (i.e., flat wires) 450, 451 sandwich dielectric space 452. Dielectric space 452 is filled with a dielectric medium 452a such as a dielectric compressible elastomer. An elastomer outer jacket 457 encases conductor plates 450, 451 and dielectric medium 452a. Elastomer outer jacket 457 has angled side walls 455. Angled side walls 455 of outer jacket 457 function as a dovetailing feature for attaching sensor 449 to an automotive window weather seal, or other such applications.

Sensor 470 is generally similar to sensor 449 but differs in that dielectric space 452 preferably has a thickness of 1.5 mm and outer jacket 457 has straight side walls. Sensor 470 is attachable by means of adhesive products, or over molding into a weather seal or other end use application.

Conductor plates 450, 451 of sensors 449 and 470 are respectively equivalent to conductors 22, 24 of sensor 12 shown in FIG. 2 and are also respectively equivalent to first and second flexible conductive metal wires 302, 304 of sensor 300 shown in FIGS. 34 and 35.

Dielectric space 452 of sensors 449 and 470, which is filled with dielectric medium 452a, maintains a predefined distance between conductor plates 450, 451. Optimally, the predefined distance is 1.5 mm such as shown in FIG. 55, but can be changed as required for a particular application. Dielectric medium 452a can have either compressible or non-compressible capabilities. Conductor plates 450, 451 are similar in function to conductors 302, 304 of sensor 300 shown in FIGS. 34 and 35 and provide pinch and proximity sensor signals 21, 23 to controller 14.

The capacitances of sensors 449, 470 changes as a result of an object in proximity to the sensor or as a result of physical contact with the sensor which causes conductor plates 450, 451 to move closer together or which otherwise alters the relative orientation of the conductor plates with respect to one another. That is, the sensor capacitance changes as conductor plates 450, 451 become closer together.

Figure 59:
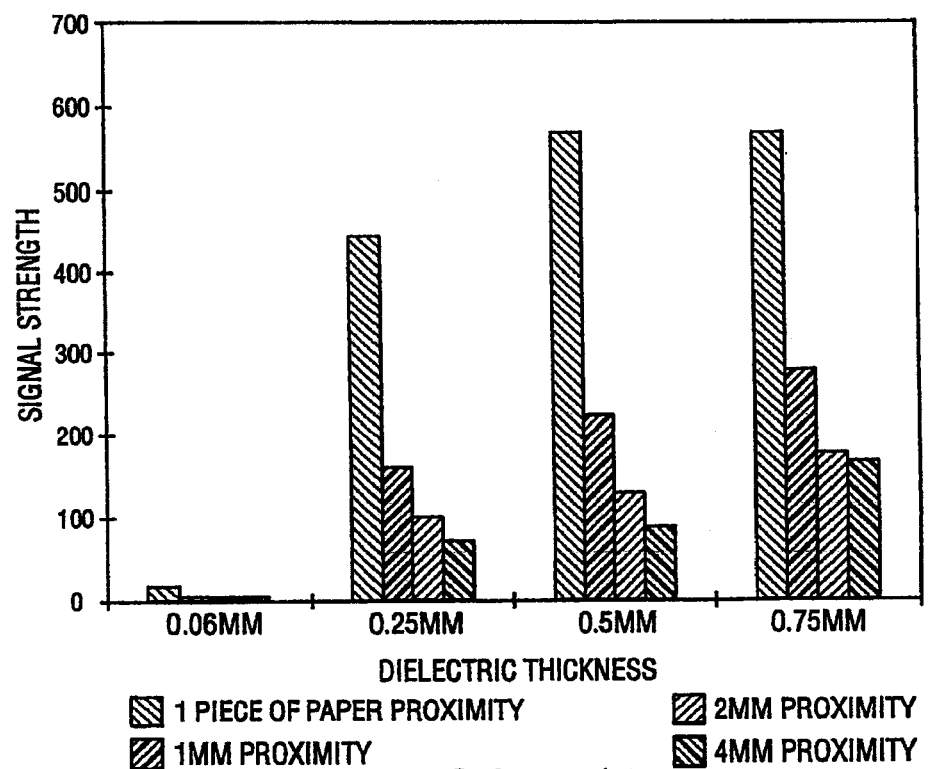
FIG. 59 illustrates a graph showing the relationship of proximity signal strength of a capacitor sensor in accordance with the present invention versus dielectric thickness for different object proximity distances to the capacitance sensor.

As shown in FIG. 59, the signal strength of sensor 449 (and sensor 470) increases as the proximity of an object to the sensor increases (i.e., as the proximity of an object to at least one of the conductor plates 450, 451 increases). Also, as conductor plates 450, 451 become longer, dielectric space 452 provided between the conductor plates is optimized to provide the maximum signal. A material thickness 456 of 0.13 mm for conductor plates 450, 451 allows cost effective manufacturing, yet is durable enough to allow repeated flexure of conductor plates 450, 451 without fatiguing or fracturing.

The preferred material for conductor plates 450, 451 is spring temper alloy 510 phosphor bronze, but could be any electrically conductive material, such as tempered steel, tin coated to prevent oxidation or a conductive film printed on a flexible substrate. Phosphor bronze also has inherent properties making it ideal for solder or other attachment of connector wires.

Sensors 449, 470 are shown in FIGS. 54 and 55 in the optimal package size to provide both proximity and pinch sensor signals. For sensing an obstruction with either pinch or proximity signals, the optimal width 453 of conductor plates 450, 451 falls within the range of 6 mm to 7 mm and preferably is either 6.35 mm or 6.7 mm.

Figure 56:
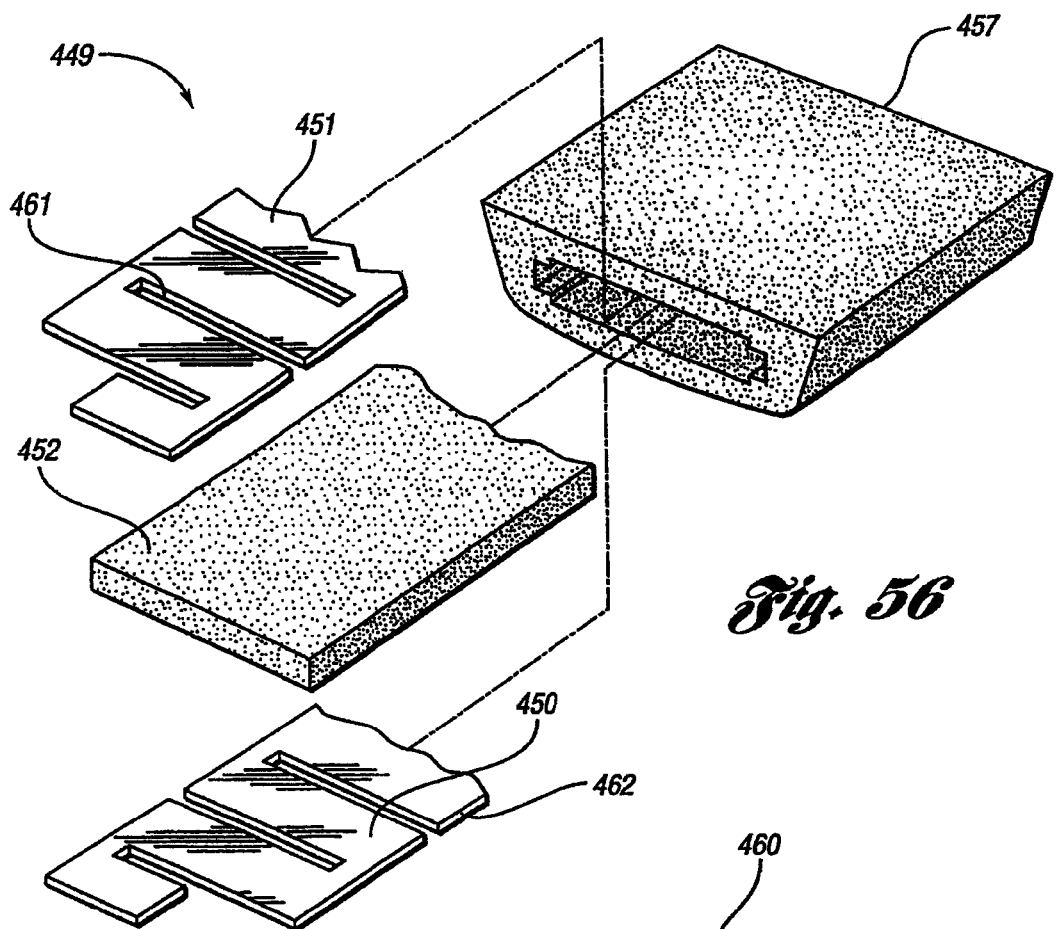
FIG. 56 illustrates a blown-up view of the sensor shown in FIG. 54.

As shown in FIG. 56, conductor plates 450, 451 of sensor 449 (and sensor 470) are constructed in a serpentine pattern with spaced slots 461. This configuration provides flexibility for conforming sensors 449, 470 to shapes that would apply a load perpendicularly to the flat planar surface of conductor plates 450, 451 in certain applications. The spaced slots 461 are preferably 0.5 mm wide and 5 mm in length, spaced 2.5 mm apart along the entire length of conductor plates 450, 451. Other slot sizes, spacings, and patterns could be used to accomplish the same flexibility purpose specific to a given application of sensors 449, 470.

Figure 58:
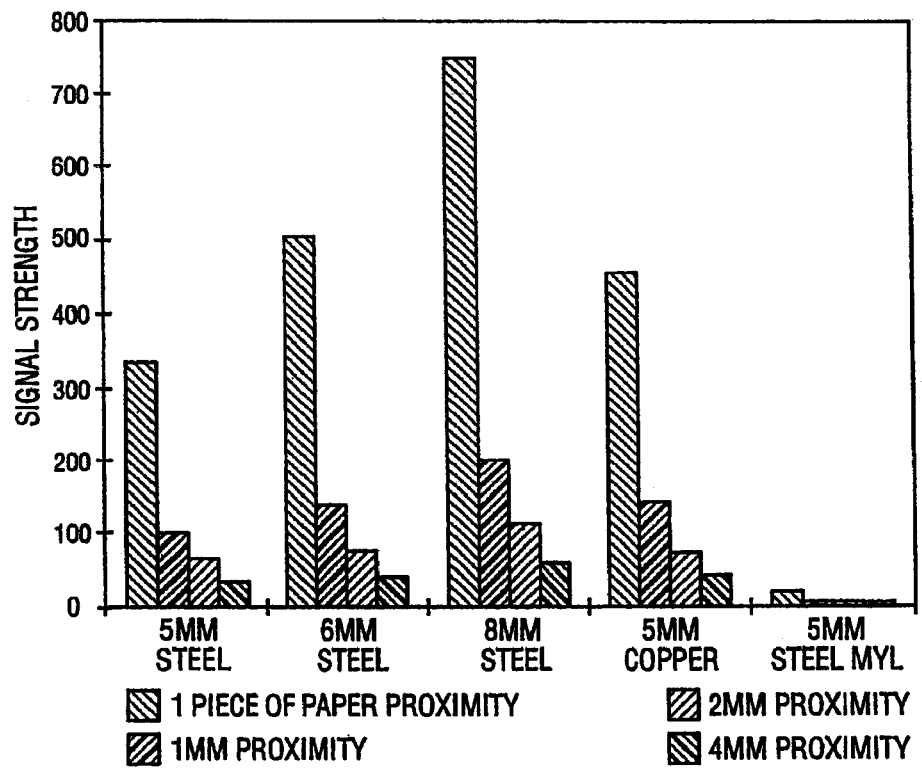
FIG. 58 illustrates a graph showing the relationship of proximity signal strength of a capacitance sensor in accordance with the present invention versus conductor plate width for different object proximity distances and different object material types.

By increasing the widths 453 of conductor plates 450, 451, a larger overall sensor can be created to allow for a greater surface area of entrapment protection. As shown in FIG. 58, testing has established that as conductor plates 450, 451 become wider, the capacitance signal strength increases. The signal strength is also affected by the material used for conductor plates 450, 451 as shown in FIG. 58.

Figure 57:
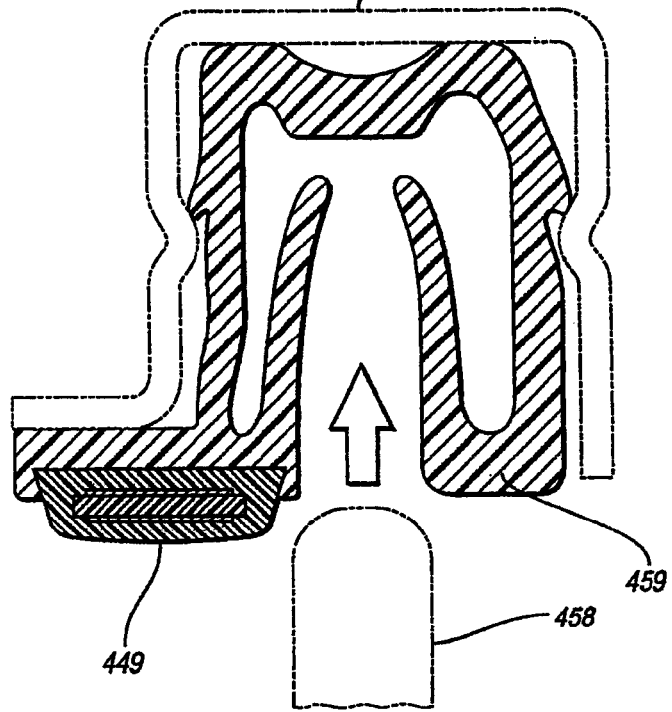
FIG. 57 illustrates a cross-sectional view of the sensor shown in FIG. 54 positioned within the weather seal of a window frame.

Sensors 449, 470 are sized for a typical automobile door window seal application, and have a minimum profile designed to not reduce viewing through the window opening. As shown in FIG. 57, sensor 449 is attached to a weather seal 459. Weather seal 459 is attached to an automobile window frame 460. Frame 460 and weather seal 459 have an opening for receiving an automobile window 458 when the window is in a fully closed position.

If a non-compressible material is used, then sensors 449, 470 provide proximity sensing only operation. If compressible material is used, then sensors 449, 470 provide both pinch and proximity sensing operations. A preferred material for dielectric medium 452a of sensors 449, 470 is an electrically non-conductive flexible polyurethane foam, such as Rogers Corporation Poron 4701-30-20062-04. Other foam materials, such as EPDM, thermoplastic rubber, thermoplastic elastomer, or TPV could also be used for dielectric medium 452a. These materials are currently used in window seals to meet the appearance and reliability requirements for window closures. Santoprene, a thermoplastic elastomer material made by Advanced Elastomer Systems, maintains stable compression characteristics over temperature, whereas EPDM compression characteristics decrease as temperature is reduced.

Stiff compression characteristics increase pinch forces. A material, which maintains flexibility and compression characteristics when cold, is preferred for pinch operation of sensors 449, 470. The material for dielectric medium 452a could be introduced by co-extrusion as any of the materials mentioned, or made by foaming the outer jacket 457 material in dielectric space 452 between conductor plates 450, 451. A foamed space 452 would be made up of the material of outer jacket 457 and air as the dielectric.

A preferred material of outer jacket 457 is a non-electrically conductive thermoplastic rubber or elastomer material, such as Santoprene. The surface resistivity of outer jacket 457 and dielectric medium 452a is to be set greater than $10^6$ ohm/cm to avoid electrical shorting potential between conductor plates 450, 451. The thickness 454 of the material of outer jacket 457 between conductor plate 450 and the sensing surface of the outer jacket contains the optimal outer jacket material thickness required to (a) completely enclose conductor plates 450, 451 and dielectric medium 452a (i.e., completely enclose sensors 449, 470) with outer jacket 457 to prevent moisture infiltration; (b) reduce the possibility of voids; and (c) keep the dimension between conductor plates 450, 451 at a useful spacing to provide useful proximity mode detection and sensitivity.

As previously described, in the test results shown in FIG. 58, for the range of distances shown, as outer jacket thickness 454 increases the proximity detection capability of controller 14 is reduced. As width 453 of conductor plates 450, 451 increases, the discrimination ability of sensors 449, 470 improves as less amplification of the signal is required. This provides more stability and greater sensing distances between object 16 and sensors 449, 470.

Figure 60:
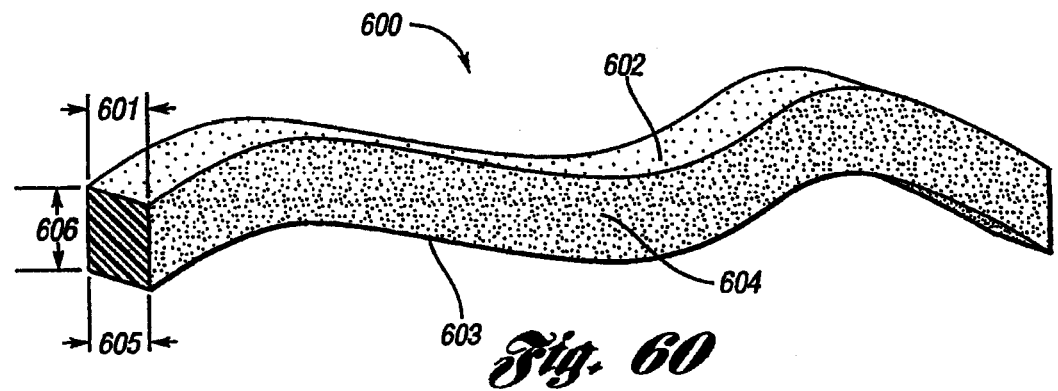
FIG. 60 illustrates a preferred embodiment of the capacitance sensor of the anti-entrapment system.

Referring now to FIG. 60, a perspective view of a capacitance sensor 600 in accordance with a preferred embodiment is shown. Sensor 600 includes a top flexible conductor 602, a compressible dielectric or air filled volume 604, and a bottom flexible conductor 603. Top and bottom conductors 602, 603 have a generally thin ribbon form factor. Dielectric volume 604 is generally in a strip form factor interposed between conductors 602, 603 and separates the conductors by a distance 606. Distance 606 may be constant or may vary along the length of sensor 600. Conductor ribbons 602, 603 have respective widths 601, 605. Widths 601, 605 may be constant or may vary along the length of sensor 600. Sensor 600 itself can be bent in directions transverse to its longitudinal axis or be twisted around its longitudinal axis. As will now be described below, sensor 600 will behave approximately as a parallel plate capacitor.

Figure 61A:
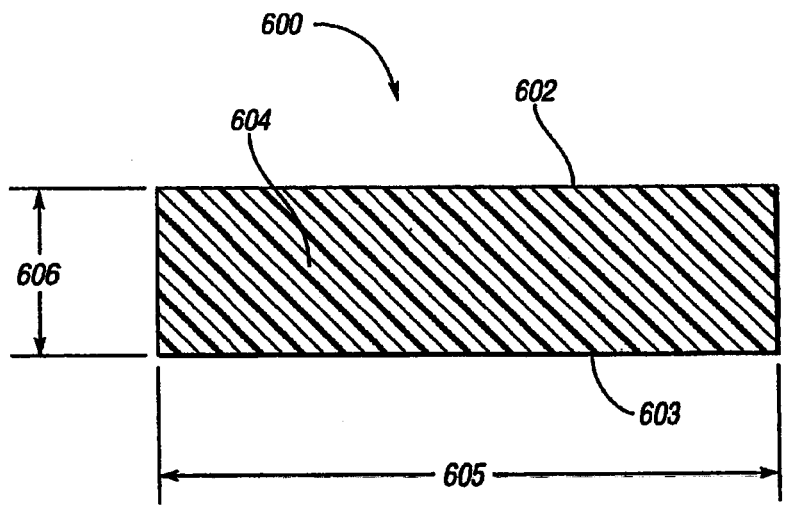
FIGS. 61a and 61b illustrate views of the capacitance sensor shown in FIG. 60 behaving as a parallel plate capacitor.
Figure 61B:
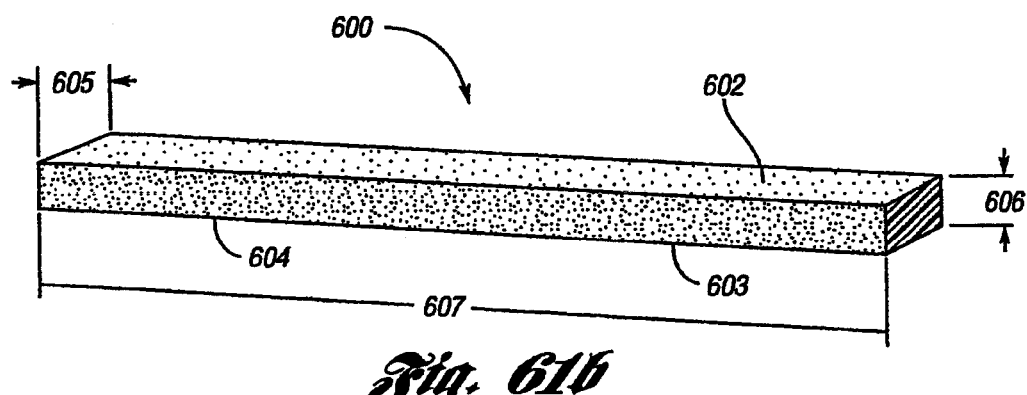

Referring now to FIGS. 61a and 61b, with continual reference to FIG. 60, sensor 600 behaving as a parallel plate capacitor is shown. FIGS. 61a and 61b respectively illustrate a cross-sectional view of sensor 600 and an angled side view of the sensor behaving as a parallel plate capacitor.

Like sensor 600, a parallel plate capacitor includes two conductive plates 602, 603 separated by a volume 604 which is filled with either space or a dielectric medium having permittivity $\in$. As long as the ratio of sensor width 605 (denoted as "w") to sensor height 606 (denoted as "h") (i.e., width to height ratio=w/h) and the ratio of sensor length 607 (denoted as "L") to sensor height 606 (i.e., length to height ratio=L/h) are both five or larger, then fringe effects can be largely ignored. The capacitance "C" of sensor 600 is then approximately:

$$C = (\in * w * L)/h \quad (1)$$

The charge "Q" that sensor 600 can hold when a voltage "V" is applied is then approximately:

$$Q = C * V \quad (2)$$

From expressions (1) and (2) it follows that capacitance (C) and the charge (Q) on sensor 600 varies directly with its width (w), length (L) and permittivity ($\in$) and varies inversely with its height (h). As a result, any phenomenon that changes one of these parameters will result in sensor 600 physically changing as well as the charge (Q) that the sensor can hold. Upon either one of the ratios (w/h) or (L/h) dropping below five, then fringe effects begin to become a factor as well.

For h and w dimensions on the order of 10 mm or less, aspect ratios of ¼ to ½ and permittivities up to seven times that of free space (i.e., $\in \leq 7\in_0$), the capacitance (C) of sensor 600 is approximately:

$$C = (w*L)*[((a*\in_0)+\in)/h] \quad (3)$$

where $a = 1.071*(w/h)^{-0.875}$

It is noted that expression (3) was semi-empirically derived using basic electrostatic theory in conjunction with selected finite element analysis. For the parameter ranges given, the expression (3) predicts capacitance to within 2% of those obtained from finite element analysis.

Referring now to FIGS. 62a and 62b, with continual reference to FIGS. 60, 61a, and 61b, sensor 600 operating in different sensing modes is shown. Sensor 600 has at least three sensing modes available for sensing entrapment when the sensor is located within or adjacent to an opening that is being closed by a hinged or sliding panel or by a contracting iris and the like.

As shown in FIG. 62a, in a first sensing mode a conductive object 608 is capacitively coupled to ground and comes into close proximity with sensor 600. If top conductive plate 602 is set at a non-zero voltage with respect to bottom conductive plate 603 when the bottom conductive plate is grounded, then conductive object 608 will in-turn capacitively couple to sensor 600 when the object comes within sufficient proximity to the sensor. The result is that the capacitively grounded conductive object 608 will appear as another capacitance to ground in parallel with sensor 600. This will make sensor 600 appear to have a larger capacitance. If conductive object 608 is conductively grounded, then sensor 600 will appear to have a larger capacitance as the object approaches and capacitively couples to the sensor as long as the object does not make conductive contact with top conductive plate 602.

FIG. 63 illustrates an equivalent circuit for the sensor arrangement shown in FIG. 62A. In FIG. 63, the capacitance of object 608 with respect to ground is given by "Co", the coupling capacitance between the object and sensor 600 is given by "Cc", and the capacitance of the sensor is given by "Cs". Top conductor 602 of sensor 600 is tied to V+ and bottom conductor 603 is tied to ground.

Applying circuit laws to this equivalent circuit as follows:

$$C_{apparent} = Cs + [(1)/[(1/Cc)+(1/Co)]] \quad (4)$$

simplify $=[(Cs*Co)+(Cs*Cc)+(Cc*Co)]/[(Co+Cc)]$
then $C_{apparent} = 240$ pF (when Cs=200 pF, Cc=50 pF, Co=200 pF).

As such, a 200 pF sensor coupled to an object with a 200 pF capacitive coupling to ground via a 50 pF coupling capacitance results in an apparent sensor capacitance of 240 pF. This shows that the capacitance of sensor 600 appears to increase when a capacitively or conductively grounded object comes close enough to the sensor to capacitively couple to the sensor. In the case of a conductively grounded conductive object the capacitance Co of the object is replaced by a resistance. Then as long as the voltage of sensor 600 is allowed to settle for longer than the time constant of the coupling capacitor and the object resistance, the affect will be to increase the apparent capacitance of sensor 600 by Cc.

As shown in FIG. 62b, in another sensing mode a non-conductive object 608 is seen to impinge on sensor 600 sufficiently to cause compression of dielectric 604. The compression of dielectric 604 results in a decrease in height 606 between top and bottom conductors 602, 603 in the region of non-conductive object 608. From simple electrostatic theory, in the arrangement shown in FIG. 62b, sensor 600 could be considered as three smaller capacitors connected in parallel and segmented as shown by segment boundaries 609.

In this way, the region with compression could be treated as a separate capacitor connected in parallel to capacitors formed by the uncompressed regions to either side of the compressed region. Referring to the expression (3), a decrease in h in the compressed region increases the capacitance in that region of sensor 600 resulting in an overall increase in capacitance in the sensor. Ignoring fringe effects, a sensor 600 having a length of 1.4 m length, a width of 6 mm, a height of 1.6 mm, and a permittivity $\in = 3\in_0$ will have a capacitance of 131 pF. If a 2 cm long region is then uniformly compressed to a thickness of 0.25 mm, then the capacitance of this sensor will increase to 142 pF.

Still referring to FIG. 62b, if non-conductive object 608 makes contact with sensor 600 in such a manner as to change the conductance of the sensor or the permittivity of the sensor, the capacitance of the sensor then changes according to the expression (3). Among other possibilities, non-conductive object 608 could modify conductance or permittivity through applying pressure, heat, or a magnetic field.

All three of these sensing modes can be employed with sensor 600 in its construction shown in FIG. 60. However, depending on the degree of bending and twisting in sensor 600, the capacitance of the sensor can be expected to depart to some degree from that predicted by the expression (3).

As described with reference to FIG. 60, the basic elements of capacitive sensor 600 in accordance with a preferred embodiment include a flexible top conductor 602, a bottom conductor 603, and a non-conductive dielectric or air-filled volume 604 interposed between the two conductors. Top and bottom conductors 602, 603 are generally in a thin ribbon form factor and dielectric volume 604 is generally in a strip form factor interposed between the two conductors. Dielectric volume 604 separates the two conductors 602, 603 by a distance 606 which could vary along the length of the sensor. Conductor ribbons 602, 603 have respective widths 605, 606 that could also vary along the length of sensor 600. To facilitate installation adjacent to or in the closure region of a closing mechanism such as a door or window, sensor 600 itself can be bent in directions transverse to its longitudinal axis or be twisted around its longitudinal axis. Subsequent to mounting, the response of sensor 600 to imposed variations in width, height, length, and permittivity will approximate the response to the imposed variations that would be seen in a similarly sized parallel plate capacitor.

As long as the ratio of width 605 to height 606 and the ratio of length 607 to height are both at least five, bending radii are large with respect to the height, and the length and the amount of twisting is small in lengths along sensor 600 comparable to the width or the height, then fringe effects can be largely ignored and the capacitance (C) will be approximately given by the expression (1):

$$C = (\epsilon * w * L)/h \quad (1)$$

The charge (Q) that sensor 600 can hold when a voltage is applied is then given by the expression (2):

$$Q = C * v \quad (2)$$

From the expressions (1) and (2), it follows that the capacitance (C) and the charge (Q) on sensor 600 (see FIGS. 61*a*, 61*b*) will vary directly with the width, length, permittivity of the sensor and will vary inversely with the height of the capacitor. As a result, any phenomenon that changes one of these parameters will result in sensor 600 changing and will result in the charge (Q) that the sensor can hold changing as well. Upon either of the two ratios (w/h) or (L/h) dropping below five, then fringe effects begin to become a factor as well. For height and width dimension on the order of 10 mm or less, aspect ratios of ¼ to ½, and permittivities up to seven times that of free space (i.e., $\epsilon \leq 7\epsilon_0$), the capacitance (C) of sensor 600 is approximately given by expression (3):

$$C = (w*L) * [((a*\epsilon_0) + \epsilon)/h] \quad (3)$$

where $a = 1.071 * (w/h)^{-0.875}$

Again, it is noted that expression (3) was semi-empirically derived using basic electrostatic theory in conjunction with selected finite element analysis. For the parameter ranges given, the expression (3) predicts capacitance to within 2% of those obtained from finite element analysis. For short radius bending of sensor 600 or for extreme twisting of the sensor about its longitudinal axis, significant departure from the absolute predictions of the expression (3) can be expected. However, the proportional response to changes in height (h), width (w), and length (L) can still be expected to generally follow that indicated by the expression (3) once a set of bends or twists have been made in accomplishing a sensor installation provided that the sensor does not undergo further twists or bends.

Changes in capacitance (C) due to twisting or bending of sensor 600 in response to the touch of an object 608 can be used to sense the presence of the object. However, the specific response that can be expected can be more difficult to determine theoretically and in a practical application would preferably be determined empirically on an "application by application" basis.

Thus, as described, sensor 600 has at least three available sensing modes. These three available sensing modes are: (i) proximity sensing of conductive objects 608, (ii) contact sensing of an object whose contact causes compression of sensor 600 thereby reducing the height in at least one region along the sensor, and (iii) contact sensing of an object 608 that causes changes in conductivity or permittivity in at least one region along the sensor. A fourth sensing mode as described above arises from contact sensing of an object 608 that causes bending or twisting of sensor 600.

Summarizing contact sensing, any contact with sensor 600 that causes deformation of the sensor or a change in its dielectric or conductive properties may result in a detectable change in the sensor signal output that can be used as an indication of contact with an object 608. That indication or the indication from a proximity detection of a conductive object 608 can then be provided to a controller for the closing device (such as a window) so that the controller can alter operation of the closing device so as to prevent or reverse an entrapment of the object.

Referring now to FIG. 64, a useful variation of sensor 600 is shown. In this variation, top and/or bottom conductors 602, 603 of sensor 600 is a metallic strip formed into a serpentine pattern. This allows sensor 600 to be subjected to greater degrees of bending and twisting at installation with a smaller effect on the capacitance of the sensor than is seen with the sensor constructed with a solid metallic ribbon of comparable thickness and material. This arises from the fact that the serpentine pattern generally has a lower width to bend radius ratio for bends and twists than will a sensor with a solid strip conductor for comparable bends and twists. As a result, for bends and twists at installation, the serpentine pattern results in less compression and deformation of dielectric volume 604 between conductors 602, 603 than is seen when solid strip conductors are used. A further advantage arises in that with less deformation of dielectric volume 604 between conductors 602, 603, the mechanical stiffness will be reduced allowing sensor 600 to remain more deformable and therefore more sensitive in response to the touch of an object that comes into contact with the sensor.

In an alternative approach, thin conductive films can be applied directly to the top and bottom of dielectric volume 604 between conductors 602, 603. For instance, dielectric volume 604 could be filled with closed cell foam and conductors 602, 603 could be a conductive paint or conductive film plated or adhered to the top and/or bottom of the closed cell foam. For instance, at least one of conductors 602, 603 includes a dopant added to a portion of dielectric volume 604 so as to form a conductive region on the dielectric volume. This offers the advantage of lowering part count and simplifying assembly of sensor 600. It also enhances the deformability of sensor 600 if a soft foam is used while otherwise maintaining the relative orientations of conductors 602, 603 with respect to each other.

Referring now to FIGS. 65*a*, 65*b*, and 65*c*, a further variation of sensor 600 is shown. In FIGS. 65*a* and 65*b*, top conductor 602 is seen to be narrower than bottom conductor 603. Further, top conductor 602 is taken to a non-zero potential (V+) and lower conductor 603 is grounded. This contrasts to the nominal configuration shown in FIG. 65c where top and bottom conductors 602, 603 have comparable widths.

Contrasting the two configurations of FIGS. 65a and 65c, a capacitively grounded conductive object 608 coming in proximity to the side of 600 sensor, but not passing directly overhead of the sensor, induces a smaller proportionate change in apparent capacitance in the sensor for the configuration of FIG. 65a than that for the configuration of FIG. 65c. That is, the configuration of FIG. 65a has a more directional response. This is due to the fact that the wider grounded conductor 603 operates in part as a partial shield with respect to objects laterally displaced from sensor 600. This can offer a significant advantage in cases where proximity sensing is desirable only when a conductive object 608 is directly over as opposed to diagonally overhead sensor 600. A further advantage is that the configuration of FIG. 65a is less responsive than that of the configuration of FIG. 65c for capacitively grounded objects directly to the side of or below sensor 600. If on the other hand, a less directional response than that of the configuration of FIG. 65a or 65c is desired, top conductor 602 can be made wider than bottom conductor 603 resulting in an enhanced response to objects that are not directly above sensor 600 where it would tend to be maximally sensitive anyway.

A further enhancement in operating modes can be realized in configurations of either FIG. 65a or 65c by actively interchanging the roles of top and bottom conductors 602, 603 in terms of how voltage potential and ground are applied to sensor 600. In the case where it would be desirable to distinguish between whether or not object detection has occurred via proximity sensing vs. contact sensing, the electrical polarity to sensor 600 could be reversed resulting in top conductor 602 becoming ground and lower conductor 603 becoming V+, resulting in the sensor then having a smaller response to capacitively grounded conductive objects 608 directly or diagonally above it. Whereas for a contact sensed object, little or no change in sensor response could be expected assuming there is no significant change in capacitive coupling to structures to which sensor 600 is mounted.

An additional enhancement is possible in cases where there would be significant capacitive coupling to underlying structures upon which sensor 600 is mounted. In this enhanced configuration a third conductor (i.e., a third conductive layer) is interposed between the structure to which the sensor is mounted and sensor 600. A first insulating layer or gap is interposed between the structure and the third conductive layer. A second insulating layer or gap is interposed between the third conductive layer and the conductor (602 or 603) which is closest to the structure. This third conductive layer is grounded for normal operation to shield sensor 600 from coupling to the structure and is then taken to V+ if sensor polarity is reversed so as to act as a "driven shield" to prevent capacitive coupling to the structure at reversed polarity.

Referring now to FIG. 66, a further variation of sensor 600 is shown. In the enhancement top or bottom conductor 602, 603 is segmented (top conductor 602 is segmented in FIG. 66). Non-conductive dielectric of air filled volume element 604 may or may not be segmented as well. In this enhancement the segmented top conductor 602 has means to apply voltage to each top conductor segment and means to obtain the signal due to the capacitance of each top conductor segment independently. With this configuration the number and/or pattern of elements indicating the presence of an obstruction can be used to give an indication of the size of the obstruction and/or the force applied to it during contact sensing. In the case where all elements simultaneously indicate an obstruction, this could be used as an indicator of device closure without obstruction in the closing device to which sensor 600 is mounted where objects likely to be trapped are not sufficiently large or shaped so as to engage all sensor elements simultaneously.

Figure 68:
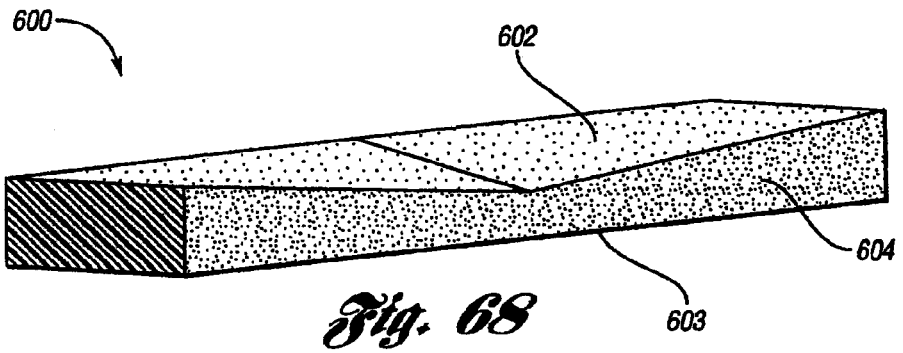
FIG. 68 illustrates a variation of the sensor embodiment variation shown in FIG. 67.

Referring now to FIG. 67, a further variation of sensor 600 is shown. In this variation, the cross-section of sensor 600 is varied along its length to pre-compensate for conditions that could adversely affect the sensor performance or signal level upon and/or after installation. These conditions may include, but are not limited to, bending and twisting of sensor 600 at installation, nearby fixed objects that provide a background coupling to the sensor and regions of the sensor that might be at a different temperature, subjected to a greater or lesser degree of proximity to objects to be sensed or experience a greater or lesser degree of compression from objects that are to be contact sensed. Variation of the cross-section in this manner effectively provides a means to vary the sensitivity of sensor 600 along its length. Among other advantages this offers the possibility of pre-compensating for changes in sensor sensitivity in regions of bends and twists required for installation. Further, by varying the width of bottom conductor 603 independently of the width of top conductor 602 and/or locally altering the angle between the planes of conductors 602, 603 as shown in FIG. 68, the directional response of sensor 600 can be varied along its length to mask out or focus in on pre-selected directions and/or regions.

Figure 69:
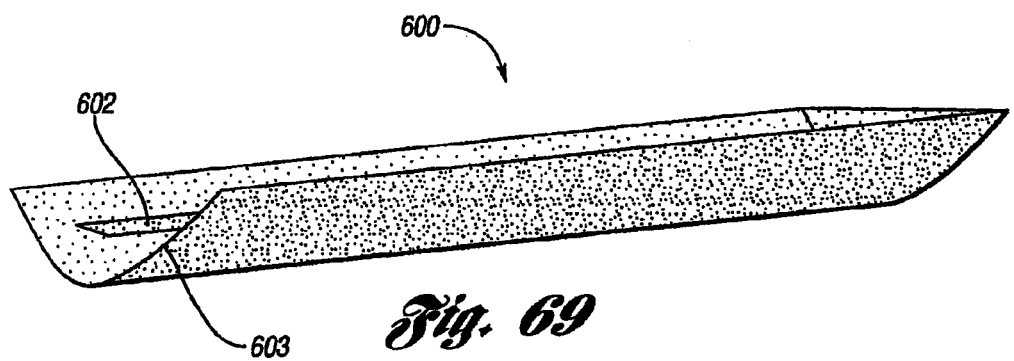
FIG. 69 illustrates a variation of the preferred embodiment of the sensor shown in FIG. 60.

Referring now to FIG. 69, a further variation of sensor 600 is shown. In this variation the directional sensitivity of sensor 600 is further augmented. In this variation, bottom conductor 603 is given a "channel" shape so as to partially surround top conductor 602. Top conductor 602 may or may not have a "channel" shape. With bottom conductor 603 grounded, this configuration of sensor 600 may provide an even more directional response than that in the preceding configurations. By twisting sensor 600 about it longitudinal axis this directional response can be steered along the length of the sensor to focus in on directions and regions of interest. By turning sensor 600 upside down and reversing its polarity, the sensor can be configured to have a proximity response in all but a small angular direction. This could be used to render sensor 600 insensitive to certain features on the structure to which it is mounted or to make the sensor blind to the proximity of objects in locations where entrapment of an obstruction would not be likely or of concern. For further directional sensitivity control the width and depth of the conductor channel or channels can be varied along the length of sensor 600 as well as the amount of separation and relative location between conductors 602, 603.

In another enhancement, one or more elements of sensor 600 are molded directly into a seal or cushion of an opening that is being closed by a hinged or sliding panel. In this regard, FIG. 70 illustrates the cross-section of a weather seal 610 as well as the overall sensor 600.

Figure 70:
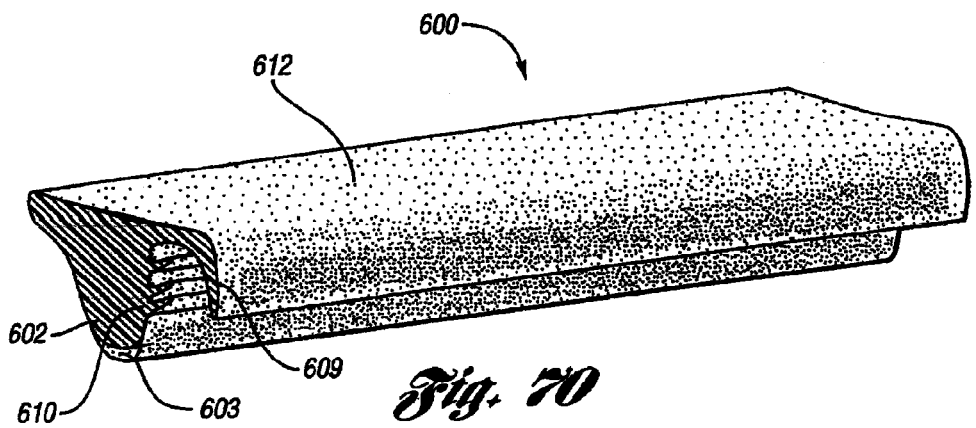
FIG. 70 illustrates the sensor shown in FIG. 60 incorporated within a weather seal.

In the configuration shown in FIG. 70, a malleable metallic conductor 602 is incorporated within an extruded weather seal 610. Weather seal 604 is composed of an elastomeric material such as a synthetic rubber. This offers advantages in terms of minimizing the construction and installation of sensor 600 as well as offering reliability advantages through reduced part count and simplified assembly. Conductor 602 is sufficiently thick and malleable to as to retain shapes into which it is bent or twisted along with weather seal 610. In this way weather seal 610 can be pre-shaped so as to fit into a predetermined location in the boundary of a closing device such as an automotive window and thereby simplify and lower the cost of installation. Weather strip 610 may further include a channel forming portion 609 to receive the edge of a closing panel such as a window between the main body of the weather strip and the channel defining portion 609 so as to effect a better weather sealing and provide greater system stability upon closure. A top portion 612 of weather seal 610 is formed so as to make a mating contact with the boundary of the closing device.

Weather seal 610 further includes an air filled blister region containing a second flexible conductor 603. The fixing of conductor 603 within the blister and the flexibility of this conductor are tailored so as to enable a ready deformation of this conductor in response to the touch of an object before an unacceptable amount of force is applied to the object by the closing panel of the closing device. The blister portion containing conductor 603 is further located so as to come into physical contact with objects of concern such as human body parts that could become entrapped between the closing portion of the closing device and weather seal 610. The shape of conductors 602, 603 and the relative locations and orientations of the conductors with respect to each other are preselected and configured so as to enhance proximity detection of conductive objects within the opening of the closing device before they become entrapped while minimizing the likelihood of undesirable detections of conductive objects that are not in a location that is likely to result in entrapment such as a location beside but not within the opening that is being closed.

Referring now back to FIGS. 54 and 55, with continual reference to FIG. 1, it is to be appreciated that sensors 449, 470 (which represent preferred embodiments of capacitance sensor 12 shown in FIG. 1a) model a simple capacitor having two parallel conductive plates 450, 451 separated by a dielectric layer 452. First conductor 450 is used for sensing the presence of a nearby object 16. First conductor 450 accomplishes detection of object 16 by sensing the formation of capacitance between itself and the object as the object approaches the first conductor 450. Second conductor 451 is connected to ground and forms a shield or barrier that protects first conductor 450 from the capacitive influence of objects positioned behind second conductor 451. Controller 14 reads the input sensor signal 23 indicative of the capacitance between first conductor 450 and object 16 and this type of detection is referred to as proximity sensing.

Resulting from the direct proximity to one another, first and second conductors 450, 451 create capacitance with each other. This capacitance is on the order of 200 pF for a four foot length of sensors 449, 470. Sensors 449, 470 are optimized for sensing objects 16 that produce capacitance changes on the sensor on the order of 10% or greater. As such, sensors 449, 470 are suitable for detection of human body parts such as fingers, hands, and the like. Second conductor 451 provides a low impedance electrical path back to the ground of controller 14. As such, the capacitance formed between conductors 450, 451 creates a natural input filter against electromagnetic interference.

When an application requires that sensors 449, 470 be remotely located from controller 14, a wire harness is used to complete electrical connections between the sensor and the controller. This wire harness is preferably a common type coaxial cable such as RG-174 having an inner conductor with an outer conductive shield. The inner conductor is used to connect first conductor 450 to a sensor input signal pin of controller 14. Connecting the outer conductive shield to the ground of controller 14 provides stable capacitive loading along the length of the inner conductor and shields the inner conductor from external stray capacitance. The outer conductive shield of the harness then doubles as an electrical conductor making connection between the ground of controller 14 and second conductor 451.

A characteristic of second conductor 451 is that it creates capacitance with first conductor 450 significantly greater than the capacitance that forms between the first conductor and a nearby object 16. The inclusion of a coaxial electrical harness in remote sensing applications further increases this amount of capacitance. If an approaching object 16 is unable to establish a capacitance with first conductor 450 great enough to be detected by controller 14, then the approaching object will eventually make contact with sensor 449, 470. The force generated between object 16 and sensor 449, 470 causes first conductor 450 to move closer to second conductor 451. The result of compression between first and second conductors 450, 451 generates an increase of capacitance in sensor 449, 470. This increased capacitance is measured by controller 14 on sensor input signal 21 and this type of detection is referred to as pinch sensing.

Figure 71:
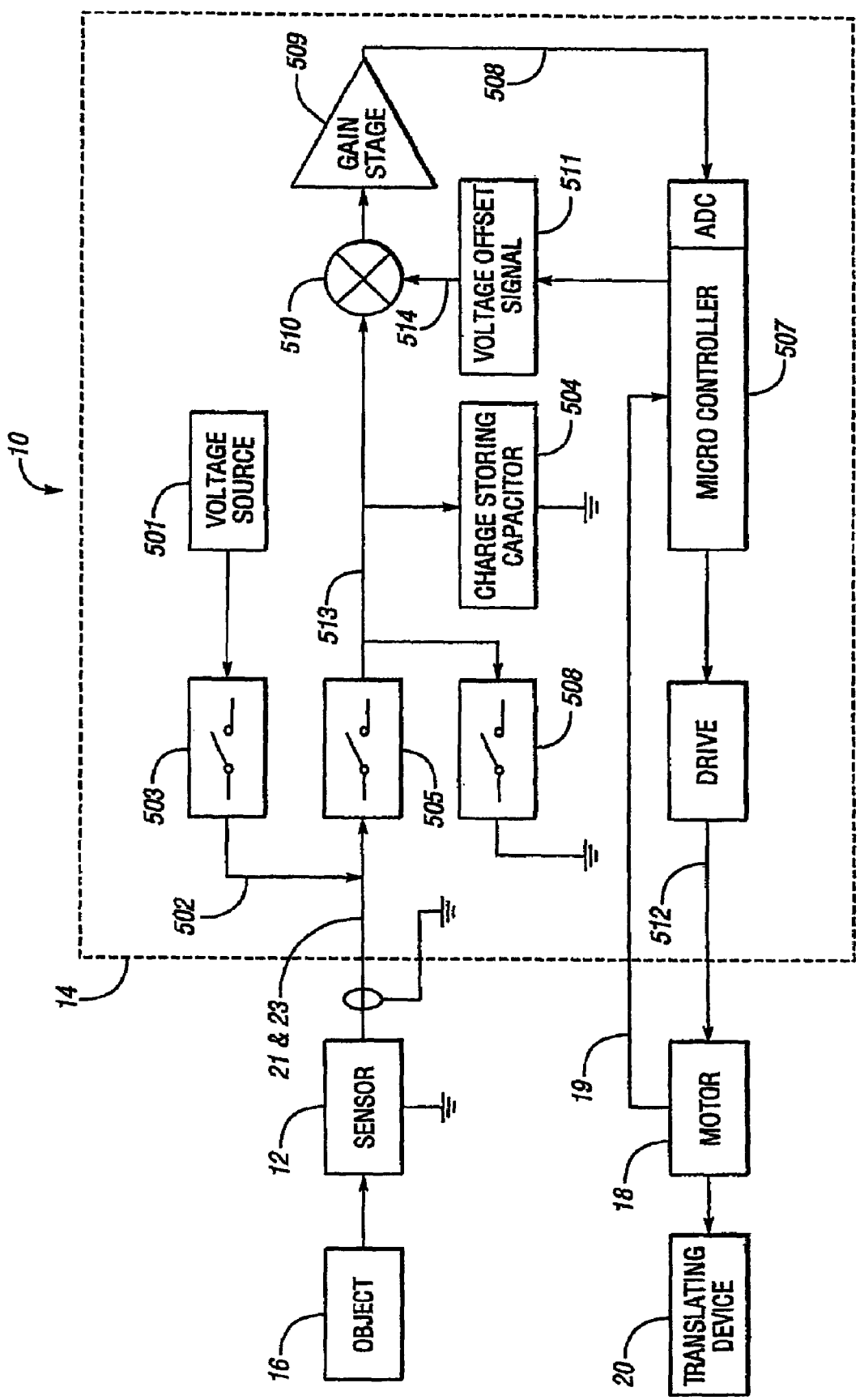
FIG. 71 illustrates the anti-entrapment system shown in FIGS. 1a and 1b in which the controller of the anti-entrapment system is shown in greater detail.

Referring now to FIG. 71, with continual reference to FIGS. 1a, 1b, 54, and 55, controller 14 of anti-entrapment system 10 is shown in greater detail. In a preferred embodiment, controller 14 includes a micro-controller 507 which manages hardware operations and timing. Micro-controller 507 performs a number of software algorithms to detect, identify, and respond to objects 16 that approach sensor 12. In addition to sensing objects 16, controller 14 can accept external input commands to operate motor 18 which in turn moves translating device 20.

When a voltage is applied across conductors 450, 451 of sensor 12, an electrical charge develops in the sensor. The amount of electrical charge developed is directly proportional to the unknown capacitance of sensor 12. In order to measure input sensor signals 21, 23, controller 14 uses a technique referred to as capacitive charge transfer.

To this end, micro-controller 507 closes a switch 503 which places a known voltage 502 generated by a voltage source 501 across conductors 450, 451 of sensor 12. This develops an electrical charge in sensor 12. After sensor 12 is fully charged, micro-controller 507 opens switch 503 to isolate the sensor from voltage source 501. Next, micro-controller 507 closes a switch 505 to transfer the electrical charge in sensor 12 to a second charge storing capacitor 504. Upon completion of charge transfer, micro-controller 507 then opens switch 505 again to isolate charge storing capacitor 504 from sensor 12. A resulting charge left on charge storing capacitor 504 produces a signal 513 indicative of this resulting charge. Electronic stages 510, 509 of controller 14 condition resulting charge signal 513 to produce a conditioned signal 508.

Micro-controller 507 measures conditioned signal 508. Signal 508 represents sensor input signal 21, 23 from sensor 12. Once micro-controller 507 has acquired signal 508, micro-controller 507 discharges charge storing capacitor 504 by closing switch 506. After discharging charge storing capacitor 504, micro-controller 507 opens switch 506 and another measurement sequence of sensor 12 is started.

The electrical charge developed in sensor 12 when known voltage 502 is applied across its conductors 450, 451 is proportional to the capacitance of the sensor. The capacitance of sensor 12 is determined by its physical characteristics. The two most important physical characteristics being parallel surface area and separation distance between conductors 450, 451. When a conductive object 16 comes in proximity to sensor 12, a second capacitance between the object and first conductor 450 is created. Consequently, a second electrical charge develops between first conductor 450 and conductive object 16. The net electrical charge stored on first conductor 450 is the sum of the two charges. This new electrical charge results in a different voltage developed on charge storing capacitor 504 during the charge transfer process than is seen when conductive object 16 is not present. Controller 14 uses this change in voltage to determine the presence of a conductive object in proximity to sensor 12. An apparent change in capacitance can also be observed when a non-conducting but dielectric object is brought near the sensor or a statically charged object is brought near the sensor.

Alternately, if object 16 is non-conductive, has poor conductive properties, is not a sufficiently strong dielectric, is not sufficiently statically charged, or is conductive yet too small to develop a significantly large capacitance between itself and first conductor 450, then a secondary means of object sensing exists within sensor 12 for detecting such an object 16. This secondary means is the pinch sensing aspect of sensor 12 and occurs when an object 16 makes contact with the sensing surface of sensor 12. Upon such contact, first conductor 450 is compressed towards second conductor 451 as a result of the force applied against sensor 12 at its sensing surface by object 16. The resulting compression of the two conductors 450, 451 towards one another increases the capacitance of sensor 12. This creates a change in the stored electrical charge on sensor 12. Hence, the change in stored electrical charge results in a different sensor input signal 21, 23 developed on sensor 12.

The value of charge storing capacitor 504 is typically fifty or more times greater than the capacitance of sensor 12. If only one capacitive charge transfer was performed, resulting charge signal 513 generated on charge storing capacitor 504 would be virtually immeasurable by micro-controller 507. In order to develop a resulting charge signal 513 that is large enough for processing, micro-controller 507 performs a number of sequential charge transfers before measuring conditioned signal 508 and before discharging charge storage capacitor 504. The number of sequential charge transfers is nominally set at twenty. Resulting charge signal 513 is created by multiple charge transfers in the summation of all sequential charge transfers made. When these sequential charge transfers are performed rapidly, their resulting conditioned signal 508 is considered representative of the charge on sensor 12 at a single point in time. The sequential charge transfer technique creates a natural amplification of sensor input signal 21, 23 which increases the sensitivity of controller 14. This also doubles as a high-frequency noise filter by averaging multiple charge transfers made over time.

Even with multiple charge transfers employed, an object approaching sensor 12 may produce variations in resulting charge signal 513 which are too small for processing. Thus, controller 14 performs a number of process steps using electronic stages 510, 509 to magnify resulting charge signal 513 into conditioned charge signal 508 so that micro-controller 507 can measure the conditioned charge signal.

In order to magnify resulting charge signal 513, initial process stage 510 performs a level shift on the resulting charge signal to remove most of its DC component. Controller 14 employs a digital-to-analog circuit 511 to produce a DC bias voltage signal 514. Initial process stage 510 subtracts voltage offset signal 514 from resulting charge signal 513. Gain stage 509 amplifies the result to produce conditioned charge signal 508. Conditioned charge signal 508 then represents a magnified view of the fluctuating sensor input signal 21, 23.

The ability of controller 14 to detect changes in sensor input signal 21, 23 defines its sensitivity. The sensitivity of controller 14 is important for determining the characteristics of an object 16 as it approaches or makes contact with sensor 12. Wide variations in sensor input signal 21, 23 occur for objects 16 of differing conductivities, shapes, and sizes. Controller 14 is designed to adjust functionality as necessary to maintain optimum sensitivity when measuring sensor input signal 21, 23.

By adjusting the number of charge transfers made during a charge transfer sequence, the sensitivity of controller 14 can be modified. When the number of charge transfers is increased, the sensitivity of controller 14 to sensor input signals 21, 23 increases. This is because each charge transfer performed between sensor 12 and charge storing capacitor 504 increases the magnitude of charge signal 513. The resulting charge signal 513 becomes an amplified version of the original charge signal. By itself this strategy for increasing the sensitivity of controller 14 is limited. As the voltage generated on charge storing capacitor 504 approaches that of voltage source 501, the amount of charge transferred from sensor 12 to charge storing capacitor 504 diminishes. Also, increasing the number of charge transfers extends the sampling time of controller 14 to sensor input signal 21, 23. Because resulting charge signal 513 represents the summation of all charge transfers in a measurement, a greater number of charge transfers reduces input noise appearing on sensor 12. Adjustment of the charge transfer number is easily implemented by controller 14 either automatically or as a predefined software setup value.

Changing the value of charge storing capacitor 504 is another way of adjusting the sensitivity of controller 14. Decreasing the capacitance causes resulting charge signal 513 to become larger for the same number of charge transfers while increasing it makes resulting charge signal 513 smaller for the same number of charge transfers. The result is a modified relationship between the capacitances of sensor 12 and charge storing capacitor 504.

Instead of a single charge storing capacitor 504, controller 14 could employ a bank of such capacitors 504 of similar or varying capacitance values combined in parallel and/or in series circuit configuration. Through software executed by the micro-controller 507 one or more of these capacitors 504 could be switched in-or-out of the circuit to change the sensitivity of the system thereby forming an overall charge storing capacitor 504 of the desired capacitive value.

Another way of optimizing the sensitivity of controller 14 is to change the voltage applied to sensor 12 by voltage source 501. In this approach raising voltage signal 502 which is used to charge sensor 12 will yield a greater charge transferred to charge storing capacitor 504 during each charge transfer. Raising voltage signal 502 applied to sensor 12 raises the signal-to-noise ratio for sensor 12. This contributes to the overall filtering and stability of controller 14 when taking measurements of sensor input signal 21, 23. Voltage source 501 can be configured as a programmable voltage source thereby allowing micro-controller 507 to adjust the voltage potential used to charge sensor 12. Software executed by micro-controller 507 can then optimize its sensitivity to capacitance changes on sensor 12 by adjusting the voltage source potential.

Another way to optimize the sensitivity of controller 14 is to change the duration of time that switch 503 remains closed for charging sensor 12. In this charge method, voltage source 501 acts more like a current source to meter the amount of charge delivered to sensor 12 while switch 503 is closed. Configuring voltage source 501 for programmable constant current operation can further enhance control over the charge procedure of sensor 12.

Another way to optimize the sensitivity of controller 14 to sensor input signal 21, 23 is to lower the reference voltage of an ADC within micro-controller 507 in order to increase the resolution of the ADC when converting the pre-conditioned sensor input signal 508 to a numerical value for processing.

In the preferred embodiment of controller 14 as discussed thus far with respect to FIG. 71, charge storing capacitor 504 is referenced to ground. An alternate circuit configuration references charge storing capacitor 504 to a variable voltage source instead of ground. When charge developed in sensor 12 is transferred to charge storing capacitor 504, the variable voltage source adjusts to maintain a virtual ground potential at resulting charge signal 513. By doing so, each charge transfer results in 100% of the charge stored in sensor 12 to be transferred to charge storing capacitor 504. When all charge transfers are complete, the resulting voltage across charge storing capacitor 504 represents the summation of charge transfers. This method of charge transfer carries the added benefit of equally weighted charge transfers. By transferring 100% of the charge developed in sensor 12, fewer charge transfers are needed to produce a resulting charge signal 513 of great enough magnitude. Fewer charge transfers also means that sensor 12 can be read faster, thereby increasing response time of controller 14.

Any number of these methods of adjusting the sensitivity of controller 14 can be used to enhance its ability to measure variations of sensor input signal 21, 23.

As described above with reference to FIG. 71, micro-controller 507 of controller 14 manages hardware operations and timing. Micro-controller 507 performs a number of software algorithms or routines to detect, identify, and respond to objects 16 that approach or contact sensor 12. These software algorithms will now be described with reference to FIGS. 72 through 78 with continual reference to FIG. 71.

Figures 72, 73:
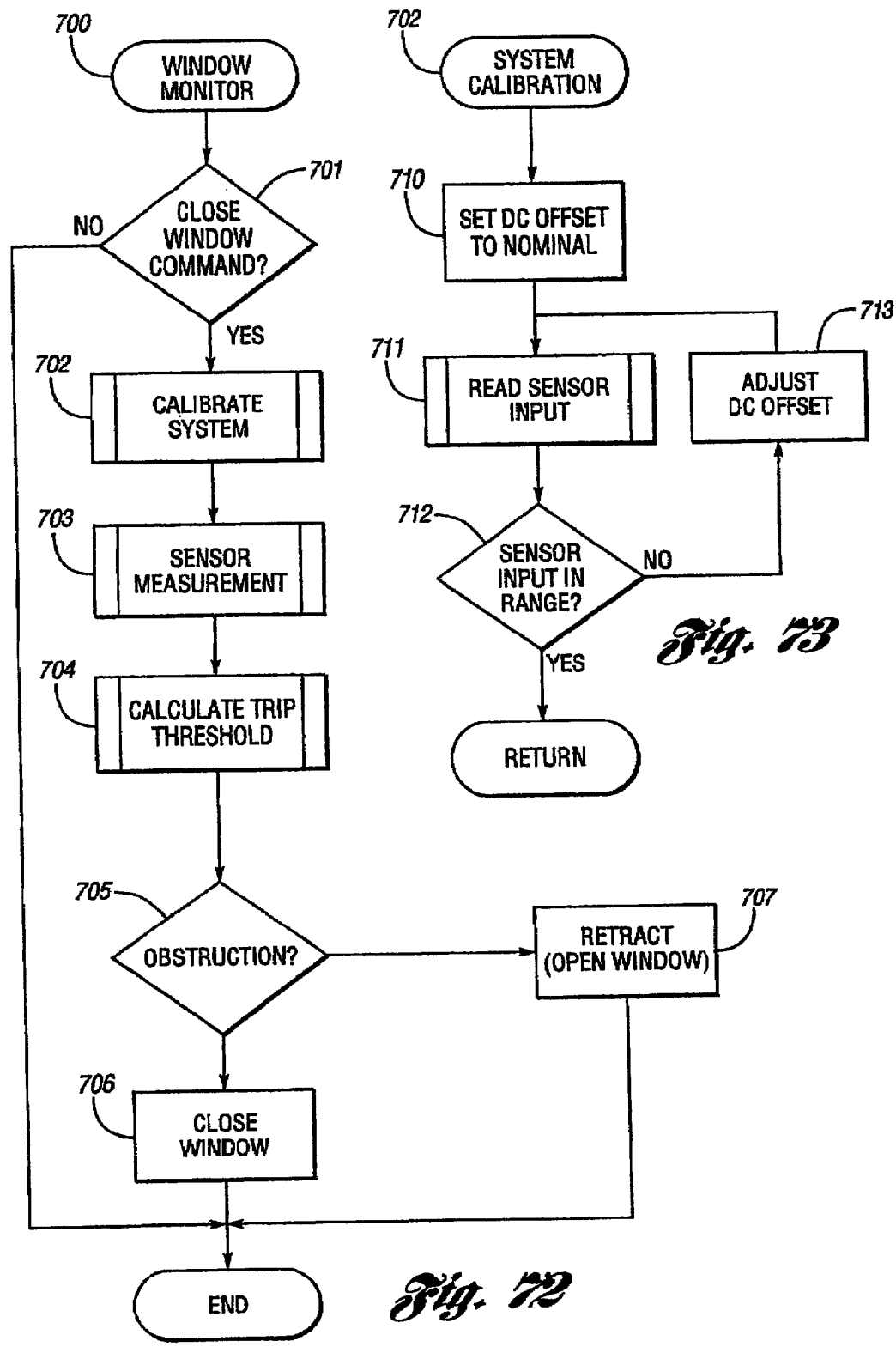
FIG. 72 illustrates a translating device monitor software routine performed by the micro-controller of the controller shown in FIG. 71.
FIG. 73 illustrates a system calibration software routine performed by the micro-controller of the controller shown in FIG. 71.

With reference to FIG. 72, micro-controller 507 performs a window monitor software routine 700 in order to monitor sensor input signal 21, 23 for detection of an object 16 to sensor 12. Window monitor software routine 700 is executed when motor 18 is being driven to close a translating device 20 such as a window. Initially, micro-controller 507 responds to a command to close window 20 (i.e., close window command, decision step 701) by performing a calibrate system routine 702, a sensor measurement routine 703, and a calculate trip threshold routine 704. If the measurement of sensor input signal 21, 23 indicates that an object 16 is in the movement path of window 20 during closure of the window (decision step 705), then micro-controller 507 aborts the close window command (step 706) and reverses motor 18 in order to retract the window (step 707) thereby releasing the object from possible entrapment by the window.

FIG. 73 illustrates system calibration routine 702 performed by micro-controller 507. System calibration routine 702 includes DAC circuit 511 setting the DC offset 514 to nominal (step 710) and then micro-controller 507 performing a read sensor input routine 711 in order to read the conditioned resulting charge signal 508. If the conditioned resulting charge signal 508 is not within a suitable range (decision step 712), then DAC circuit 511 further adjusts the DC offset 514 (step 713). This process is repeated until the conditioned resulting charge signal 508 falls within the suitable range.

Figure 74:
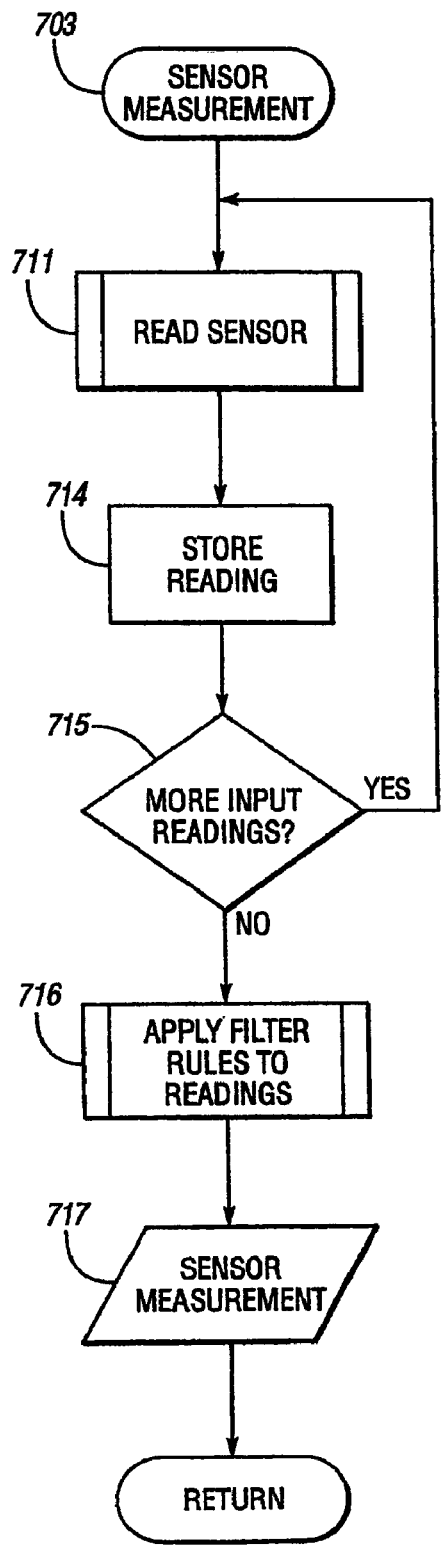
FIG. 74 illustrates a sensor measurement software routine performed by the micro-controller of the controller shown in FIG. 71.

FIG. 74 illustrates sensor input signal measurement routine 703 performed by micro-controller 507. Routine 703 includes micro-controller 507 performing read sensor input routine 711 in order to read the conditioned resulting charge signal 508 and thereby measure the capacitance of sensor 12.

Figure 75:
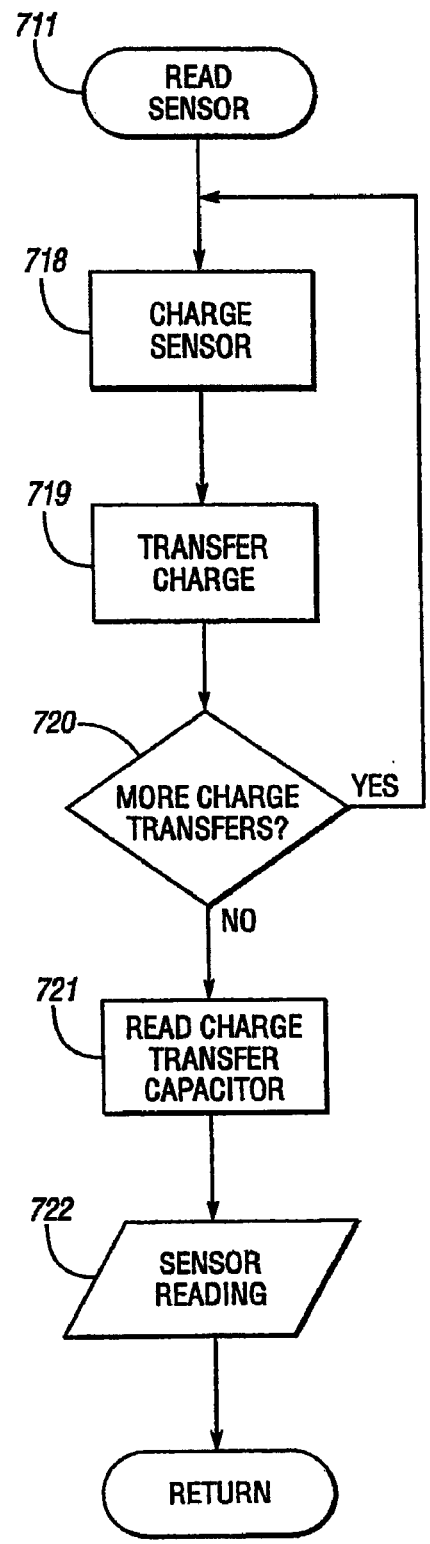
FIG. 75 illustrates a read sensor software routine performed by the micro-controller of the controller shown in FIG. 71.

FIG. 75 illustrates read sensor input routine 711 performed by micro-controller 507 for measuring the capacitance of sensor 12. Routine 711 initially includes micro-controller 507 closing switch 503 to place a known voltage 502 generated by voltage source 501 across conductors 450, 451 of sensor 12 in order to charge the sensor (step 718). Micro-controller 507 then opens switch 503 to isolate sensor 12 from voltage source 501 and closes switch 505 in order to transfer the electrical charge in the sensor to second charge storing capacitor 504 (step 719). This process is repeated to perform multiple charge transfers (decision step 720) such as twenty transfers as described above with reference to FIG. 71. The resulting charge left on charge storing capacitor 504 (i.e., resulting charge signal 513) is then read by stages 510, 509 to produce conditioned signal 508 (step 721). Micro-controller 507 then reads conditioned signal 508 on its ADC input to generate a sensor reading (step 722). The sensor reading is indicative of the capacitance of sensor 12 and micro-controller 507 uses the sensor reading to determine the presence of an object 16 near sensor 12.

The ADC input of micro-controller 507 converts the analog conditioned signal 508 from sensor 12 into a numeral representation of sensor input signal 21, 23. The resolution of this ADC input defines the level of sensitivity that micro-controller 507 has for measuring capacitance changes on sensor 12. Several means of signal amplification are available as described above with reference to FIG. 71 in order to increase the overall sensitivity of controller 14 to capacitance changes of sensor 12, and hence to be able to detect smaller variations in sensor capacitance.

Micro-controller 507 is capable of executing software to adjust the sensitivity of controller 14 to changes in capacitance on sensor 12. Implementation of any number of signal amplification methods permits controller 14 to measure small capacitance changes of sensor 12 over a large capacitance range.

Turning back to sensor measurement routine 703 shown in FIG. 74, with continual reference to FIGS. 71 and 75, micro-controller 507 stores sensor readings (step 714) after they are taken (read sensor routine 711). Once a number of sensor readings are taken (decision step 715) micro-controller 507 performs a filter rule routine 716 on the sensor readings to create a filtered sensor measurement (step 717). Micro-controller 507 uses the filtered sensor measurement to determine the capacitance change on sensor 12, and then uses the sensor capacitance change to determine the presence of an object 16 near sensor 12. The application of digital filtering rules (routine 716) assists in removing noise from sensor measurement (step 717) and to extract useful characteristics about sensor input signal 21, 23.

As such, sensor measurement routine 703 stores sequential sensor readings in step 714 for use in generating a sensor measurement in step 717. As the sensor readings are performed they are stored in memory at step 714 and the oldest sensor reading is discarded. Any number of sequential sensor readings such as ten sequential sensor readings can be summed to represent a single sensor measurement 717. Summing sensor readings 722 in step 714 acts to filter out noise and provides some additional resolution of sensor input signal 21, 23. Alternately, other filtering rules or averaging can be used, such as digital multi-point averaging, or raw sensor readings 722 could be used unfiltered.

A nominal input value of sensor input signal 21, 23 is derived from sensor signal measurement routine 703. Calculate trip threshold routine 704 (FIG. 72) calculates a trip threshold value relative to the nominal input value. If the value of sensor input signal 21, 23 rises above the trip threshold value, then micro-controller 507 declares an obstruction (step 705—FIG. 72) in the way of window 20.

Changes in humidity and temperature, and the presence or absence of snow, rain, or dirt can cause variations in sensor input signal 21, 23. Drift compensation is implemented to counteract these differences formed between the sensor input value and the nominal input value. The nominal input value is adjusted up or down at independent rates to maintain value with the sensor input signal as the sensor input signal drifts. The speed at which the nominal input value can track the value of the sensor input signal is limited to prevent filtering out detection of valid obstructions. Alternatively, controller 14 can measure the temperature and/or humidity, and alter the nominal and/or trip values based on those measurements.

Controller 14 incorporates EEPROM (writable non-volatile) memory that in certain embodiments is used to store operating parameters and constants. This permits controller 14 to enable, disable, or select specific algorithms and/or behaviors, and/or be tuned to specific applications without requiring changes to executable code. In other embodiments, these parameters can be modified by adaptive algorithms so controller 14 can adjust to changing conditions in a manner transparent to users. For example, if adaptive algorithms determine that the dynamic range of sensor input signal 21, 23 is too small, then micro-controller 507 can increase the number of charge transfer operations performed for each sensor sample. If this change improves the response of controller 14, the EEPROM can be updated to reflect this change and the system can avoid having to make this adaptation every time it is started, and further adaptations can be continued from the new baseline.

In the exemplary controller 14, the width of each pulse injected into sensor 12 during a charge transfer is identical to each of the others. An alternate embodiment varies the pulse width in order to spread the spectrum of radiated emissions and thus improve EMI characteristics. Other strategies to improve EMI include varying the period between measurements of sensor 12, and disabling the sensor during periods when controller 14 is unconcerned about possible obstructions, such as any time the translating panel is not in motion.

For improved EMI susceptibility, the calculated trip threshold value is raised when sensor input signal 21, 23 becomes noisy. It is based on the min and max values recorded within a set number of cycles and the number of nominal value crossings that occur within the sample group. High noise levels will raise the signal level required to detect an obstruction 16.

In the presence of certain kinds of electrical noise, sensor input signal 21, 23 changes very quickly by large amounts. Software filter algorithms permit the controller 14 to ignore these offsets while still correctly detecting and reporting actual obstructions. In one embodiment of the present invention, an obstruction 16 is reported only after controller 14 observes several (such as six) step changes in sensor input signal 21, 23. At each step, the nominal value is adjusted to compensate for the rise in sensor input signal 21, 23. In this way, large step values due to the application of electrical noise do not by themselves cause sensor 12 to declare an obstruction 16 is present. Sensor input signal 21, 23 must continue to rise for each of the subsequent steps required to detect obstruction 16. If sensor input signal 21, 23 does not progress through the remaining steps within a particular period of time (nominally one second), the step count is decremented or reset to accommodate the environmental change. In this way, sensor input signals 21, 23 that rise too quickly and fail to continue to rise are ignored. Another embodiment directly measures the slope of the change of sensor input signal 21, 23 with each new measurement and adjusts the nominal value to eliminate that portion of the sensor input signal that could not come from a legitimate obstruction.

Besides operating as an obstruction detecting sensor, the exemplary controller 14 also monitors switch inputs, translates those inputs into user commands, controls motor 18 which drives a translating panel 20, and communicates with other controllers to provide operating and diagnostic reports.

The exemplary controller 14 uses four switch inputs. The switch inputs can be configured active high or active low in EEPROM. The function of each switch is also assigned in EEPROM: Open, Close, Auto Open, and Auto Close. Pressing the Open or Close switches alone is interpreted as a Manual Open or Manual Close command, respectively. Releasing the switch terminates the Manual Open or Close command. Pressing Open with Auto Open initiates an Express Open command, which causes controller 14 to open translating panel 20 until motor 18 stalls, end of travel is reached, or the command is terminated by pressing any switch. Any other combination of switch presses are interpreted as a "Stop" command which halts any motion of translating panel 20.

The Auto Open and Auto Close switches are optional. If an Auto switch is not defined, the corresponding Express command is initiated by a "tap" on the appropriate switch, e.g., if Auto Open is not defined "tapping" the Open switch initiates the Express Open command. A "tap" is defined as any press whose duration is less than the amount of time specified in EEPROM, nominally 400 ms. A press longer than the defined tap time is interpreted as a Manual command.

Alternatively, user commands could be issued to controller 14 though communications interfaces, or the controller could perform autonomously, opening or closing panel 20 when required, e.g., when rain was detected.

If an obstruction 16 is detected while translating panel 20 is closing, controller 14 retracts the panel to release the entrapped object. In the exemplary system, the length of the retraction is defined in EEPROM as the amount of time motor 18 is reversed. Alternate embodiments use relative window positions as reported by motor Hall-effect sensors or encoders. One particular system retracts the window a specific length (nominally 10 cm) or to a specific position (nominally the halfway point), whichever is greater. In any case, any new user commands are ignored while window 20 is retracting. A stall of motor 18 or translating panel 20 reaching the end-of-travel will also terminate the retraction.

A manual override can be provided to permit the user to close panel 20 even if an obstruction 16 is detected. In the exemplary system, the manual override is activated by issuing a manual close command during which an obstruction 16 is detected, holding that command through the retraction until it is complete, then issuing two more manual close commands within one second. The second manual close is interpreted as the override, and controller 14 will drive translating panel 20 closed until the command is terminated.

When the user commands that translating panel 20 close, obstruction sensor 12 is calibrated to find the optimal operating parameters before moving the panel. The calibration may be limited to a few or even just one parameter in order to minimize any delay. If sensor 12 is detecting an obstruction 16 before the calibration is performed, the obstruction is reported (causing panel 20 to retract), but is calibrated out, so any subsequent command to close the panel may be honored. Alternately, the system may refuse to calibrate out an existing obstruction, particularly if the measured magnitude of the obstruction is large. This will prevent a sensor 12 that is saturated from failing to detect a valid obstruction 16.

Figure 76:
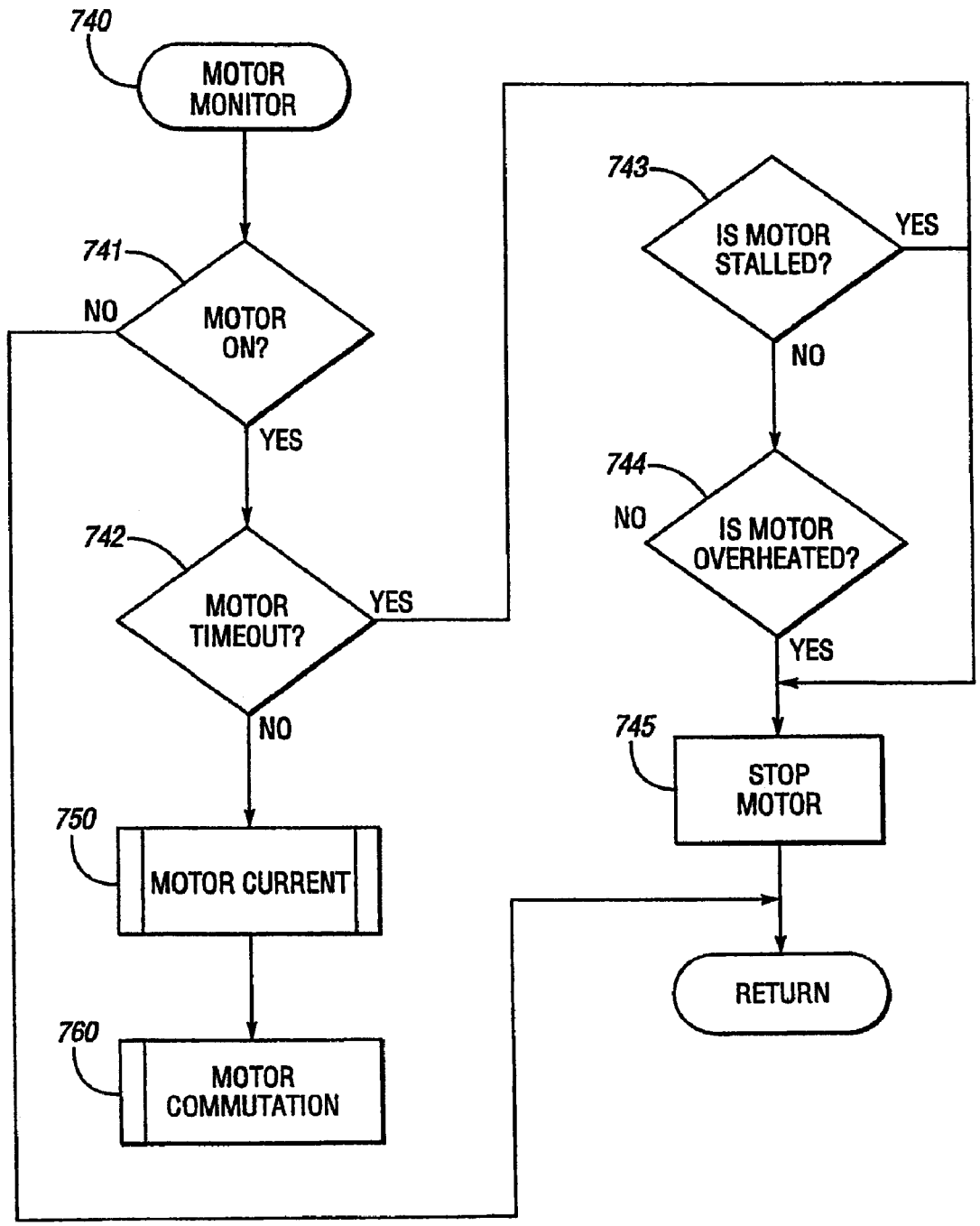
FIG. 76 illustrates a motor monitor software routine performed by the micro-controller of the controller shown in FIG. 71.

Referring now to FIG. 76, with continual reference to FIG. 71, a motor monitor routine 740 performed by micro-controller 507 is shown. Motor monitor routine 740 is performed upon micro-controller 507 producing a motor signal 512 to rotate motor 18 in order to move translating device 20. Micro-controller 507 performs motor monitor routine 740 to monitor motor signal 512. From information gathered by motor monitor routine 740, micro-controller 507 is able to compute operating performance and status information about motor 18 and translating device 20.

As such, micro-controller 507 performs motor monitor routine 740 when motor 18 is being driven (decision step 741). If motor 18 has timed-out (decision step 742) of if the motor has stalled (decision step 743), then micro-controller 507 stops producing motor signal 512 (step 745). If motor 18 has not timed-out (decision step 742), then micro-controller 507 performs a motor current routine 750 (shown in FIG. 77). Upon performing motor current routine 750 micro-controller 507 then performs a motor commutation routine 760 (shown in FIG. 78). Micro-controller 507 then determines if motor 18 has stalled (decision step 743) or if the motor has overheated (decision step 744). If any of these last two conditions are positive, then micro-controller 507 stops producing motor signal 512 in order to stop motor 18 (step 745). Micro-controller 507 repeats the process of motor monitor routine 740 while motor 18 is being driven to move translating device 20.

Figure 77:
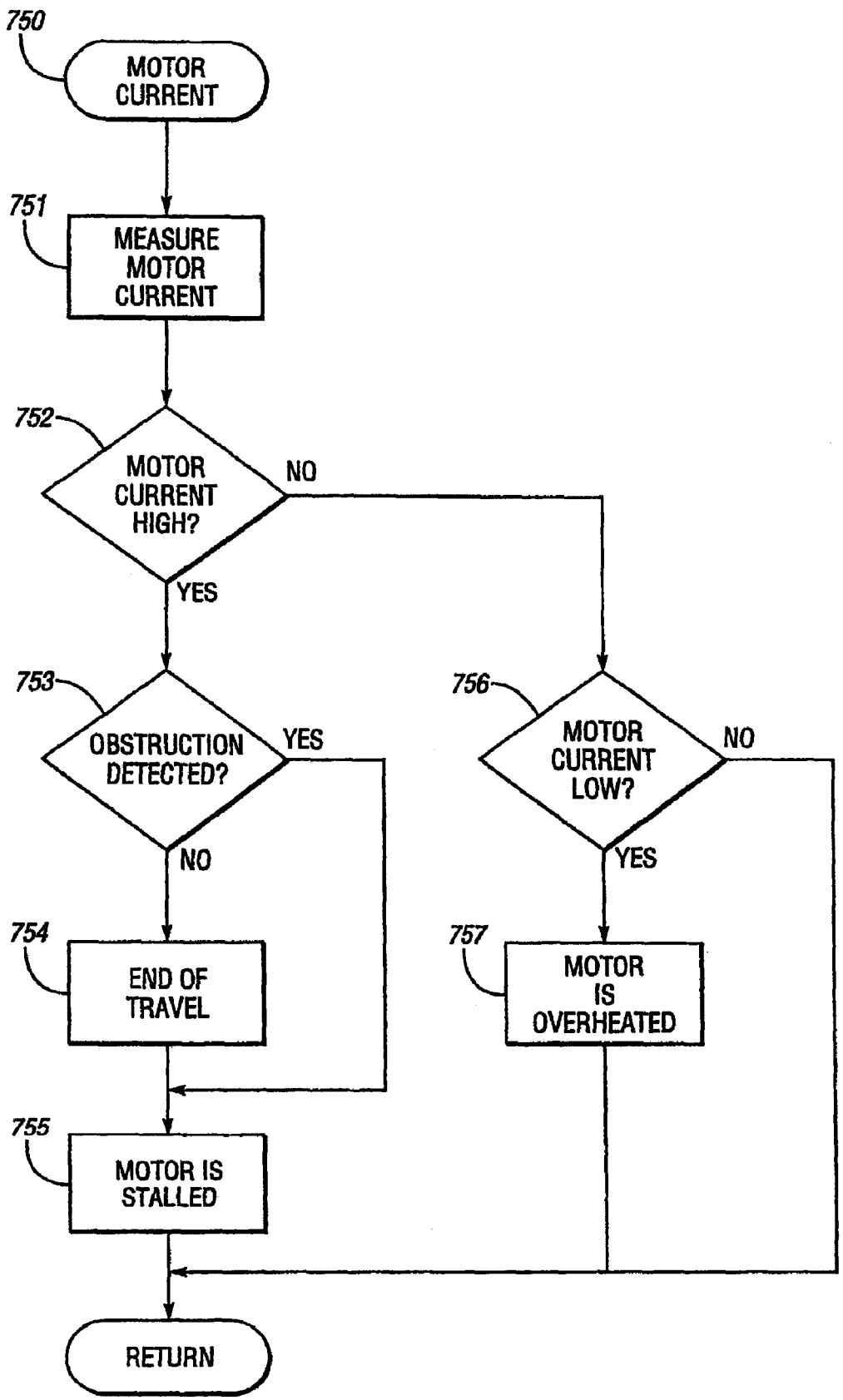
FIG. 77 illustrates a motor current software routine performed by the micro-controller of the controller shown in FIG. 71.

Referring now to FIG. 77, with continual reference to FIGS. 71 and 76, motor current routine 750 is shown. Motor current routine 750 includes micro-controller 507 measuring the motor current (step 751) and determining if the motor current is high (decision step 752). High motor current can indicate that motor 18 is stalled (step 755) or is being heavily loaded by translating device 20. If micro-controller 507 determines that an obstruction 16 is present (decision step 753) in the path of translating device 20, then micro-controller 507 attributes the high motor current to the obstruction. Otherwise, the high motor current, in the absence of an obstruction 16, is interpreted by micro-controller 507 as translating device 20 having reached its end-of-travel position (decision step 754), such as either being fully opened or fully closed. Conversely, detection of low motor current (decision step 756) can be an indication that motor 18 is overheated (step 757) or otherwise damaged.

Figure 78:
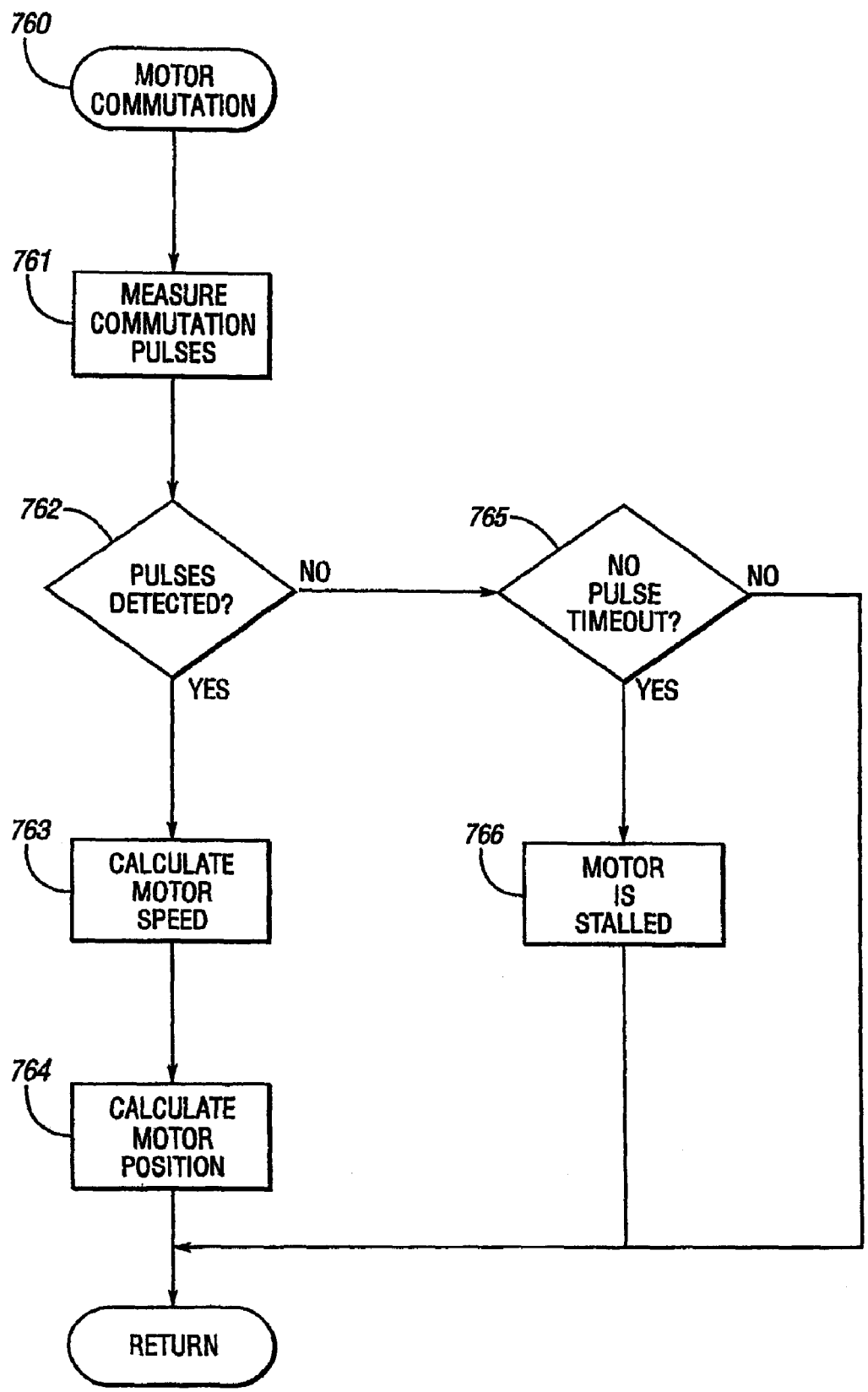
FIG. 78 illustrates a motor commutation software routine performed by the micro-controller of the controller shown in FIG. 71.

Referring now to FIG. 78, with continual reference to FIGS. 71 and 76, motor commutation routine 760 is shown. Motor commutation routine 760 includes micro-controller 507 measuring motor commutation pulses (step 761). As motor 18 rotates to move translating device 20, micro-controller 507 monitors electrical pulses 19 generated at the commutator inside the motor. Micro-controller 507 monitors the occurrence of motor commutation pulses (step 761) coming from motor 18 to determine whether or not the motor is rotating. The presence of motor commutation pulses (decision step 762) confirms rotation by motor 18, and hence movement by translating device 20. The rate at which commutation pulses occur is used by micro-controller 507 to calculate motor speed (step 763).

Micro-controller 507 uses the motor speed information in combination with motor current to determine the operating load conditions on motor 18. This information can be used to determine conditions such as motor stall, end-of-travel, or an otherwise undetected obstruction, especially when used in conjunction with a measurement of the motor drive current. Commutation pulse counting allows micro-controller 507 to track the relative position of translating device 20 (step 764). Position information can be used to predict an end-of-travel occurrence of translating device 20 and to ignore the portion of capacitance sensor input signal 21, 23 due to the approach of the translating device or sealing surface as the device closes over the opening.

In a similar embodiment, the monitoring of motor commutation pulses may be substituted with an alternate signal 19. Such a signal 19 can be derived from pulse generating circuitry such as Hall-Effects, optical encoders, or other such position sensing devices that can detect the rotation of the rotor of motor 18. Improved speed and position information can be attained when motor 18 is fitted with positive position sensors, like Hall-effect sensors, arranged in an appropriate configuration, such as a quadrature. Such a configuration provides motor 18 direction information as well as a more reliable signal 19 for pulse detection. The end result is simpler processing and more accurate position, speed, and direction information.

If no pulses are detected after a period of motor operating time (decision step 765), then it is determined that motor 18 is stalled (step 766), or is otherwise unable to rotate. When a stall is detected (step 743 of motor monitor routine 740), power to motor 18 is removed (step 745 of motor monitor routine 740). Likewise, if motor 18 is detected as overheated (step 744 of motor monitor routine 740), power to the motor is removed (step 745 of motor monitor routine 740). Stopping motor 18 helps to protect it from further overheating. Additional motor protection is provided by the application of a movement timer (step 742 of motor monitor routine 740). The timer operates whenever motor 18 is powered (step 741 of motor monitor routine 740). The maximum time for translating device 20 to fully traverse from one end-of-travel to another is determined by micro-controller 507. If the timer reaches this time value before motor 18 is stopped (step 741 of motor monitor routine 740), either by user command, limit switch, stall detection, or other means, power is removed from the motor (step 745 of motor monitor routine 740). Prolonged operation of motor 18 may indicate a damaged or improperly working translating device 20 or possibly an undetectable or unforeseen operating condition.

To reduce power consumption and emitted electrical noise, an embodiment of the invention disables some or all of the processing functions of controller 14 when translating panel 20 is not in motion or the system is otherwise unconcerned about possible obstructions to the panel. One embodiment simply interrogates sensor 12 only when translating panel 20 is actually closing. A more complex embodiment disables an oscillator of micro-controller 507 whenever the system is idle, and remains in that state until the user issues a new command.

While the present invention has been described in conjunction with specific embodiments thereof, it is evident that many alternatives, modifications, and variations will be apparent to those skilled in the art in light of the foregoing description. Accordingly, it is intended to embrace all such alternatives.

What is claimed is:

1. An anti-entrapment system for preventing an object from being entrapped by a translating device, the system comprising:
   a sensor positionable adjacent to or on a translating device, the sensor having a non-conductive compressible jacket with a cavity, a first conductor positioned within the cavity adjacent to a first portion of the jacket and connected to the jacket, and a second conductor positioned within the cavity adjacent to a second portion of the jacket opposite the first jacket portion and connected to the second jacket portion such that the conductors are opposite from one another;
   wherein, in response to an object pressing against the first jacket portion towards the second jacket portion, the jacket compresses from a non-compressed state in which the conductors are separated from one another to a compressed state in which the first conductor is moved towards the second conductor and contacts the second conductor;

the sensor further having a compressible support outside of the cavity and positioned on the second jacket portion;

wherein, in response to the object pressing against the first jacket portion towards the second jacket portion while the jacket is in the compressed state, the support compresses away from the second jacket portion to reduce pinching of the object by a translating device when the object is between the first jacket portion and the translating device.

2. The system of claim 1 wherein:
the jacket is a non-conductive compressible elastomer jacket.

3. The system of claim 1 wherein:
the support is a compressible dielectric element.

4. The system of claim 1 wherein:
the support is a compressible elastomer support.

5. The system of claim 1 wherein:
the first conductor is sheathed within a first conductive carrier connected to the jacket and the second conductor is sheathed within a second conductive carrier connected to the second jacket portion.

6. The system of claim 5 wherein:
each carrier is a conductive elastomer carrier.

7. The system of claim 1 wherein:
the support has a stiffer compression factor than the jacket.

8. The system of claim 1 further comprising:
a controller in communication with the first and second conductors, wherein the controller controls the translating device in response to the conductors contacting to prevent the translating device from entrapping the object.

9. The system of claim 1 wherein:
at least one of the conductors is sufficiently flexible so as to allow local deformation of the at least one the conductors in a region of the jacket being touched by an object.

10. The system of claim 1 wherein:
at least one of the conductors includes at least one of a conductive film and a conductive paint.

11. The system of claim 1 wherein the translating device is an automobile window, wherein:
the sensor is positionable on the automobile window to move with the automobile window as the automobile window moves.

12. The system of claim 1 wherein the translating device is an automobile window, wherein:
the sensor is positionable on an automobile window frame for the automobile window.

13. An anti-entrapment system for preventing an object from being entrapped by a translating device, the system comprising:
a sensor positionable adjacent to or on a translating device, the sensor having a non-conductive compressible jacket with a cavity, a first conductor positioned within the cavity adjacent to a first portion of the jacket and connected to the jacket, and a second conductor positioned within the cavity adjacent to a second portion of the jacket opposite the first jacket portion and connected to the jacket such that the conductors are opposite from one another;
the sensor further having a conductive compressible support within the cavity between the first and second conductors;

wherein, in response to an object pressing against the jacket, the jacket compresses from a non-compressed state in which the conductors are separated from the support to a compressed state in which the conductors move toward the support and contact the support;

wherein, in response to the object pressing against the jacket while the jacket is in the compressed state, the support compresses to allow the jacket to compress further in order reduce pinching of the object by a translating device external to the jacket when the object is between the jacket and the translating device.

14. The system of claim 13 wherein:
the jacket is a non-conductive compressible elastomer jacket.

15. The system of claim 13 wherein:
the support is a conductive compressible dielectric element.

16. The system of claim 13 wherein:
the support is a conductive compressible elastomer support.

17. The system of claim 13 wherein:
the first conductor is sheathed within a first conductive carrier connected to the jacket and the second conductor is sheathed within a second conductive carrier connected to the jacket.

18. The system of claim 17 wherein:
each carrier is a conductive elastomer carrier.

19. The system of claim 13 wherein:
the support has a stiffer compression factor than the jacket.

20. The system of claim 13 further comprising:
a controller in communication with the first and second conductors, wherein the controller controls the translating device in response to the conductors contacting the support to prevent the translating device from entrapping the object.

21. The system of claim 13 wherein:
at least one of the conductors is sufficiently flexible so as to allow local deformation of the at least one the conductors in a region of the jacket being touched by an object.

22. The system of claim 13 wherein:
at least one of the conductors includes at least one of a conductive film and a conductive paint.

23. The system of claim 13 wherein the translating device is an automobile window, wherein:
the sensor is positionable on the automobile window to move with the automobile window as the automobile window moves.

24. The system of claim 13 wherein the translating device is an automobile window, wherein:
the sensor is positionable on an automobile window frame for the automobile window.

25. An anti-entrapment system for preventing an object from being entrapped by a translating device, the system comprising:
a sensor having a non-conductive compressible jacket with a cavity, a compressible dielectric element within the cavity, and first and second conductors within the jacket on opposite sides of the dielectric element such that the conductors are separated from one another by a separation distance, the conductors having a capacitance dependent upon the separation distance;
wherein the capacitance of the conductors changes in response to a geometry of the sensor changing as a result of at least one of the conductors and the dielectric element deforming in response to an object touching the jacket;

the jacket further having a detail for attaching the sensor either to a seal of a translating device or directly to the translating device.

26. The system of claim 25 further comprising:

a controller for controlling the translating device as a function of the capacitance of the conductors to prevent the translating device from entrapping the object.

27. The system of claim 25 wherein:

the jacket is a non-conductive compressible elastomer jacket.

28. The system of claim 25 wherein:

the dielectric element is a compressible dielectric elastomer.

29. The system of claim 25 wherein:

the detail includes a dovetailing feature.

30. The system of claim 25 wherein:

the detail includes an angled side wall of the jacket.

* * * * *